(12) United States Patent
Kurihara et al.

(10) Patent No.: US 6,579,623 B2
(45) Date of Patent: Jun. 17, 2003

(54) COMPOSITE MATERIAL MEMBER FOR SEMICONDUCTOR DEVICE AND INSULATED AND NON-INSULATED SEMICONDUCTOR DEVICES USING COMPOSITE MATERIAL MEMBER

(75) Inventors: Yasutoshi Kurihara, Hitachinaka (JP); Yasuo Kondo, Hitachinaka (JP); Takumi Ueno, Mito (JP); Toshiaki Morita, Hitachi (JP); Kenji Koyama, Komoro (JP); Takashi Suzumura, Tsukuba (JP); Kazuhiko Nakagawa, Niihari (JP); Kunihiro Fukuda, Tsukuba (JP)

(73) Assignees: Hitachi, Ltd., Tokyo (JP); Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/083,158

(22) Filed: Feb. 27, 2002

(65) Prior Publication Data

US 2002/0192488 A1 Dec. 19, 2002

(30) Foreign Application Priority Data

Jun. 13, 2001 (JP) ........................................ 2001-177883

(51) Int. Cl.⁷ ............................................. H04L 21/302
(52) U.S. Cl. ....................................................... 428/556
(58) Field of Search ............................. 419/22; 75/232; 428/556, 564, 620

(56) References Cited

U.S. PATENT DOCUMENTS

| | | | | |
|---|---|---|---|---|
| 4,478,787 A | * | 10/1984 | Nadkarni et al. | 419/8 |
| 4,999,336 A | * | 3/1991 | Nadkarni et al. | 505/1 |
| 5,004,498 A | * | 4/1991 | Shimamura et al. | 75/233 |
| 5,292,478 A | * | 3/1994 | Scorey | 419/20 |

FOREIGN PATENT DOCUMENTS

JP 02000265227 A * 9/2000 ............ C22C/1/10

* cited by examiner

Primary Examiner—Daniel J. Jenkins
(74) Attorney, Agent, or Firm—Crowell & Moring LLP

(57) ABSTRACT

To provide a composite material member for semiconductor device, an insulated semiconductor device and non-insulated semiconductor device using the composite material member, which are effective for obtaining a semiconductor device that alleviates thermal stress or thermal strain occurring during production or operation, has no possibilities of deformation, degeneration and rupture of each member, and is highly reliably and inexpensive. The composite material member for semiconductor device is characterized by being a composite metal plate with particles composed of cuprous oxide dispersed in a copper matrix, in which a surface of the composite metal plate is covered with a metal layer, and a copper layer with thickness of 0.5 μm or larger exists in an interface formed by the composite metal plate and the metal layer.

16 Claims, 28 Drawing Sheets

COMPOSITE MATERIAL MEMBER FOR SEMICONDUCTOR DEVICE AND INSULATED AND NON-INSULATED SEMICONDUCTOR DEVICES USING COMPOSITE MATERIAL MEMBER

BACKGROUND OF THE INVENTION

The present invention relates to a composite material member for a semiconductor device, and insulated and non-insulated semiconductor devices using the composite material member.

RELATED ART

Conventionally, a material member that supports a semiconductor device substrate often serves also as one electrode for a non-insulated semiconductor device. In a power transistor device with power transistor chips mounted solidly on a copper base with a Pb—Sn solder material, the copper base (metal supporting member) serves both as a collector electrode of a transistor and a supporting member. This semiconductor device allows a few or more amperes of collector current to pass, causing the transistor chip to generate heat. In order to prevent instability of properties and reduction in lifetime caused by this heat-generation, the copper base also serves as a member for dissipation of heat. In addition, in the case where semiconductor chips with pressure resistance and adaptability to high-frequency enhanced so that a large amount of current can be passed therethough are directly mounted by soldering on a copper base, the role of the copper base is increasingly important not only as an intermediate member for dissipating heat but also for providing high reliability of the soldered mount.

In addition, in an insulated semiconductor device in which all the electrodes of the semiconductor device are insulated from metal supporting members, whereby the degree of freedom in circuit application of the semiconductor device can be increased, all the electrodes are insulated by insulating members from all package members including the metal supporting member and pulled to the outside. Therefore, even in a case example in which a pair of main electrodes is isolated from ground potential on the circuit, the package can be fixed to a ground potential portion irrespective of the electrode potential, thus making it easy to implement the semiconductor device.

Also, in an insulated semiconductor device, it is needed to dissipate efficiently heat generated during operation of the semiconductor device to outside of the package for operating the semiconductor element safely and stably. This dissipation of heat is usually achieved by transferring heat to the atmosphere from a semiconductor element substrate that is a source of generated heat through each member bonded thereto. The insulated semiconductor device includes in this heat transferring path an insulator, adhesive layers used in the portion to which the semiconductor substrate is bonded, or the like, and a metal supporting member.

In addition, the larger the amount of electric power needed by the circuit including the semiconductor device, or the higher the required reliability (stability with time, humidity resistance, heat resistance, etc.), the more complete insulation quality is required. The heat resistance mentioned herein includes heat resistance when a large amount of electric power is needed by the semiconductor device and thus the amount of heat generated in the semiconductor device is increased, in addition to heat resistance when the ambient temperature of the semiconductor device is increased due to an external cause.

On the other hand, the insulated semiconductor device generally has incorporated therein a certain integrated electric circuit including the semiconductor element substrate, and therefore it is necessary to electrically insulate at least part of the circuit from a supporting member. For example, in "Semiconductor/DBS Substrate for Communication": Electric Material (vol. 44, No. 5), p65–69 (1989) as a first prior art, is shown a power module device in which an assembly with Si chips mounted on an AlN ceramic substrate having copper plates bonded to the both faces (hereinafter referred to as copper-clad AlN substrate) is solidly attached to a copper supporting member by soldering with a solder.

In the above first prior art, the copper-clad AlN substrate has AlN-specific properties such as high thermal conductivity (190 W/m·K), low thermal expansibility (4.3 ppm/° C.) and high insulation quality (1015 Ω·cm) in combination with copper-specific properties such as high thermal conductivity (403 W/m·K) and high electric conductivity ($1.7 \times 10^{-6}$ Ω·cm), and is a component effective for mounting directly by soldering an electric power semiconductor element substrate (Si: 3.5 ppm/° C.) in which current density is high and a significant amount of heat is generated to obtain a module device having excellent heat dissipation quality and reliability.

Generally, the copper-clad AlN substrate plays a role of insulating electrically from a copper supporting member a semiconductor element substrate mounted thereon by soldering or an electric circuit formed therein, and forming a heat flow pass from the semiconductor substrate to a cooling fin to enhance the dissipation effect thereof. In addition, with the copper-clad AlN substrate, a semiconductor substrate of small thermal expansivity can be mounted directly on the copper-clad AlN substrate without using a particular heat expansion control material (e.g. Mo and W), thus making it possible to reduce the number of components for the power module device and the number of integration processes.

In JP-A-8-111503 specification as a second prior art, there is disclosed a semiconductor current control device in which an assembly with Si chips mounted on a copper-clad AlN substrate is solidly attached by soldering with a solder to a supporting member composed of Mo. In this prior art, since the copper-clad AlN substrate is mounted by soldering on a Mo supporting member whose thermal expansivity (5.1 ppm/° C.) is approximately same as that of the AlN substrate, the joint between these members is highly reliable, and works effectively for preventing degradation of heat dissipation quality.

In JP-B-7-26174 specification as a third prior art there is disclosed a semiconductor module device in which an assembly with thyristor chips mounted on an alumina substrate is mounted on a supporting member composed of a composite material with SiC ceramic powders dispersed on Al or an Al alloy (hereinafter referred to as Al/SiC composite material). In this prior art, since the alumina substrate is mounted on an Al/SiC composite material supporting member whose thermal expansivity (2.13 ppm/° C.) is approximately same as that of the alumina substrate (7.5 ppm/° C.), the joint between these members is highly reliable, and works effectively for preventing degradation of heat dissipation quality.

In JP-A-9-17908 specification as a fourth prior art there is disclosed a semiconductor device in which an assembly with Si chips mounted by soldering on a copper-clad AlN substrate is solidly attached by soldering with a solder to a supporting member composed of a composite material that is plane and has Cu layers (thermal conductivity: 403 W/m·K, thermal expansivity: 16.7 ppm/° C.) and invar layers (Fe-36 wt % Ni, thermal conductivity: 15 W/m·K, thermal expansivity: 1.5 ppm/° C.) alternately deposited in its main face in such a manner as to form a stripe pattern (hereinafter referred to as striped composite material). In this prior art, since the copper-clad AlN substrate is mounted by soldering with a solder on a striped composite material supporting member whose thermal expansivity (6.1 to 9.2 ppm/° C.) is approximately same as that of the copper-clad AlN substrate, the soldered joint between these materials is highly reliable, and works effectively for preventing degradation of heat dissipation quality.

In "Clad Material CIC for Semiconductor Substrate": Catalog of Hitachi Densen Co., Ltd. (CAT. No. B1-105), (April 1993) as a fifth prior art, is disclosed a heat sink material for power transistors for semiconductor substrates composed of a composite material with both faces of an invar layer cladded with Cu layers (hereinafter referred to as clad material, 4.0 to 10.6 ppm/° C.). In this prior art, the clad material can be used as a member supporting a copper-clad AlN substrate with Si chips mounted thereon by soldering with a solder. Also in this case, since the thermal expansivity of the copper-clad AlN substrate is matched with that of the clad supporting member, the soldered joint between these materials is highly reliable, and works effectively for preventing degradation of heat dissipation quality.

On the other hand, even in the case of an insulated semiconductor device in which a ceramic insulating substrate like a copper-clad AlN substrate as described above is not used, an electric circuit including a semiconductor substrate is provided on the supporting member, and it is therefore necessary that this circuit be electrically insulated from the supporting member. For example, in "MIST Substrate" by Akira Kazami: Industrial Material (vol. 30, No. 3), p.22–26 (1983) as a sixth prior art, is disclosed a substrate for hybrid integrated circuit device in which a copper foil (35 μm) is formed, through an epoxy based insulation layer (28 μm), on one face of an aluminum plate (1 to 2 mm) with alumite layers (14 to 30 μm) formed on its both faces. In addition, a hybrid integrated circuit device is disclosed in which a power semiconductor element and a passive element are mounted by soldering with a solder on a substrate for hybrid integrated circuit device with the above described copper foil selectively etched to provide circuit wiring thereon.

In "An Improvement on Solder Joint Reliability for Aluminum Based IMST Substrate" by N. Sakamoto: IMC 1992 Proceedings, P. 525–532 (1992) as a seventh prior art, is disclosed a hybrid IC device in which a power transistor element and a ceramic condenser and chip resistors are mounted on the above substrate for hybrid integrated circuit device with a Pb-60 wt % Sn based solder, and these mounted elements are mold-sealed with an epoxy resin having thermal expansivity (25 ppm/° C.) equivalent to that of aluminum.

The hybrid integrated circuit device and hybrid IC device based on the above described sixth and seventh prior arts may have a simple implemented structure because the semiconductor element substrate can be mounted directly on the substrate for hybrid integrated circuit device by soldering with a solder in the case where the amount of generated heat and the size of the semiconductor element substrate are not so large.

Generally, the semiconductor element substrate is bonded onto a mounting member with a solder of which melting point is relatively low. For example, in JP-A-4-49630 specification as an eighth prior art there is disclosed an Sn—Sb based alloy solder, which is an alloy solder for assembly of semiconductor devices containing together Ni, Cu and P. In this case, it is said that the mechanical strength of the solder itself is enhanced by adding Sb to Sn to prevent an intermetallic compound of Ni—Sn or Cu—Sn from being formed at the interface between a solder layer and the surface of a bonded member, thus making it possible to improve reliability of the semiconductor device.

In JP-B-3-3937 specification as a ninth prior art there is disclosed a semiconductor device in which a semiconductor element is attached to a mounting member supporting the element by soldering with a solder, in which the solder is composed of 87 to 92.4% by weight of tin, 7.0 to 10% by weight of antimony and 0.6 to 3.0% by weight of nickel. It is said that according to this technique, the mechanical strength of the solder is enhanced and formation of copper-tin alloys is curbed resulting in high reliability of the semiconductor device.

The insulated or non-insulated semiconductor device with the circuit element mounted thereon using the solder based on the above eighth and ninth prior arts may be a device serving approaches for preservation of environment in recent years, namely the purpose of establishing lead-free soldering.

SUMMARY OF THE INVENTION

An object of the present invention is to solve the above described problems and to provide a composite material member for a semiconductor device effective for obtaining a semiconductor device that alleviates thermal stress or thermal strain occurring during production or operation, has no possibilities of deformation, degeneration and rupture of each member, and is highly reliably and inexpensive, and insulated and non-insulated semiconductor devices using the composite material member.

In the case where the amount of heat generated in the semiconductor device is small and required reliability is not so high, any material may be used as a member constituting the device. In the case where the amount of generated heat is large and high reliability is required, however, the member to be applied should be selected.

Generally, in the insulated semiconductor device, a copper-clad AlN substrate with Si chips mounted thereon by soldering with a solder is solidly attached to a copper supporting member by soldering in a similar way as the first prior art. Here, the reason for using a copper plate of high thermal conductivity as a supporting member is that the plate is given a role in expanding the flow of heat transferred from the copper-clad AlN substrate to enhance the heat dissipation effect.

In this case, reduction in reliability based on destruction of the solder layer, cutoff of the heat pass, and destruction of the insulating substrate tends to occur due to large difference in thermal expansivity between the copper supporting member and copper-clad AlN substrate. Specifically:

(1) Because the thermal expansivity of the copper-clad AlN substrate is different from that of the copper supporting member, residual thermal stress and thermal strain are produced in the body into which the copper-clad AlN substrate and the copper supporting member are united. When the copper-clad AlN substrate is attached to the copper supporting member by soldering with a Pb-60 wt % Sn solder, they are subjected to thermal processing in which they are heated to a temperature above the melting point of the solder, and is then cooled down to room temperature. In this case, each member is shrunk in accordance with the thermal expansivity specific of each member with the members being fixed to each other at the freezing point of the solder, and thermal stress and thermal strain remains and deformation occurs in the bonded area. Generally, the electric power semiconductor substrate has a large size, and the power module device has the increased areas of the insulating substrate and the soldered portion because a plurality of semiconductor substrates and other elements are also mounted thereon. Therefore, the above described residual thermal stress and thermal strain are also significant, and deformation of the each member can be accelerated. The module device is repeatedly subjected to thermal stress during operation, and if the thermal stress is combined with the above described residual thermal stress or thermal strain, the heat pass will be cut off due to fatigue fracture of the solder layer, and the insulating substrate that is mechanically weak in nature will be damaged. Such events hinder normal operations of the module device, and damage of the insulating substrate in particular may cause a problem from the viewpoint of safety.

(2) Because thermal expansivity of the copper-clad AlN substrate is different from that of the copper supporting member, warping occurs in the body into which the copper-clad AlN substrate and the copper supporting member are united. If warping occurs in the module device, heat conducting grease cannot be loaded uniformly at the time when the device is attached to a cooling fin. As a result, thermal engagement between the copper supporting member and the cooling fin is not suitably made, and the heat dissipation quality of the route is degraded, thus making it difficult to conduct normal operation of the module device. In addition, in the case where the module device is mounted on the cooling fin by thread fastening, damage of the insulating substrate will be accelerated due to application of additional external stress.

The above described problems of (1) and (2) can be solved by selection of a supporting member with thermal expansivity matched with that of the copper-clad AlN substrate as in the case of the second to fifth prior arts. However, in the case where these supporting members are applied, new problems that are not found in the first prior art occur. That is, these problems are problems associated with preparation of members and incorporation of the supporting member into the semiconductor device, a problem associated with heat dissipation and a problem associated with costs. Specifically:

(a) Mo Supporting Member (Second Prior Art)

The Mo material is scarce metal, which is essentially expensive. In addition, the metal has a high melting point, and is so hard that it can hardly be processed mechanically. Thus, it is impossible to obtain a Mo ingot and to obtain a desired shape/size without significant disadvantage in terms of economy.

(b) Al/SiC Composite material Supporting member (Third Prior Art)

This supporting member has SiC powders dispersed in a matrix metal having Al as a main constituent by impregnating a porous preform consisting of SiC ceramic powders with liquid metal having mainly Al. In order to solder this member to the copper-clad AlN substrate, the surface of the Al/SiC composite material must be subjected to metalization processing that enables metallurgical engagement with the solder. In the case of a member of large size such as a supporting member of the power module device, however, a composite material that is flat and has high dimensional accuracy can hardly be obtained. Therefore, the composite material is subjected to metalization processing such as Ni plating after mechanical surface processing to obtain a desired shape and size. At this time, SiC particles as well as the Al area are exposed at the surface subjected to mechanical processing. The Ni plated layer is hardly precipitated at the surface of the SiC particle, or is not strongly bonded to the surface even if it is precipitated. This aspect can be pointed out as a problem associated with preparation of members.

Therefore, undesired phenomena such as peeling and blistering may occur at the interface between SiC and the Ni plated surface in the subsequent thermal process beginning with soldering. This aspect brings about an undesirable result in ensuring heat dissipation quality and reliability of the soldered joint in the semiconductor device. This aspect poses a problem associated with incorporation of components into the semiconductor device.

Thus, in addition to the fact that preparation of composite materials is difficult, the performance and yields of the resulting semiconductor device are adversely influenced, and therefore disadvantages in terms of economy cannot be negligible.

(c) Striped Composite Material Supporting Member (Fourth Prior Art)

This composite material can provide a relatively good heat dissipation effect in the sense that a striped Cu layer continuously extends from the copper-clad AlN substrate as an inlet of heat to the rear face of the supporting member as an outlet of heat. However, in order to obtain a desired shape and size, the composite material should be subjected to mechanical processing (e.g. rolling). At this time, there is a high possibility that a striped structure in which the Cu layer and the invar layer are alternately and regularly arranged loses its shape, and regularity in arrangement of the Cu layer and invar layer is lost, leading to a random pattern. This aspect poses a problem associated with preparation of members.

In addition, the properties of the striped composite material are varied depending on whether it is in the direction of stripe or in the vertical direction. In particular, variation in thermal expansivity may cause warping of the united body when the copper-clad AlN substrate is soldered with a solder. This warping extends even to the AlN substrate, resulting in breaking of the AlN substrate itself and degradation of insulation quality of the semiconductor device. In addition, when the semiconductor device is screwed into the cooling fin, further larger stress is produced. This also causes breaking of the AlN substrate and degradation of insulation quality. These aspects pose a problem associated with incorporation of components into the semiconductor device.

Thus, also in this case, in addition to the fact that preparation of composite materials is difficult, the performance and yields of the resulting semiconductor device are adversely influenced, resulting in disadvantages in terms of economy.

(d) Clad Material (Fifth Prior Art)

The clad material has Cu layers arranged on the both faces of the invar layer, and in order to keep this composite material flat, the Cu layers on the both faces must have the same thickness. However some imbalance in thickness could make it impossible to obtain a flat supporting member even if the imbalance is very small. This aspect poses a problem associated with preparation of members.

This defect may cause warping in the united body when the copper-clad AlN substrate is soldered, as in the case of the striped composite material. This leads to breaking of the AlN substrate, and in addition, breaking of the AlN substrate and degradation of insulation quality when the semiconductor device is screwed into the cooling body. These aspects pose a problem associated with incorporation of components into the semiconductor device.

In addition, for the clad material, the Cu layers on both sides are separated from each other by the central invar layer. The thermal conductivity of the invar layer is small (15 W/m·K), and therefore this layer acts so as to hinder transfer of heat flown from the copper-clad AlN substrate to the rear face of the supporting member. This aspect also poses a disadvantage associated with incorporation of components into the semiconductor device.

In the case of hybrid integrated circuit device and the hybrid IC device (hereinafter referred to as insulated semiconductor device) based on the sixth and seventh prior arts, a mounted component of small thermal expansivity, for example a semiconductor element substrate (3.5 ppm/° C. (Si)) is fixed onto a circuit substrate of large thermal expansivity (Al: 23 ppm/° C.) by soldering with a Pb—Sn based solder. The soldered portion plays a role to fix the mounted component in a predetermined position on the substrate and work as a wiring and heat dissipation pass in the semiconductor device. However, the above described semiconductor device is repeatedly subjected to thermal stress brought about at the time of operation and suspension, and ultimately the soldered portion suffers thermal fatigue rapture. In particular, if the thermal expansivity of resin is not appropriately adjusted for the substrate for hybrid integrated circuit when resin mold sealing is needed, excess residual stress will inherently exist in the interface between both members. If this stress is combined with the thermal stress at the time of operation of the semiconductor device, thermal fatigue rapture of the soldered portion is further accelerated. If the above thermal fatigue rapture continues, adverse effects will be brought about such as disconnection and cutoff of the heat dissipation pass. As a result, the semiconductor device will lose its circuit function. Thus, the first problem as to the semiconductor device based on the sixth and seventh prior arts is that means for alleviating excess stress based on a difference in thermal expansivity between the semiconductor element substrate and the circuit substrate is required.

In the case where the amount of heat generated in the semiconductor device is small and required reliability is not so high, the semiconductor substrate may be mounted on any circuit substrate. If a large amount of heat is generated and high reliability is required, the structure of the portion on which the semiconductor substrate is to be mounted should be appropriately selected. The circuit substrate based on the sixth and seventh prior arts has a sectional structure in which copper foil wiring is formed on an aluminum plate through an epoxy insulation layer. In the case where the semiconductor substrate as a heat source is mounted directly on the above circuit substrate by soldering, heat emitted from the semiconductor substrate is passed through a solder layer, copper foil wiring layer, epoxy insulation layer and aluminum plate in succession to the outside. The heat dissipation quality in the case of this mount structure is not so high. This is because the epoxy insulation layer of small thermal expansivity exists in the heat dissipation pass. If the heat dissipation quality is not sufficient, the temperature of the semiconductor substrate during operation is further increased to allow thermal runaway to occur, causing undesirable phenomena such as loss of circuit function as a semiconductor device, rupture of the semiconductor substrate itself, disconnection and short of the circuit, and degradation of insulation quality of the epoxy insulation layer. Thus, the second problem as to the device based on the sixth and seventh prior arts is that means for helping heat transfer in the heat dissipation pass between the semiconductor element substrate and the circuit substrate is required.

The composite material member for semiconductor device of the present invention to attain the above described objects is characterized by being a composite metal plate with particles composed of cuprous oxide dispersed in a copper matrix, wherein the surface of the composite metal plate is covered with a metal layer, and a copper layer with thickness of 0.5 μm or larger exists in the interface formed by the composite metal plate and the metal layer.

The insulated semiconductor device of the present invention to attain the above described objects is characterized by being a semiconductor device with a semiconductor substrate mounted on a supporting member through an insulating member, or a semiconductor device with a semiconductor substrate mounted on a supporting member through an insulating member and an intermediate metal member in succession, wherein the semiconductor device comprises a composite material member in which at least one of the supporting member and the intermediate metal member is a composite metal plate with particles composed of cuprous oxide dispersed in a copper matrix, the surface of the composite metal plate is covered with a metal layer, and a copper layer with thickness of 0.5 μm or larger exists in the interface formed by the composite metal plate and the metal layer.

The non-insulated semiconductor device of the present invention to attain the above described objects is characterized by being a semiconductor device with a semiconductor substrate mounted on a supporting member directly or through an intermediate metal member, wherein the semiconductor device comprises a composite material member in which at least one of the supporting member and the intermediate metal member is a composite metal plate with particles composed of cuprous oxide dispersed in a copper matrix, the surface of the composite metal plate is covered with a metal layer, and a copper layer with thickness of 0.5 μm or larger exists in the interface formed by the composite metal plate and the metal layer.

The main feature in the composite material member for semiconductor device is that the surface of the composite metal plate with particles composed of cuprous oxide dispersed in a copper matrix is covered with a metal layer, and a copper layer with thickness of 0.5 μm or larger exists in the interface formed by the composite metal plate and the metal layer. In addition, the main feature in the insulated semiconductor device or non-insulated semiconductor device is that at least one of the supporting member and the intermediate metal member comprises a composite material member in which the surface of a composite metal plate with particles composed of cuprous oxide dispersed in a copper matrix is covered with a metal layer, and a copper layer with thickness of 0.5 μm or larger exists in the interface formed by the composite metal plate and the metal layer.

Based on the fact that such features are provided, an attempt is made to ensure strong connectivity, maintain dissipation quality and reliability and so on as to the insulated or non-insulated semiconductor device.

According to the present invention, a composite material member for semiconductor device effective for obtaining a semiconductor device that alleviates thermal stress or thermal strain occurring during production or operation, has no possibilities of deformation, degeneration and rupture of each member, and is highly reliably and inexpensive, and insulated and non-insulated semiconductor devices using the composite material member can be provided.

Other objects, features and advantages of the invention will become apparent from the following description of the embodiments of the invention taken in conjunction with the accompanying drawings.

DESCRIPTION OF THE EMBODIMENTS

The present invention will be described in detailed below by using the embodiments.

[Embodiment 1]

In this embodiment, a composite material member for semiconductor device will be described.

For a matrix material 125A in a composite material member for semiconductor device 125 of the present invention, copper (Cu, thermal conductivity: 403 W/m·K, thermal expansivity: 16.7 ppm/° C.) is selected because of its high thermal conductivity. This property is significant in a sense that a heat flow emitted from a semiconductor substrate is efficiently released to the outside preferentially through a matrix area. However, the large thermal expansivity of copper poses a disadvantage in ensuring reliable integration with peripheral members of small thermal expansivity.

On the other hand, for particles 125B to be dispersed in the matrix material 125, cuprous oxide ($Cu_2O$, thermal conductivity: 6.6 W/m·k) K, thermal expansivity: 2.7 ppm/° C.) is selected because of its small thermal expansivity. The cuprous oxide particles 125B is operative to curb the growth of the apparent thermal expansivity of the above described composite material member 125, but has a disadvantage that it reduces the apparent thermal conductivity of the composite material member 125.

Figure 1:
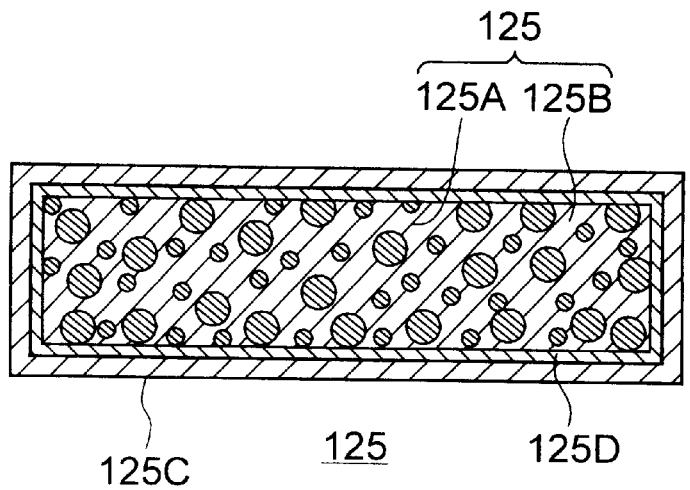
FIG. 1 is a schematic sectional view of a composite material member for semiconductor device of the present invention.
Figure 2:
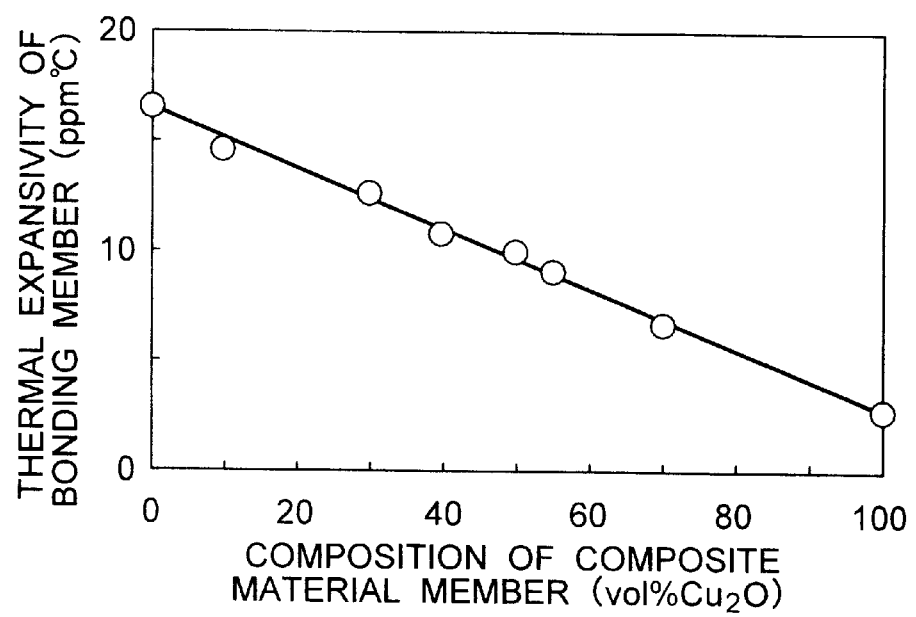
FIG. 2 is a graph showing a relationship between composition and thermal conductivity of the composite material.
Figure 3:
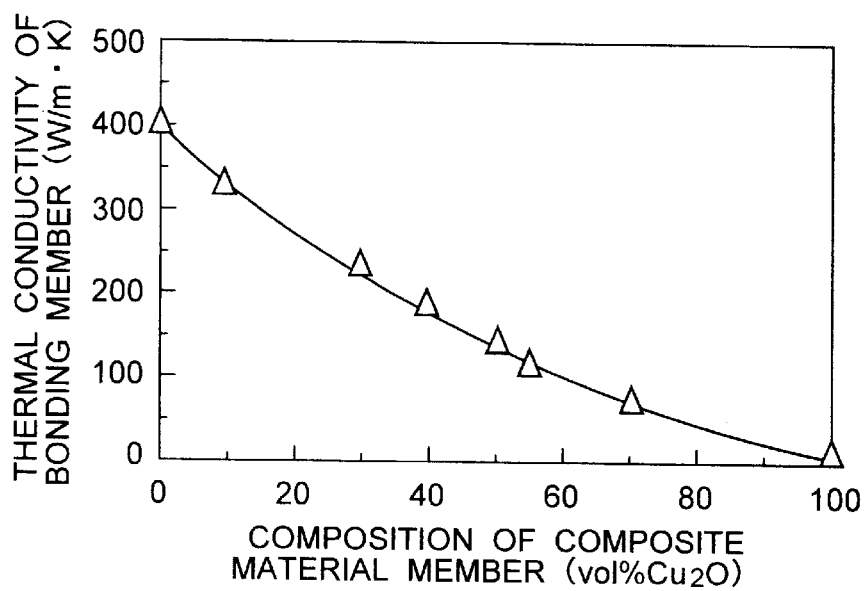
FIG. 3 is a graph showing a relationship between composition and thermal expansivity of the composite material.

The above composite material member 125 in which the copper matrix 125A and the cuprous oxide particles 125B coexist are complementary to each other for the disadvantage of the respective members. A base material 125' of the composite material member for semiconductor device 125 in the present invention has a basic structure in which the cuprous oxide particles 125B are dispersed in the copper matrix 125A, as shown in the schematic sectional view of FIG. 1. In this case, the property values (thermal expansivity and thermal conductivity) of the composite material member for semiconductor device 125 have intermediate values between the values of the copper matrix 125A and the values of the cuprous oxide 125B (thermal conductivity: 150 W/m·K, thermal expansivity: 10.5 ppm/° C., composition: Cu-50 vol $Cu_2O$). FIG. 2 shows a graph showing a relationship between the composition and the thermal conductivity of the composite material member, and FIG. 3 shows a graph showing a relationship between the composition and the thermal expansivity of the composite material member. It is shown that the thermal conductivity and thermal expansivity of the composite material member 125 both tend to decrease as the content of the cuprous oxide 125B is increased. Referring to these figures, for the composite material member 125 having a composition of Cu-50 vol % $Cu_2O$, its thermal expansivity of about 10.0 ppm/° C. can be made close to the thermal expansivity of the semiconductor substrate (Si: 3.5 ppm/° C.) and the thermal expansivity of the copper-clad AlN substrate (4.3 ppm/° C.) while its thermal conductivity of 140 W/m·K and its excellent heat dissipation quality are kept. The composite material member in this embodiment needs to be capable of being bonded firmly and reliably not only to a material having small thermal expansivity such as the semiconductor element substrate and ceramic substrate, but also to a material having large thermal expansivity such as Cu material and Al material. The thermal expansivity of the composite material member selected in view of this point is 7 to 12.5 ppm/° C. In addition, the composite material member in this embodiment is placed in a dissipation pass of heat released from the semiconductor element substrate, and plays a role to transfer heat efficiently. From this viewpoint, the thermal conductivity of the composite material member is desirably as high as possible, but it may be 70 W/m·K or higher in practice. Referring to FIGS. 2 and 3, the composition of the composite material member providing thermal expansivity of 7 to 12.5 ppm/° C. and thermal conductivity of 70 W/m·K or higher is Cu-(24 to 70) vol % $Cu_2O$.

Dispersed cuprous oxide particles 125B are randomly placed, and the concentration or volumetric population of the cuprous oxide particles 125B is the same irrespective of portions that are sampled as long as the entire composite material member 125' is macroscopically observed. In this respect, it is appreciated that the properties, especially thermal expansivity and thermal conductivity of the composite material member 125 are essentially isotropic. However, as described later, the composite material member with the cuprous copper particles 125B dispersed in the copper matrix 125A is a material that is easily processed by rolling and forging processes. The composite material member 125 obtained using such a methodology has thermal expansivity and thermal conductivity somewhat oriented because the copper matrix 125A and cuprous oxide particles 125B are arranged regularly, for example in the direction of rolling.

The composite material member 125 is ultimately soldered to a different type of member (e.g. semiconductor substrate and insulating member) before it is used. At this time, if high reliability is not required, these different types of members may be directly soldered and united to the composite material member 125 itself. The both the copper matrix 125A and cuprous oxide particles 125B are exposed at the surface of the composite material member 125 to be soldered in this case. As a result, those members are firmly soldered to the portions of the surface at which the copper matrix 125A is exposed, but is not firmly soldered to the portions at which the cuprous oxide particles 125B are exposed. This is because the portions at which the cuprous oxide particles 125B are exposed have reduced wettability for the solder described later. Thus, in order to provide firm soldering, the surface of the material member 125' of the composite material member should be subjected to treatment for giving good wettability for the solder.

For this reason, a Ni layer as a metal layer 125C is formed by plating on the surface of the base material 125' of the composite material member of this embodiment. Preferably, the thickness of the Ni-plated layer 125C is 0.4 μm or larger. In addition, although the thickness of the Ni-plated layer may be selected optionally as required, if it is too thick the internal stress and strain of the Ni-plated layer 125C and its neighboring areas increase to raise possibilities that problems such as stripping occur. To avoid these problems, the thickness of the Ni-plated layer 125C is desirably adjusted to 100 μm or smaller. The Ni-plated layer 125C can be formed by an economically advantageous plating process, and is suitable for keeping the quality of the base material 125' at a preferable level. In addition, in place for the Ni layer 125C, a layer of metal selected from the group consisting of Sn, Ag, Au, Pt, Pd and Zn can be used, and a layer of metal selected from the group consisting of Sn, Ag, Au, Pt, Pd and Zn can be provided on the surface of a metal layer composed of the Ni layer.

This metal layer 125C has a role to maintain quality of the surface of the base material 125' in addition to giving wettability. However, (a) the metal layer 125C formed by plating is not so firmly bonded to the copper matrix 125A and the cuprous oxide particles 125B precipitated at the surface of the base material 125'. In addition, (b) internal stress remains at the interface between the metal layer 125C formed by plating and the base material 125', and (c) the metal layer 125C has on its surface contaminants introduced during plating process. The (a) may cause the metal layer 125C to be stripped from the base material 125', thus raising the problem of directly affecting adversely the dissipation reliability of the semiconductor device. Therefore, the metal layer 125C and the base material 125' should be firmly bonded to each other at their interface. For the problem of (b), residual of internal stress must be eliminated as much as possible because it accelerates the stripping of the metal layer 125C from the base material 125'. Furthermore, contaminants according to (c) make it difficult to give wettability for the solder, and therefore the surface of the metal layer 125C must be kept clean. The composite material member 125 of this embodiment is configured to be capable of solving the above problems of (a) to (c) specific of a material composed of the copper matrix 125A and the cuprous oxide particles 125B.

The particularly characteristic point of the composite material member 125 of this embodiment is that an interface layer 125D composed of copper exists in the interface area formed by the base material 125' and the metal layer 125C. The copper interface layer 125D lies in the interface area, and serves as an adhesive for firmly bonding the base material 125' to the metal layer 125C, and has been produced through reduction reaction of the base material 125' at high temperature. This point constitutes another feature, and contributes to solution of the above problems of (a) to (c) as described later. These points will be described in detail below.

The composite material member 125 with the copper matrix 125A and the cuprous oxide particles 125B coexisting therein is prepared by the following process of (A) or (B).

(A) Powder Sintering Process

A predetermined amount of mixed powders comprising Cu powders and CuO powders are prepared by a general method (e.g. mixing by a V-type mixer or ball mill), and a predetermined amount of mixed powders obtained in this way are loaded in a mold adjusted so as to have a predetermined shape and size, followed by applying thereto pressure of 392 to 980 MPa (4000 to 10000 kg/cm$^2$) to form a preform composed of the mixed powders. At this time, the particles of Cu powders and CuO powders are deformed with pressure application, and the deformation causes mechanical bonding between powder particles. Therefore, it is not necessary to use an organic binder for maintaining bonding between particles unlike the case where the preform of ceramic powders is obtained. Then, the preform is sintered by heating it at 975° C. in an inert atmosphere, preferably in the presence of nitrogen or argon (time: 3 h, rate of temperature rise: 5° C./min). At this time, the sintered material is shrunk by about 30% compared to the size in the preform stage. In addition, as the sintering process proceeds, CuO as a starting material supplies oxygen to neighboring Cu, or the neighboring Cu takes oxygen from CuO. As a result, CuO as a starting material yields $Cu_2O$ by the reaction shown in formula (1). When CuO coexists with Cu under the condition of high temperature, conversion of CuO into $Cu_2O$ brings about a more stable state from a thermal point of view.

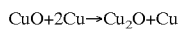    [Formula 1]

Subsequently, the sintered material is moved to a process for forming the metal layer (e.g. Ni layer) 125C (e.g. plating process) through mechanical processes of hot or cold rolling, slitting, polishing or the like. The metal layer 125C has an important role providing the composite material member 125 with predetermined properties absolutely necessary as a material member for semiconductor device as described previously.

(B) Casting Process

A predetermined amount of Cu ingots is charged into a graphite crucible coated with tanman made of recrystallized alumina, and Cu is melted by induction heating in the atmosphere (1250 to 1350° C.). Then, a predetermined amount of $Cu_2O$ powders (average particle size: 1.2 μm) is added to this Cu melt and stirred, and is thereafter cast into a mold of predetermined shape. The ingot obtained through this process becomes a composite material base material 125' having metal fibers with the cuprous oxide particles 125B dispersed in the copper matrix 125A. Subsequently, the composite material ingot obtained through casting is tailored to predetermined thickness by hot rolling and subjected to mechanical grinding so that a predetermined shape and size are obtained, and is thereafter moved to a process for forming the metal layer (e.g. Ni layer) 125C (e.g. plating) as in the case of the powder sintering process. Also in this case, the metal layer 125C has an important role in providing the composite material member 125 with predetermined properties absolutely necessary as a material member for semiconductor device.

The composite material member 125 obtained by the above described method is bonded by soldering to other members (e.g. semiconductor element substrate and ceramic insulating substrate) in the following semiconductor device preparation process. Thus, for example, the Ni-plated layer 125C should have excellent wettability for soldering. In addition, the Ni-plated layer 125C has excellent bonding with the composite material member base material 125'. The reason for this is that the Ni-plated layer 125C serves as part of the dissipation pass for the flow of heat released from the semiconductor element substrate, and that if the Ni-plated layer 125C is stripped from the base material 125', the heat dissipation pass is broken at the stripped portion. Furthermore, for the area extending from the Ni-plated layer 125C to the base material 125', internal stress and strain accumulated through the process for preparation of the composite material member 125 must be eliminated. This will contribute to prevention of action by excessive stress or strain brought about by external factors (internal stress or strain is combined with additional stress and strain due to, for example, changes in temperature). As a result, nothing other than additional stress and strain combined due to external factors acts on the Ni-plated layer 125C and its surrounding area, and therefore strong conformability is kept for the area extending from the Ni-plated layer 125C to the base material 125'.

In the present invention, to provide the above described excellent wettability for soldering, strong bonding and releasability of internal stress and strain of the surface area, the sintered material 125' provided thereon with the Ni-plated layer 125C is subjected to thermal processing in a reducing atmosphere. This thermal processing removes contaminants (e.g. plating residuals and organic substances) attached to the Ni-plated layer 125C to keep the surface clean, thus enhancing bonding between the base material 125' and the Ni-plated layer 125C, and reducing internal stress and strain in the area extending from the Ni-plated layer 125C to the base material 125'.

The enhancement of bonding between the base material 125' and the Ni-plated layer 125C is based on the following mechanisms.

(a) Production of a Copper Layer at the Interface

When the composite material provided with the Ni-plated layer 125C on the surface of the base material 125' is subjected to thermal processing (at 400° C. for five minutes) in the presence of hydrogen, hydrogen molecules with small atomic spacing (0.741 Å, in other words, small atomic diameter) can easily pass through the Ni-plated layer 125C with large atomic spacing of 2.5 Å to reach the surface of the base material 125'. The hydrogen that has reached the surface of the base material 125' passes through the area of the copper matrix 125A with large atomic spacing of 2.56 Å to reach the area where the cuprous oxide particles 125B exist. In the meantime, the hydrogen as ambient gas reacts with the cuprous oxide to form copper and water in accordance with the reducing reaction of Formula 2.

$$Cu_2O + H_2 \rightarrow 2Cu + H_2O \quad \text{[Formula 2]}$$

Thus, a copper layer 125D based on the reducing reaction is produced at the interface between the base material 125' and the Ni-plated layer 125C. The copper layer 125D is strongly engaged with the base material 125' metallurgically, which also has a significant influence on bonding with the Ni-plated layer 125C as described later.

The Ni-plated layer 125C in the present invention plays an role effectively in passing appropriately a reducing gas. As an alternate material for the Ni-plated layer 125C, a metal layer including at least one type of material selected from the group consisting of Sn (atomic spacing: 3.16 Å), Ag (atomic spacing: 2.88 Å), Au (atomic spacing: 2.88 Å), Pt (atomic spacing: 2.78 Å), Pd (atomic spacing: 2.78 Å) and Zn (atomic spacing: 2.74 Å) can be used. In addition, the reducing gas to be used is not necessarily hydrogen. For example, it may be a forming gas with hydrogen and nitrogen mixed together at a desired ratio as necessary, carbon monoxide gas, or a forming gas with carbon monoxide gas and nitrogen mixed together at a desired ratio as necessary. Furthermore, a gas such as helium, argon, krypton, neon, xenon and carbon dioxide can be used in place of nitrogen. Both the nitrogen and its alternate gases can diffuse in the metal layer 125C, but is not be involved in the reducing reaction of cuprous oxide because they have no reduction capability.

(b) Interdiffusion of produced Copper Layer and Ni Layer

Cu in the copper layer 125D and Ni in the Ni-plated layer 125C inter-diffuses in the above described thermal processing process to form a diffusion area where Ni and Cu coexist. This diffusion area, in which the Ni atom is engaged with the copper atom metallurgically, plays a role to strongly bond the copper layer 125D and the Ni-plated layer 125C together.

(c) Release of Internal Stress and Strain in Surface Area

Alleviation of internal stress and strain described below also contributes to enhancement of bonding between the base material 125' and the Ni-plated layer 125C. In the process of thermal processing (400° C.), the lattice of metal atoms is rearranged. As a result, the internal stress and strain that the base material 125' and the Ni-plated layer 125C had therein is released. Thus, the surface area extending from the base material 125' through the copper layer 125D to the Ni-plated layer 125C has stress and strain eliminated therefrom. This contributes to prevention of mechanical damage in the surface area when additional stress and strain are brought about by external factors.

Figure 4A:
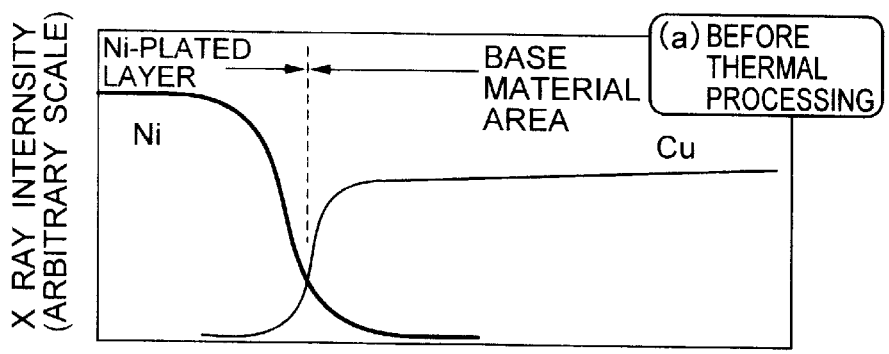
FIG. 4A is a graph showing a SEM analysis profile before thermal processing between a base matrix and a Ni plated layer of the composite material member.
Figure 4B:
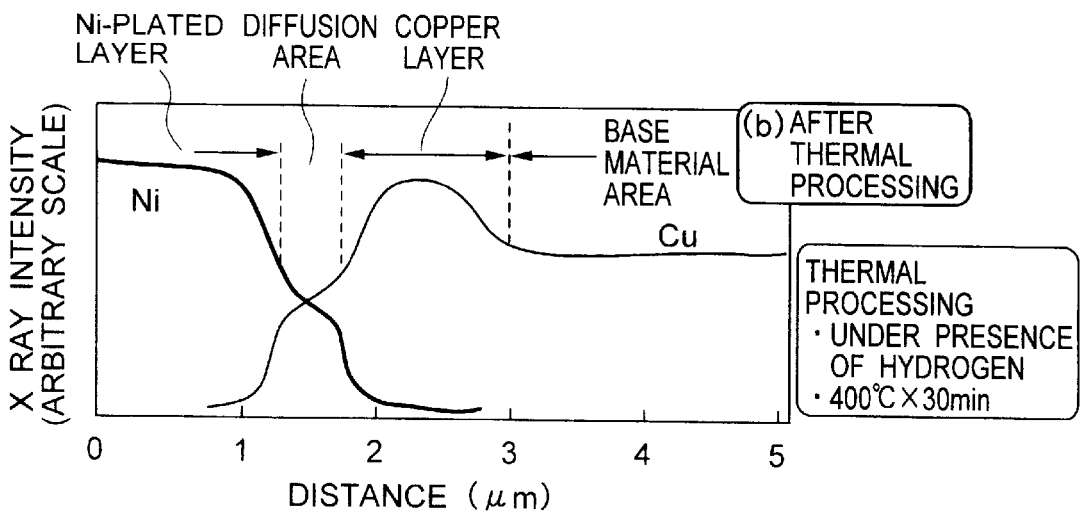
FIG. 4B is a graph showing a SEM analysis profile after thermal processing between a base matrix and a Ni plated layer of the composite material member.

FIGS. 4A and 4B are graphs showing a SEM (Scanning Electron Microscope) analysis profile at the interface between the base material and the Ni-plated layer of the composite material member. The profile has been obtained by polishing the section of the composite material member 125 and analyzing this section in the direction of thickness. FIG. 4A shows a condition before thermal processing after the Ni-plated layer 125C is formed on the base material 125'. The Ni all, profile as a plated layer 125C and the Cu profile as a base material 125' are sharply changed at the interface between them. FIG. 4B shows a condition after thermal processing, in which the copper layer 125D newly formed through reduction exists in the base material 125', and the diffusion area where Ni and Cu coexist is formed at the interface between the Ni profile and the Cu profile. The formation of this diffusion area is the most important condition for strongly bonding the Ni-plated layer 125C to the base material 125'.

Figure 5:
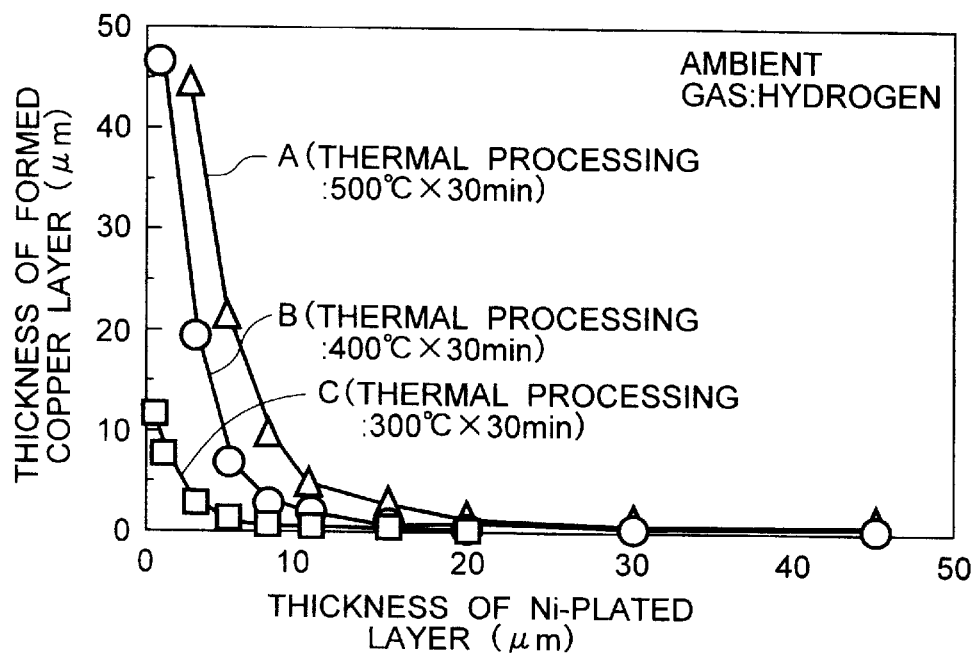
FIG. 5 is a graph showing dependency of a thickness of a copper layer produced by reduction process on a thickness of the Ni plated layer.

FIG. 5 is a graph showing dependency of the thickness of the copper layer formed through reduction process on the thickness of the Ni-plated layer. Thermal processing is carried out in the presence of hydrogen gas. Curves A, B and C. show thermal processing conducted at 500° C., 400° C. and 300° C., respectively. Taking a general view of the graph, it is appreciated that the thickness of the formed cupper layer 125D tends to increase as a temperature of the thermal processing increases and the thickness of the Ni-plated layer 125C decreases. In the present invention, it is desirable that the thickness of the copper layer 125D that is newly formed by reduction is as large as possible as long as the property as the composite material member 125 is dependent on the property of the base material 125'. However, because thermal conductivity of the composite material member 125 increases, but thermal expansivity thereof also increases if the thickness of the copper layer 125D increases, an appropriate thickness should be selected in accordance with required properties as the supporting member for semiconductor device and the intermediate metal member.

It is important in forming a thick copper layer 125D that the conditions for thermal processing are adjusted so that a rapid reduction reaction is prevented. The reduction reaction occurs in accordance with Formula 2, and produced $H_2O$ is released in vapor phase to the outside through pinholes in the Ni-plated layer 125C. If the speed of the reaction is too high, $H_2O$ in vapor phase remains at the interface between the Ni-plated layer 125C and the copper layer 125D to produce excessive pressure. As a result, bonding between the Ni-plated layer 125C and the copper 125D is impaired, and the Ni-plated layer 125C may be subjected to cracking and interface stripping at the worst. To prevent this cracking and interface stripping, it is important that the temperature at which thermal processing is performed is adjusted so that it is not increased more than necessary, and that the thickness of the Ni-plated layer 125C is not increased more than necessary. In addition, if the thickness of the Ni-plated layer 125C having high stiffness is increased more than necessary, stress at the interface between the Ni-plated layer 125C and the copper layer 125D will be increased to reduce the strength of bonding therebetween.

Figure 6:
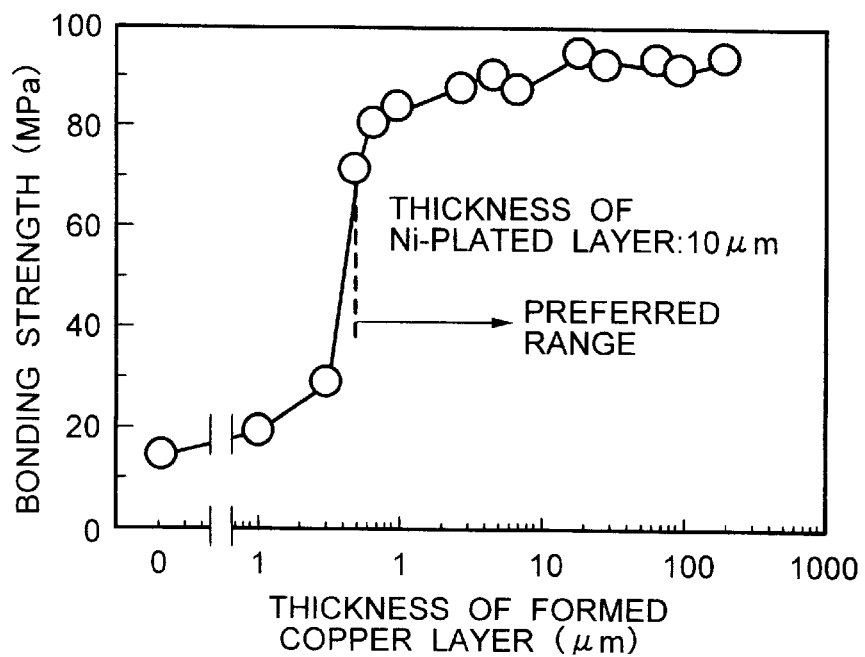
FIG. 6 is a graph showing a relationship between a thickness and bonding strength of the produced copper layer.

FIG. 6 is a graph showing a relationship between the thickness and the bonding strength of the formed copper layer. The bonding strength remains low, namely in the range of from 14.7 to 29.4 MPa (1.5 to 3 kg/mm²), in the area where the thickness of the copper layer 125D is small, namely no more than 0.3 μm. This is because (1) interdiffusion between the copper layer 125D and the Ni-plated layer 125C is insufficient because the thickness of the copper layer 125D is small, and (2) diffusion of Ni into the copper matrix 125A is required for strengthening the bonding, but diffusion of Ni into the copper matrix 125A is hindered by existence of the cuprous oxide particles 125B. The bonding strength rapidly increases when the thickness of the copper layer 125D is in the range of from 0.3 to 0.5 μm, and it reaches to a saturation level of about 78.5 MPa (8 kg/mm$^2$) when the thickness of the copper layer 125D is in the range of from 0.7 to 1.0 μm. This is because the thickness of the formed copper layer 125D comes close to a thickness sufficient for the Ni-plated layer 125C and the copper layer 125D to create diffusion bonding conditions therebetween. Under these conditions, diffusion of Ni cannot be hindered by the cuprous oxide particles 125B. When the thickness of the copper layer 125D is 1.0 μm or larger, bonding strength gradually increases within the range of approximately from 78.5 to 88.3 MPa (8 to 9 kg/mm$^2$). This indicates that formation of an excessively thick copper layer 125D is not required so far as the strength of bonding between the Ni-plated layer 125C and the copper layer 125D is concerned. On the other hand, the composite material member 125 for use in a semiconductor device is mostly united with other members by soldering, and it is enough for such a structure to have bonding strength that is larger than 49.0 MPa (5 kg/mm$^2$). The thickness of the copper layer 125D selected in view of this aspect is 0.5 μm or larger.

Figure 7:
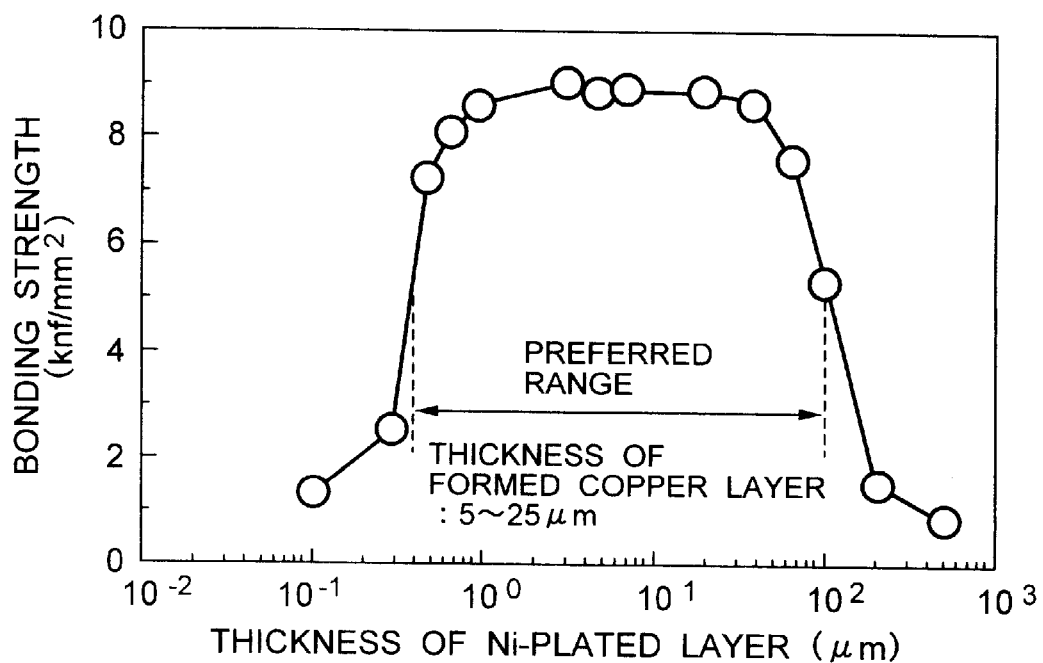
FIG. 7 is a graph showing a relationship between a thickness and bonding strength of the Ni plated layer.

FIG. 7 is a graph showing a relationship between the thickness and the bonding strength of the Ni-plated layer. The bonding strength remains low, namely in the range of from 12.7 to 24.5 MPa (1.3 to 2.5 kg/mm$^2$), in the area where the thickness of the Ni-plated layer 125C is small, namely no more than 0.3 μm. This is because the reaction of Formula (2) rapidly proceeds to cause the Ni-plated layer 125C to be stripped from the copper layer 125D at the interface therebetween. The bonding strength rapidly increases when the thickness of the Ni-plated layer 125C is in the range of from 0.3 to 0.5 μm, and it reaches to a saturation level of about 78.5 MPa (8 kg/mm$^2$) when the thickness of the Ni-plated layer 125C is in the range of from 0.7 to 1.0 μm. This is because the reaction of Formula (2) proceeds at an appropriate speed, and interdiffusion between the formed copper layer 125D and the Ni-plated layer 125C continues without being hindered. The bonding strength decreases when the thickness of the Ni-plated layer 125C is 50 μm or larger. This is because the rigidity of the Ni-plated layer 125C increases to increase stress at the interface between the Ni-plated layer 125C and the copper layer 125D. This indicates that formation of an excessively thick Ni-plated layer 125C is not advantage so far as bonding strength is concerned. On the other hand, the composite material member 125 for use in a semiconductor device is mostly united with other members by soldering, and it is enough for such a structure to have bonding strength that is larger than 49.0 MPa (5 kg/mm$^2$). The thickness of the Ni-plated layer 125C selected in view of this aspect is 0.4 to 100 μm.

When the composite material member 125 (thermal expansivity: 10.0 ppm/° C., thermal conductivity: 140 W/m·K) obtained through the above described procedure was subjected to temperature cycle tests within a temperature range of −55~150° C. (1000 times), both thermal expansivity and thermal conductivity were kept at almost same levels as initial values. In addition, no dimensional change and deformation of the composite material member 125 (initial dimension: 74.0 mm×42.4 mm×3 mm, initial level of warping in the longitudinal direction: 52 μm) were observed. In addition, the strength of bonding to the Ni-plated layer 125C was about 78.5 MPa (8 kg/mm$^2$), which was an almost same value as that of the bonding strength in the initial stage.

Furthermore, as shown in Embodiment 2 described later, the thermal conductivity of the composite material member 125 is preferably 50 W/m·K or larger. In order to obtain thermal conductivity of 50 W/m·K or larger, it is desirable that the content of Cu$_2$O in the composite material member 125 is 77 vol % or lower as shown in FIG. 2. In addition, the thermal expansivity of the composite material member 125 is desirably 14 ppm/° C. or smaller. In order to obtain thermal expansivity of 14 ppm/° C. or smaller, it is desirable that the content of Cu$_2$O in the composite material member 125 is 17 vol % or higher as shown in FIG. 3.

So far, the composite material 125 has been described mainly in the case where the metal layer 125C is a Ni-plated layer. As described above, for the metal layer 125C, not only Ni but also any metal selected from the group consisting of Sn, Ag, Au, Pt, Pd and Zn can be used. In the case where these metals are used, it is necessary to form the copper layer 125D based on Formula 2 at the interface between the metal layer 125C and the base material member 125' and to provide interdiffusion to strengthen bonding between the copper layer 125D and the metal layer 125C.

The composite material member 125 for semiconductor device obtained in this way is effective for providing an insulated or non-insulated semiconductor device that alleviates thermal stress or thermal strain occurring during production or operation, has no possibilities of deformation, degeneration and rupture of each member, and is highly reliably and inexpensive, as will be described below.

In the case where the composite material member 125 is applied to the insulated or non-insulated semiconductor device as described below, the following features and advantages can be given.

First, because the thermal expansivity of the supporting member 125 is small, and is very close to that of the insulating member (aluminum nitride, silicon nitride, alumina, beryllia), neither thermal stress nor thermal strain does not remain in the solder layer between the supporting member 125 and the insulating member. Thereby, deformation such as warping does not occur in the united body between the supporting member 125 and the insulating member. The united body has no residual stress or thermal strain, and therefore cutoff of the heat flow pass due to thermal fatigue rupture of the soldering layer and mechanical rupture of the insulating member hardly occur even if thermal stress is additionally applied during operation of the semiconductor device. This serves the purpose of maintaining normal operations and ensuring safety of the semiconductor device.

Second, because no warping occurs in the united body, thermal transition in the pass extending from the semiconductor device to a cooling fin is reliably carried out. In addition, mounting the semiconductor device on the cooling fin by thread fastening does not cause rupture of the insulating material. This also serves the purpose of maintaining normal operations and ensuring safety of the semiconductor device.

Third, the Ni-plated layer 125C to give wettability to the solder is strongly bonded to the copper layer 125D of the supporting member 125. This is utterly different from the case of Al/SiC composite material member in the third prior art. If SiC powders are exposed at the surface of the Al/SiC composite material member, the Ni-plated layer is hardly precipitated on the surface of the SiC particle, or is not strongly adhered thereto even if it is precipitated. In the case of the supporting member 125 according to the present invention, undesired phenomena such as stripping and blistering of the Ni-plated layer 125C does not occur in the subsequent thermal processing beginning with soldering. This feature brings about desirable outcomes in terms of heat dissipation quality of the semiconductor device and reliability of the soldered joint.

Fourth, mechanical processing, such as rolling, polishing and bending of the base material 125' of the supporting member 125 can easily be carried out. Comparison with the Mo material in the example of second prior art and the Al/SiC composite material in the example of third prior art from this point makes it possible to find a very clear distinction. For the Mo material, it is difficult to apply the above described mechanical processing, although it is not impossible. Also, the SiC powders of the Al/SiC composite material are not so strongly bonded to the Al matrix metal. If this is subjected to rolling processing, the SiC particles may be stripped or detached from the matrix metal. This portion acts as an inhibitor for thermal conduction. In addition, the supporting member that is applied to a semiconductor device having an increased size should be provided with holes for attachment and thread fastening for the purpose of strengthening engagement with other members. In the case of polishing processing, the SiC particles may also be stripped or detached from the matrix metal. In contrast to this, for the supporting member 125 according to the present invention, such mechanical processing does not cause defects leading to hindrance of thermal conduction.

Furthermore, first, the temperature of the above described thermal processing must be a temperature allowing a reduction reaction (Formula 2) to occur to form a new copper layer 125D. However, an excessive reduction reaction will result in mechanical rupture of the surface area by water vapors. Second, the temperature must be a temperature allowing diffusion to occur between the Ni-plated layer 125C and the copper layer 125D. The thermal processing temperature selected in view of these matters is in the range of from 150 to 500° C., and the time period over which the processing is carried out is in the range of 1 minute to two hours. For the temperature and time period, optimum conditions should be selected depending on desired thickness of the copper layer 125D and Ni-plated layer 125C.

[Embodiment 2]

In this embodiment, the case will be described where the composite material member for semiconductor device is used as a supporting member of a ceramic insulated structure insulated semiconductor device.

Figure 8:
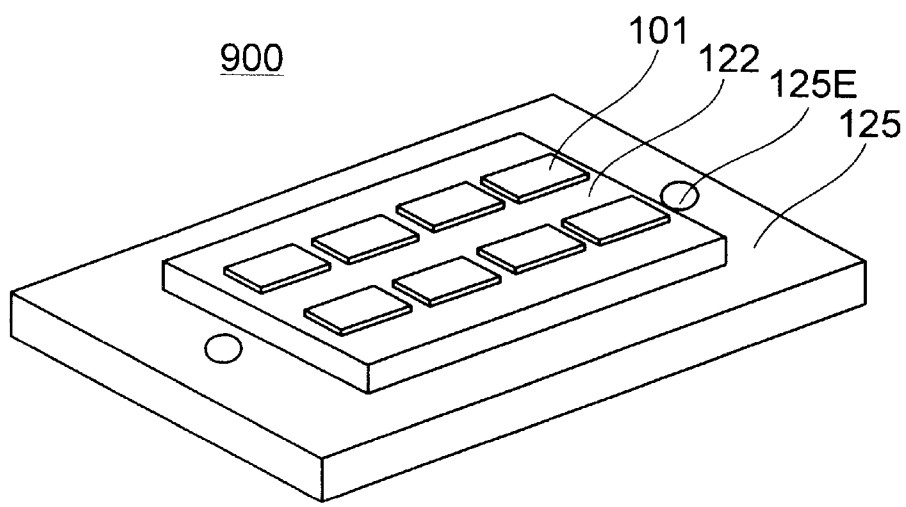
FIG. 8 is an aerial view illustrating main parts of an insulated semiconductor device of the present invention.

FIG. 8 is an aerial view illustrating main parts of the insulated semiconductor device of the present invention, which shows a situation in which a ceramic insulating substrate and a semiconductor element substrate are solidly soldered to the composite material member 125 as a supporting member. The supporting member 125 is a composite metal member provided with the Ni-plated layer 125C (thickness: 5 $\mu$m) thereon, and has properties such as thermal expansivity of 10.0 ppm/° C. and thermal conductivity of 140 W/m·K. In order to obtain the above described properties, the supporting member 125 constitutes a composite material member with the Ni-plated layer 125C (thickness: 5 $\mu$m) as a metal layer formed through the copper layer 125D (thickness: 5 $\mu$m) formed by the reduction reaction of Formula 2, on a base material 125' with the cuprous oxide particles 125B dispersed in the copper matrix 125A. The dimension of the supporting member 125 is 74.0 mm×42.4 mm×3 mm, and attachment holes 125E (diameter: 5.6 mm) are provided in the fringe of the member. The ceramic insulating substrate 122 is mounted on the supporting member 125 using a Sn-5 wt % Sb solder, and the MOS FET element substrate 101 is mounted on the ceramic insulating substrate 122 using a Sn-5 wt % Sb solder. This insulated semiconductor device 900 is of 100V, 400A Class.

Figure 9A:
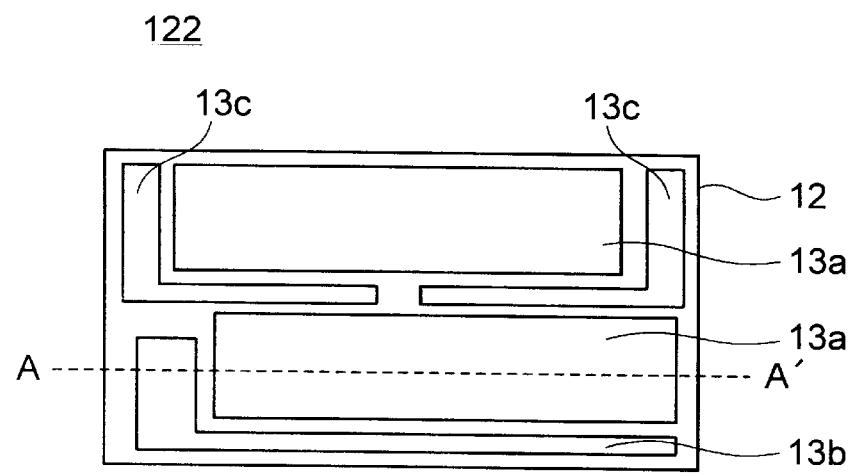
FIGS. 9A to 9C are plan and sectional views illustrating details of a ceramic insulating substrate.
Figure 9B:
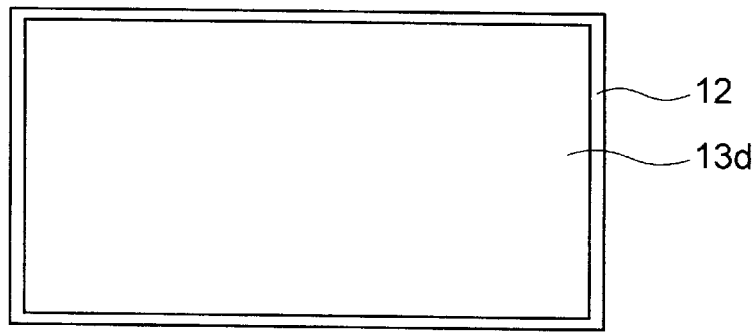
Figure 9C:
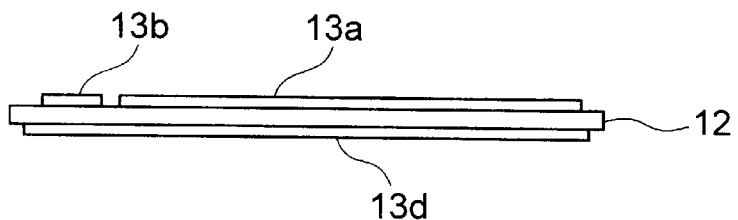

FIGS. 9A to 9C are plan and sectional views illustrating details of the ceramic insulating substrate. The ceramic insulating substrate 122 is a substrate in which a copper plate 13a (also serving as a drain electrode), a copper plate 13b (also serving as a source electrode) and a copper plate 13c (for mounting a thermister) each having a thickness of 300 $\mu$m, and a copper plate 13d having a thickness of 250 $\mu$m are bonded to the both faces of an AlN sintered material 12 (thermal expansivity: 4.3 ppm/° C., thermal conductivity: 160 W/m·K) having a dimension of 50 mm×30 mm×0.63 mm using an Ag-28 wt % Cu solder (not shown, thickness: 20 $\mu$m) 130a, 130b, 130c and 130d with 2 wt % of Ti added thereto as an active metal. A Ni layer (not shown) with thickness of 5 $\mu$m is formed on the surfaces of the copper plates 13a, 13b, 13c and 13d by electroless deposition. Active metals that can be used in place of Ti include Cr, Zr and Hf. Such active metals react with the AlN sintered material 12 to produce a nitrate, and serve as a bonding medium between solder layers 130a, 130b, 130c and 130d and the AlN sintered material 12. The active metal may include at least one type of metal selected from the group consisting of Ti, Cr, Zr and Hf. A silicon nitride sintered material (thermal expansivity: 3.1 ppm/° C., thermal conductivity: 120 W/m·K) may be used as an alternative to the AlN sintered material 12. At this time, the copper plates 13a, 13b, 13c and 13d are soldered to form a plated layer, which used as a ceramic insulating substrate 122.

Figure 10A:
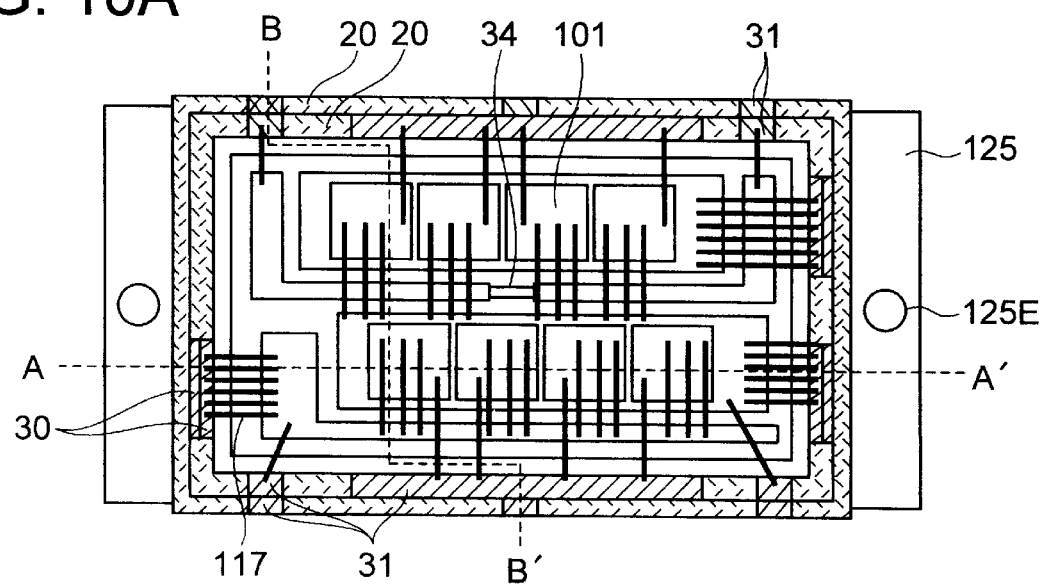
FIGS. 10A to 10C are schematic plan and sectional views illustrating in detail the structure of the insulated semiconductor device.
Figure 10B:
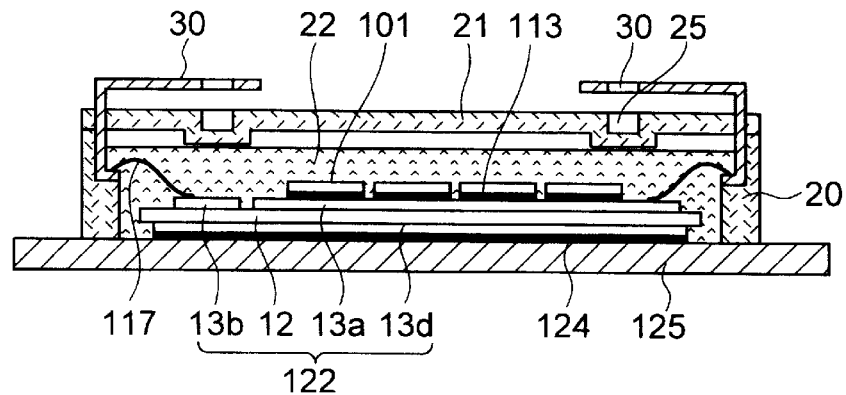
Figure 10C:
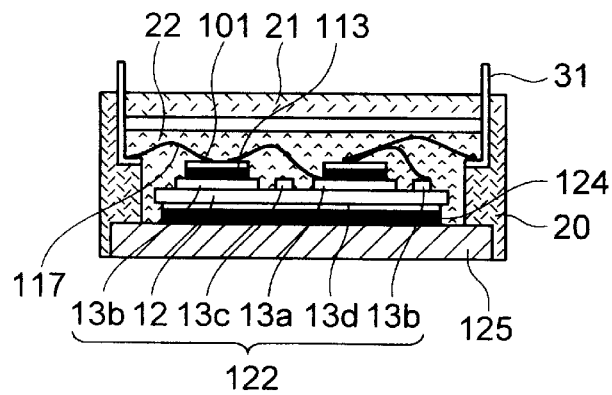

FIGS. 10A and 10C are schematic plan and sectional views illustrating in detail the structure of the insulated semiconductor device 900, showing a situation in which the ceramic insulating substrate 122 and the semiconductor element substrate 101 are soldered solidly onto the supporting member 125, followed by providing thereon an epoxy based resin case 20, a metal small-gage wire 117 and an epoxy resin lid 21, and charging silicon gel resin 22 into this case. FIG. 10A is a plan view, FIG. 10B shows the A–A' section in FIG. 10A, and FIG. 10C is the B–B' section in FIG. 10A. At this time, the ceramic insulating substrate 122 on the supporting member 125 is soldered with a Sn-5 wt % Sb solder 124 (thickness: 200 $\mu$m), and the MOS FET element substrate 101 (dimension: 7 mm×7×0.3 mm) comprising 8 pieces of Si is mounted by soldering on the copper plate 13a of the ceramic insulating substrate 122 with a Sn-5 wt % Sb solder 113 (thickness: 200$\mu$). Soldering with the Sn-5 wt % Sb solders 113 and 124 is performed simultaneously under low vacuum conditions, using a paste solder containing flax. The each element substrate 101 undergoes wire bonding by an Al wire 117 (diameter: 400 $\mu$m) to be connected to a main terminal 30 and an auxiliary terminal 31 attached in advance to the source electrode 13b, the drain electrode 13a and the epoxy based resin case 20. Also, a thermister element 34 for detection of temperature is mounted by soldering on the copper plate 13c on the ceramic insulating substrate 122 with the Sn-5 wt % Sb solder 113 (not shown), and is connected to the outside by wire bonding between the copper plate 13c and the auxiliary terminal 31 by the metal small-gage wire 117. Furthermore, although not shown in the drawing, the epoxy based resin case 20 is fixed to the supporting member 125 with a silicon adhesive resin 35. A cavity 25 is provided in the wall section of the epoxy based resin lid 21, and a hole 30' is provided in the main terminal 30 so that a screw (not shown) for connecting the insulated semiconductor device 900 to external wiring is placed therein. The main terminal 30 and the auxiliary terminal 31 have been prepared by applying Ni-plating to copper plates formed by being clipped into predetermined shapes, and are attached to the epoxy based resin case 20 by the transfer mold method.

Figure 11:
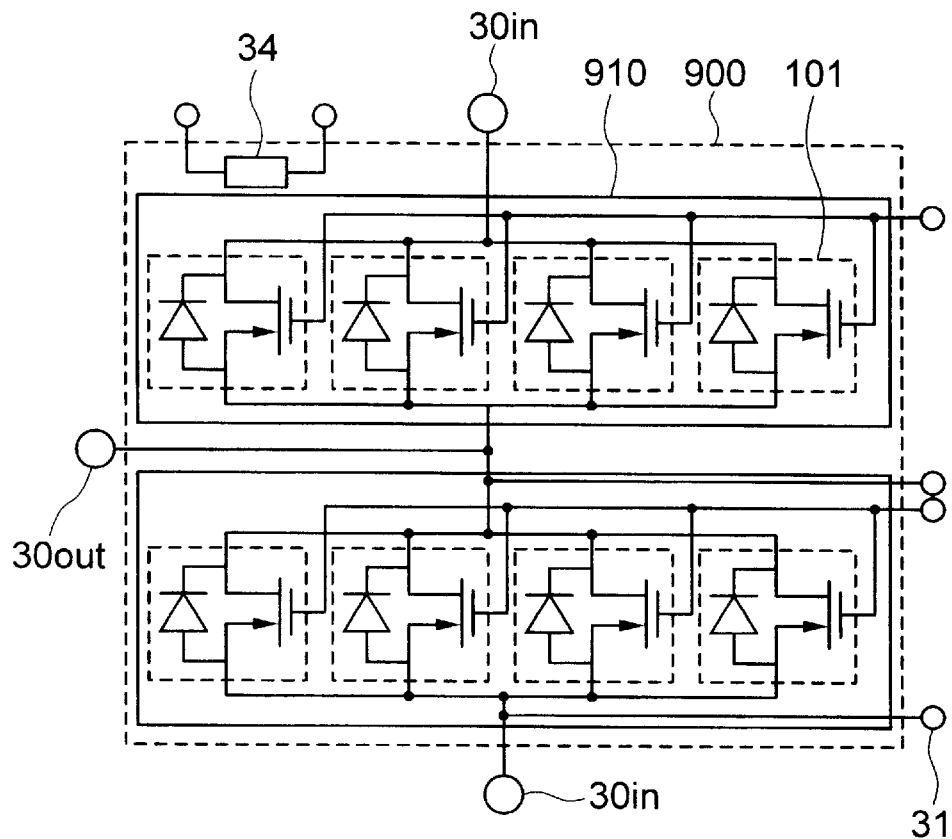
FIG. 11 illustrates a circuit of the insulated semiconductor device.

FIG. 11 illustrates a circuit of the insulated semiconductor device 900. Two lines of blocks 910 with the MOS FET elements 101 (four) arranged in parallel, with blocks 910 being connected in series, and an input main terminal 30 in, an output main terminal 30 out and the auxiliary terminal 30 are pulled out from predetermined portions to constitute main parts of the insulated semiconductor device 90. In addition, the thermister 34 for detection of temperature during operation of this circuit is independently located in the insulated semiconductor device 900. The insulated semiconductor device 900 of this embodiment was ultimately incorporated in an inverter device for controlling the number of revolutions of an electric motor 950 shown in FIG. 12.

Furthermore, in this embodiment, an insulated semiconductor device having a member structure similar to that of the example of the first prior art (having in combination the AlN ceramic insulating substrate and copper supporting member having same dimensions as those in this embodiment) was also prepared for comparison.

The thermal resistance between the MOS FET element substrate 101 and the supporting member 125 of the insulated semiconductor device 900 of this embodiment was 0.028° C./W. This value is larger than the thermal resistance of the reference sample (0.024° C./W), but satisfies a desired specification defining that the thermal resistance should be 0.042° C./W or smaller (the value of thermal resistance reaching a value that is 1.5 times larger than an initial value). Furthermore, for the insulated semiconductor device of this embodiment, the number of heat cycles at which the value of thermal resistance reaches a value that is 1.5 times larger than an initial value is defined as a lifetime. A first factor that enabled thermal resistance satisfying the desired specification to be obtained is the fact that the ceramic insulating substrate 122, the supporting member 125 or the like standing in the heat flow pass were constituted by members of high thermal conductivity. Also, the copper layer 125D of high thermal conductivity is formed on the supporting member 125, and this copper layer 125D is tightly bonded to the Ni-plated layer 125C as a metal layer by diffusion to transfer the heat flow smoothly. This aspect is a second factor. In addition, the fact can be pointed out as a third factor that voids in the solder layers 113 and 124 were reduced because soldering by Sn-5 wt % Sb solders 113 and 124 were performed simultaneously under low vacuum conditions using a paste solder containing flax.

The amount of warping (the height of antinode) was maximum 30 μm when a deposited united body of [MOS FET element substrate 101]-[ceramic insulating substrate 122]-[supporting member 125] was formed. On the other hand, for the deposited united body of semiconductor substrate-ceramic insulating substrate-copper supporting member of the reference sample, the amount of warping was about 200 μm, which shows that the amount of warping can be significantly reduced in the configuration of this embodiment. This is based on the fact that the thermal expansivity of the supporting member 125 matches that of the ceramic insulating substrate 122.

Figure 13:
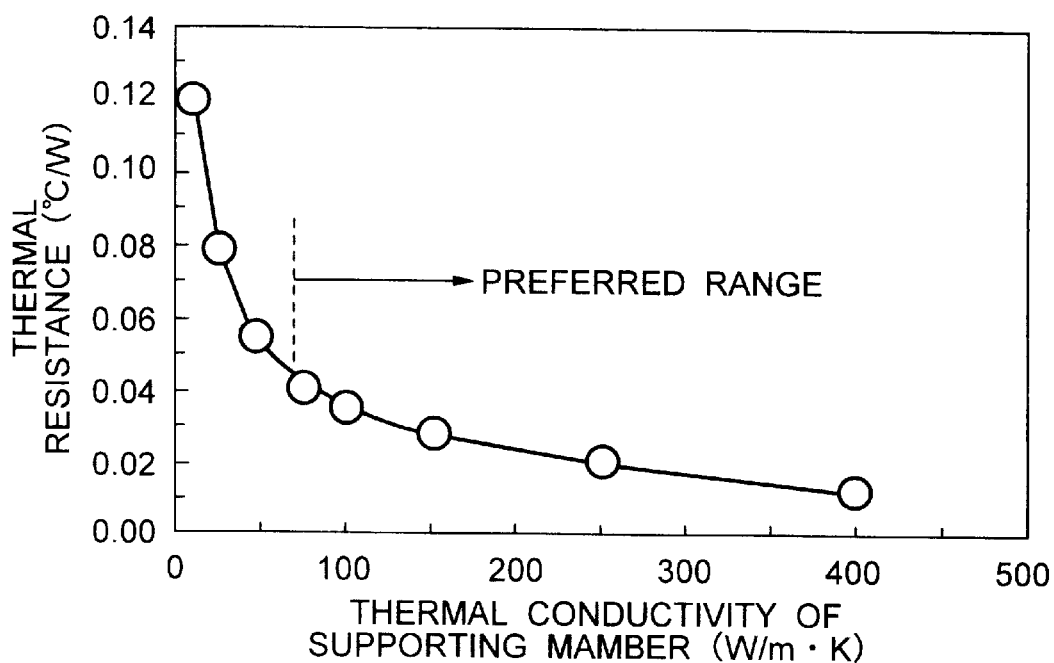
FIG. 13 is a graph showing dependency of thermal resistance of the insulated semiconductor device on thermal conductivity of a supporting member.

FIG. 13 is a graph showing dependency of the thermal resistance of the insulated semiconductor device on the thermal conductivity of the supporting member. The value of the thermal resistance becomes smaller as the thermal conductivity of the supporting member 125 increases. In the area of high thermal conductivity, dependency of the thermal resistance on the thermal conductivity is relatively small, but in the area of low thermal conductivity, its dependency on the thermal conductivity is large. This is because lateral expansion of the heat flow is controlled, and the control of heat expansion is especially remarkable in the low thermal conductivity area. It is desired that heat dissipation quality of the semiconductor device is as high as possible in maintaining its stable operations, and that high quality of heat dissipation can be provided stably irrespective of variation of production processes. Referring to FIG. 13 from this point of view, it can be said that the thermal conductivity of the supporting member 125 is preferably 70 W/m·K or larger. Thus, referring to FIG. 3, an adjustment should be made so that the content of $Cu_2O$ in the composite material member 125 is 70 vol % or smaller for obtaining thermal conductivity of 70 W/m·K or larger.

Figure 14:
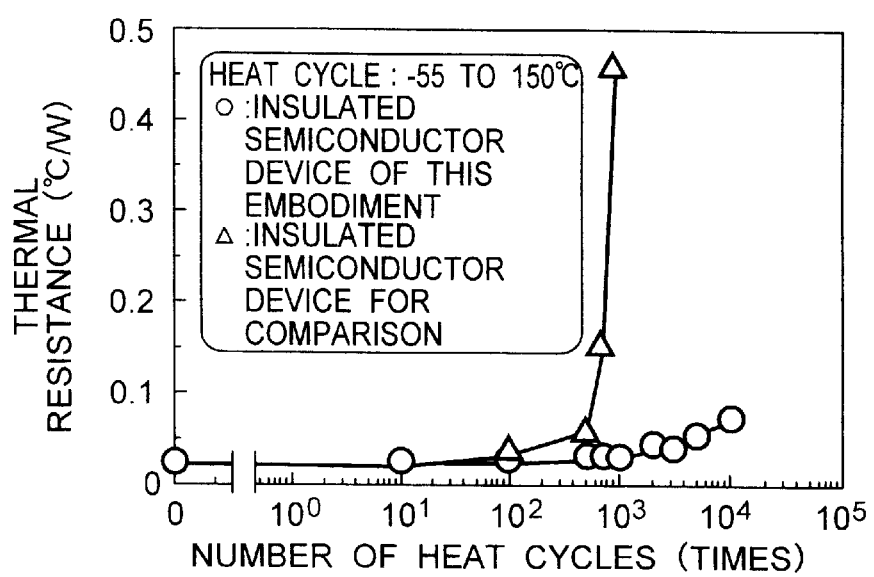
FIG. 14 is a graph showing transition of a thermal resistance of the insulated semiconductor device in a heat cycle test.

FIG. 14 is a graph showing transition of thermal resistance of the insulated semiconductor device in a heat cycle test. In this test, temperature was repeatedly changed within the range of from −55° C. to 150° C. In the case of the insulated semiconductor device 900 of this embodiment, the initial value is 0.028° C./W, while the thermal resistance shows an almost same value even after 1000 cycles. After 1000 cycles, the thermal resistance gradually increases, but shows a value smaller than or equal to the acceptable value of 0.042° C./W (lifetime) up to 6000 cycles. On the other hand, the thermal resistance of the reference sample has a small initial value of 0.024° C./W, but increases after 100 cycles and reaches the value of 0.036° C./W (lifetime) when 250 cycles are completed. Cracking in the solder layer between the copper supporting member and the ceramic insulating substrate is responsible for the increase in thermal resistance of the reference sample. The reason why the insulated semiconductor device 900 showed an excellent level of heat cycle resistance is that the thermal expansivity of the ceramic insulating substrate 122 was matched with that of the supporting member 125, and therefore the strain acting on the solder layer 124 was restricted to a low level even though temperature was repeatedly changed within the range of from −55 to 150° C. In addition, the fact that cutoff of the heat dissipation pass never occurs because strong bonding of the Ni-plated layer 125C of the supporting member 125 with the copper layer 125D is kept can also pointed out as a reason why the excellent level of heat cycle resistance was shown.

Figure 15:
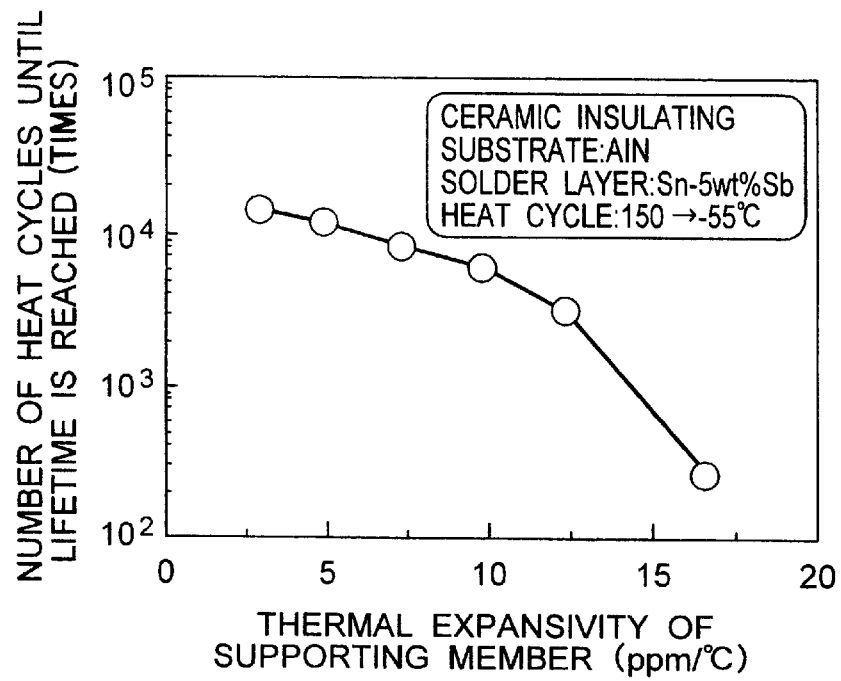
FIG. 15 is a graph illustrating an effect of the thermal expansivity of the supporting member on a heat cycle lifetime.

FIG. 15 is a graph illustrating the influence of thermal expansivity of the supporting member 125 on the heat cycle lifetime. It is shown that the lifetime tends to decrease as the thermal expansivity of the supporting member 125 increases. Here, the insulated semiconductor device 900 of this embodiment is ultimately mounted on a car, and desirably has a heat cycle lifetime of 3000 cycles or more. Referring to FIG. 14 from this point of view, the thermal expansivity of the supporting member 125 should be 12.5 ppm/° C. or smaller. For obtaining such thermal expansivity, the content of $Cu_2O$ in the supporting member 125 should be 24 vol % or larger as shown in FIG. 3.

Figure 16:
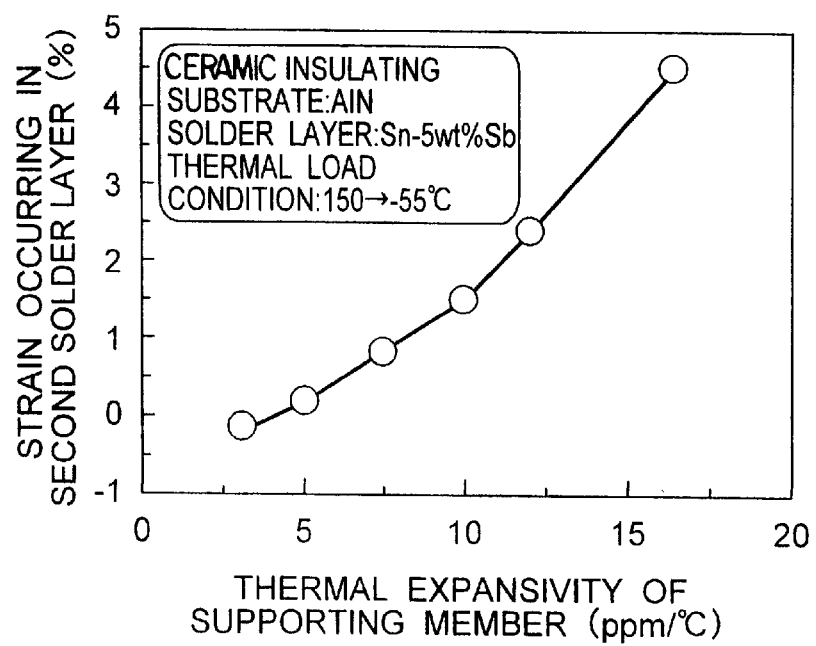
FIG. 16 is a graph illustrating dependency of strain occurring in a solder layer for mounting the ceramic insulating substrate on thermal expansivity.

FIG. 16 is a graph illustrating dependency of strain occurring in the solder layer for mounting the ceramic insulating substrate on the thermal expansivity of the supporting member. The strain occurring in the solder layer grows as the thermal expansivity of the supporting member 125 is increased. Checking this graph against FIG. 15, it can be understood that the thermal expansivity of the supporting member 125 should be 14 ppm/° C. or smaller for providing a heat cycle lifetime of 3000 cycles or more, and the level of strain occurring in the solder layer 124 should be restricted to 2.5% or lower for providing a heat cycle lifetime of 3000 cycles or more.

Figure 17:
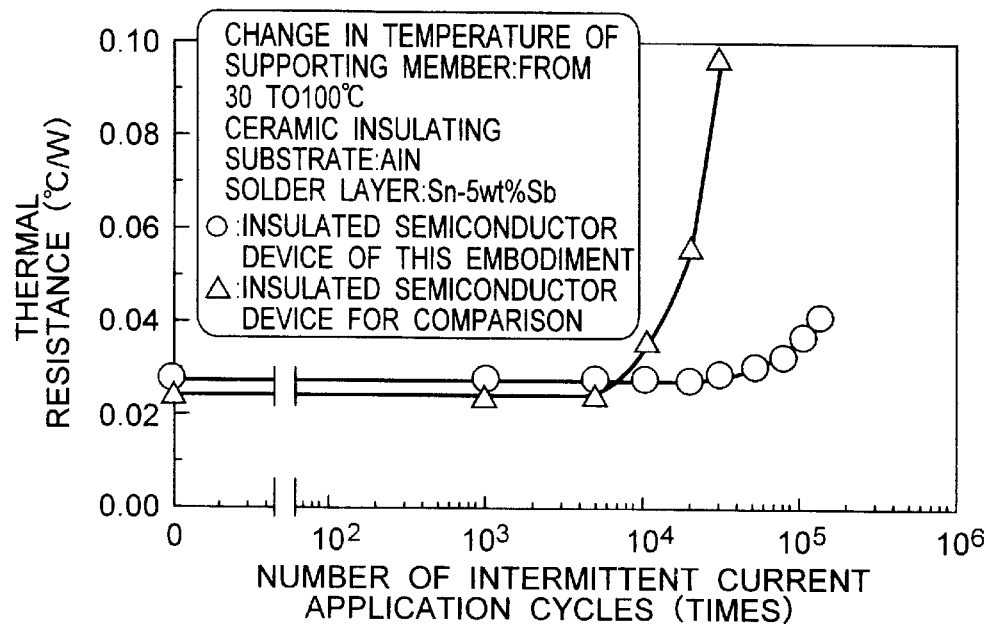
FIG. 17 is a graph showing transition of thermal resistance by an intermittent current application test.

Then, a test of applying intermittently an electric current to the insulated semiconductor device 900 and repeatedly changing a temperature of the supporting member 125 within the range of from 30 to 100° C. was carried out. FIG. 17 shows transition of thermal resistance according to the intermittent current application test. In this test, an electric current was repeatedly applied to the MOS FET element substrate 101 to pursue thermal resistance so that the temperature of the supporting member was changed within the range of from 30 to 100° C. In the case of the insulated semiconductor device 900 of this embodiment, the initial value of the thermal resistance is 0.028° C./W, while an almost same value is maintained even after 30000 cycles. The thermal resistance gradually increases after 30000 cycles, but shows an acceptable value of 0.042° C./W (lifetime) or smaller up to 130000 cycles. On the other hand, the thermal resistance of the reference sample has a small initial value of 0.024° C./W, but increases after 5000 cycles and reaches the value of 0.036° C./W (lifetime) when about 10000 cycles are completed. Cracking in the solder layer between the copper supporting member and the ceramic insulating substrate, and cracking in the solder layer between the ceramic insulating substrate and the MOS FET element substrate are responsible for the increase in thermal resistance of the reference sample. The reason why the insulated semiconductor device 900 showed an excellent level of heat cycle resistance is that the thermal expansivity of the ceramic insulating substrate 122 was matched with that of the supporting member 125, and therefore the strain acting on the solder layer 124 was restricted to a low level even though temperature was repeatedly changed by applying an electric current intermittently. Also, because the apparent thermal expansivity of the united body of the ceramic insulating substrate 122 and the supporting member 125 is smaller than that of the reference sample, strain acting on the solder layer 113 between the MOS FET element substrate 101 and the ceramic insulating substrate 122 is restricted to a low level. It is appreciated that these circumstances brought about a synergic effect resulting in an excellent level of resistance to intermittent application of electric currents.

Figure 18:
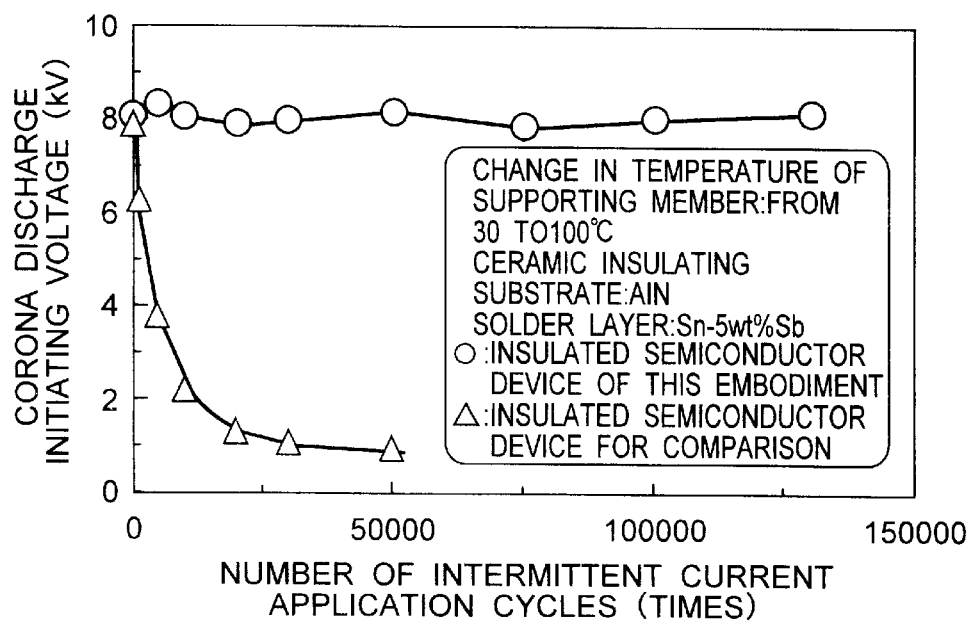
FIG. 18 is a graph showing transition of corona discharge initiating voltage between an electrode and the supporting member by the intermittent current application test.

In the above described intermittent current application test, the dielectric strength of the deposited structure extending from the copper plates 13a, 13b and 13c to the supporting member 125 was also pursued. FIG. 18 shows the result thereof, which is transition of corona discharge initiating voltage between the electrode and the supporting member by the intermittent current application test. The corona discharge initiating voltage is represented by a value of voltage in the charge amount of 100 pC. For the insulated semiconductor device 900 of this embodiment, the initial value is about 8 kV, which remains almost unchanged even after 130000 cycles. On the other hand, the initial value of discharge initiating voltage of the reference sample is almost same as that of the insulated semiconductor device 900 of this embodiment, but gradually decreases as the number of test cycles is increases, and it reaches about 1 kV and remains almost unchanged after 30000 cycles. In this way, for the insulated semiconductor device 900 of this embodiment, high insulation quality is stably maintained, compared to the reference sample. The main reason why insulation quality of the reference sample was degraded is that the AlN sintered material 12 as an insulator in the ceramic insulating substrate 122 was mechanically ruptured at the portions corresponding to the electrodes 13a, 13b and 13c. If the insulator is mechanically ruptured, the electric field is extremely increased in the ruptured portion, resulting in occurrence of discharge. The mechanical rupture of the sintered material occurs as a result of action of excessive stress or strain resulting from difference in thermal expansivity between the copper supporting member and the ceramic insulating substrate. In contrast to this, for the united portion of the supporting member 125 and the ceramic insulating substrate 122 of the insulated semiconductor device 900 of this embodiment, neither excessive stress nor strain is applied, and therefore the AlN sintered material 12 is never mechanically ruptured. Thus, the electric field does not show a large value discontinuously inside the insulator. For the above described reason, the insulated semiconductor device 900 of this embodiment stably exhibited excellent insulated quality.

Figure 12:
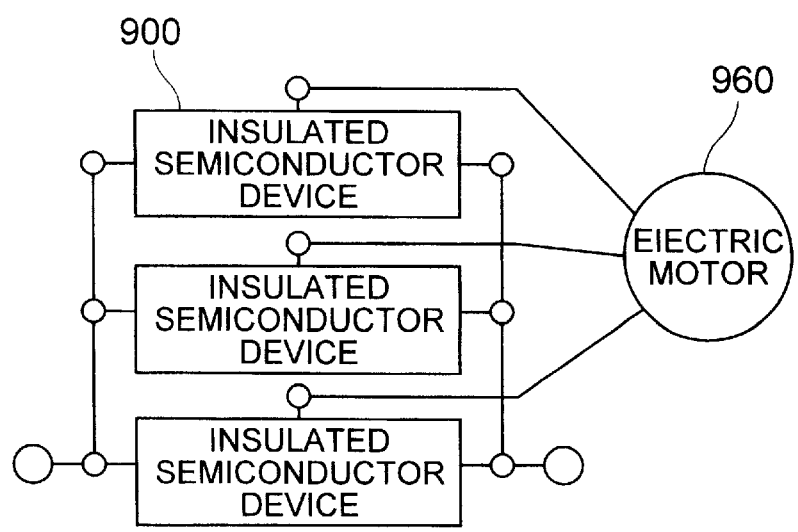
FIG. 12 illustrates a circuit of an inverter device incorporating the insulated semiconductor device.

The insulated semiconductor device 900 of this embodiment was incorporated in the inverter device of FIG. 12, and was used for controlling the number of revolutions of a motor 960. In addition, the inverter and the motor were incorporated in an electric car as its power source. In this car, because drive mechanisms ranging from the power source to wheels could be simplified, shock at the time of gear change was alleviated, compared to a conventional car using a difference in the mating ratio to perform gear change. Furthermore, this car was capable of running smoothly at the speed of 0.259 km/h, and its vibration and noise originating from the power source could be reduced to one-half of that of a car having a conventional cylinder type engine.

In addition, the inverter device with the insulated semiconductor device 900 of this embodiment incorporated therein was incorporated into an air conditioner (power consumption during cooling: 5 kW, power consumption during warming: 3 kW, power supply voltage: 200 V) along with a brushless direct current motor. The motor exhibited efficiency higher by 10% or more than that of a conventional alternating current motor. This is helpful for reducing power consumption during usage of the air conditioner. In addition, in the case of this embodiment, the time between the point of starting an operation and the point of reaching a set room temperature was reduced by a factor of about 2 compared to the case where the conventional alternating current motor is used.

Effects similar to those of this embodiment can also be given when the semiconductor device 900 is incorporated in other apparatus for stirring or flowing other fluids, for example a washer and a fluid circulating apparatus.

[Embodiment 3]

In this embodiment, the case will be described where the composite material member for semiconductor device is applied as an intermediate metal member of a resin insulation structure insulated semiconductor device.

Figure 19A:
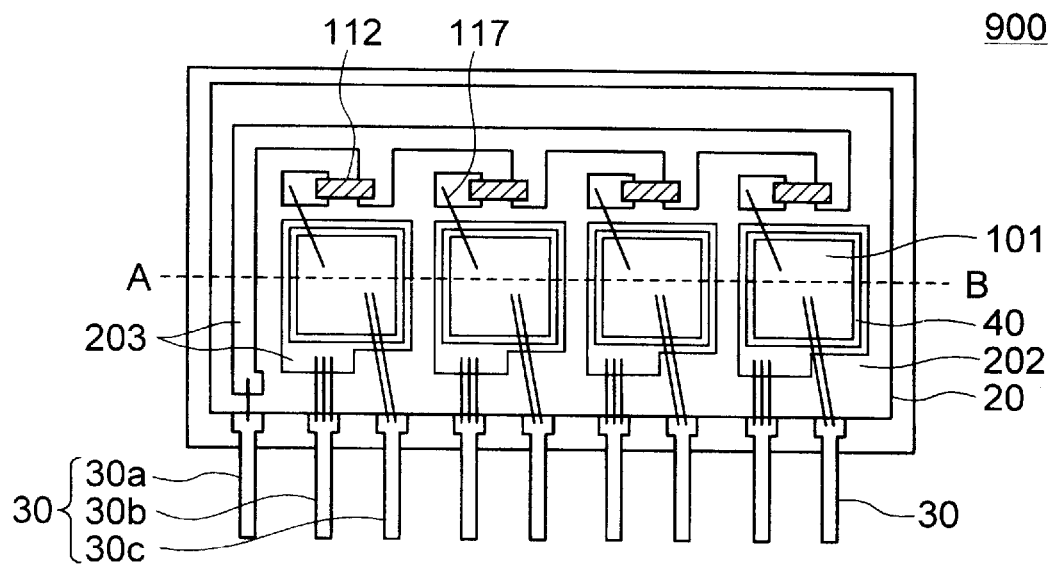
FIGS. 19A to 19C are plan and sectional views and a circuit diagram illustrating the insulated semiconductor device of one embodiment of the present invention.
Figure 19B:
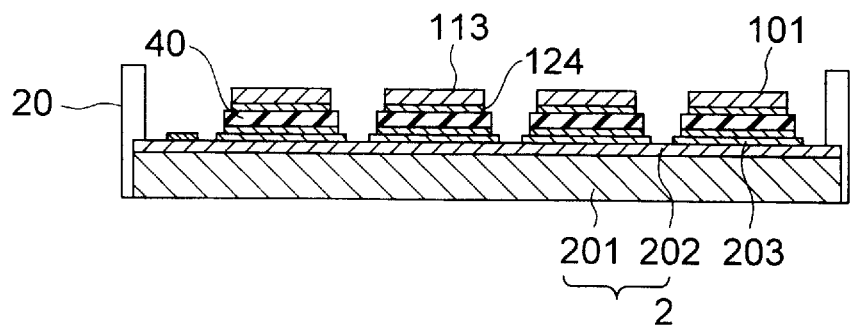
Figure 19C:
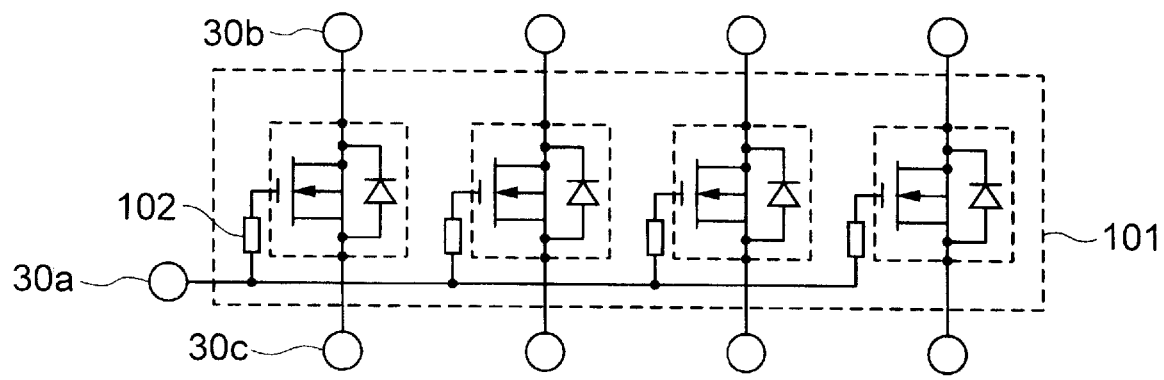

FIGS. 19A to 19C are plan and sectional views and a circuit diagram, respectively for illustrating the insulated semiconductor device of one embodiment of the present invention. The insulated semiconductor device 900 has a configuration described below. The MOS FET element substrates 101 composed of Si (four, chip size: 7×7×0.28 mm) are mounted by solders 113 and 124 on the Al insulating circuit substrate 2 also serving as a supporting member through an intermediate metal member 40 having a size of 8×8×0.6 mm. The intermediate metal plate 40 comprises the composite material member of the present invention. The intermediate metal member 40 constitutes a composite material member with a metal layer 125C (Ni-plated layer: thickness: 10 μm) formed through the copper layer 125D (thickness: 10 μm) formed by the reduction reaction of Formula 2, on a base material 125' with the cuprous oxide particles 125B dispersed in the copper matrix 125A. It has properties of thermal expansivity of 10.0 ppm/° C. and thermal conductivity of 14 W/m·K. In the Al insulating circuit substrate 2, a Cu wiring layer 203 (thickness: 70 μm) is selectively formed on one of main faces of an Al plate 201 (size: 40.7×29.4×1.5 mm) as a metal plate through an epoxy resin insulating layer 202 (thickness: 150 μm). The MOS FET chip 101 is soldered to the intermediate metal material 40 with a solder 113 having composition of Sn-5 wt % Sb (thickness: 70 μm, temperature: 270±10° C.), and the intermediate metal member 40 is soldered to the Al insulating circuit substrate 2 with a solder 124 having composition of Sn-3 wt % Ag-0.8 wt % Cu (thickness: 70 μm, temperature: 240±10° C.). A chip resistor 112 is fixed between the Cu wiring layers 203 with a solder 124. Such soldering is carried out at a step where a paste solder is coated on a predetermined portion, and a required member is mounted on this coated portion, and is thereafter heated in an atmosphere. Then, the case 20 composed of epoxy resin having solidly united with the terminal 30 made of Cu in advance is attached to the Al insulating circuit substrate 2 with a silicon resin adhesive 35 (not shown). Wire bonding with Al wire (diameter: 300 μm) 117 was applied to each of the gate, source and drain of the MOS FET element substrate 2. The wiring is arranged so that the gate terminal 30a is shared among MOS FET element substrates 101, and the source terminal 30c and the drain terminal 30b are dedicatedly used by each MOS FET element substrate 101. Although not shown in the drawing, epoxy resin 22 and silicon gel resin 22a were potting-coated to the mounting portions of the chip resistor 112 and the MOS FET element substrate 101, respectively and each of the resins was subjected to thermal processing at 150° C. for 2 hours for curing. Finally, the case lid 21 (not shown) composed of epoxy resin was attached thereto to complete the semiconductor device 900. Thereby, the mounted elements 101 and 112, the circuit substrate 2 or the like are tightly sealed by the mold resins 22 and 22a.

The semiconductor device 900 of this embodiment prepared as described above has a circuit shown in (c).

Figure 20:
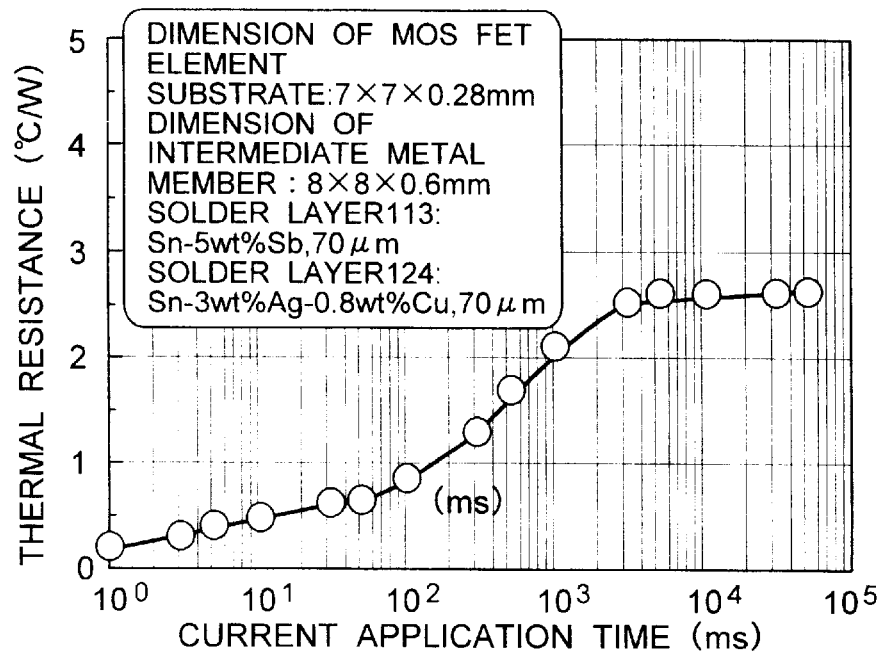
FIG. 20 is a graph showing an overheat resistance property of the insulated semiconductor device.

FIG. 20 is a graph showing the overthermal resistance property of the insulated semiconductor device of this embodiment. The thermal resistance grows with current application time, but shows a steady value (about 2.7° C./W) after about 3 s of current application time. This value indicates that even if the MOS FET element substrate 101 consumes electric power of 10W at 98° C., the substrate 101 can stably operate. The reason why such excellent heat dissipation quality was exhibited is that the intermediate metal member 40 having excellent thermal conductivity was used, and that strong bonding between the Ni-plated layer 125C and the copper layer 125D of the intermediate metal member 40 was maintained to enable smooth movement of heat flows.

Figure 21:
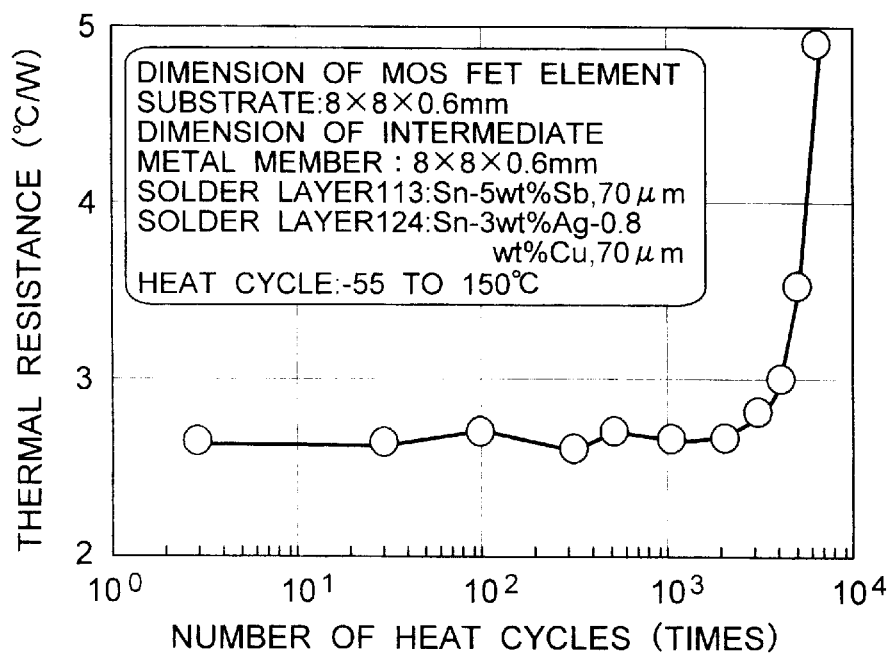
FIG. 21 is a graph showing transition of thermal resistance of the insulated semiconductor device by the heat cycle test.

FIG. 21 shows transition of thermal resistance of the insulated semiconductor device of this embodiment by a heat cycle test. A thermal resistance level equivalent to an initial value (about 2.7° C./W) is maintained up to heat cycles: 2000. The thermal resistance starts to grow after heat cycles: 2000. If the number of heat cycles when the thermal resistance reaches a value 1.5 times larger than the initial value is defined as a lifetime, the lifetime of the insulated semiconductor device 900 of this embodiment corresponds to about 5000 cycles. The lifetime of the insulated semiconductor device 900 of this embodiment obtained as described above has in terms of statistics a profile expressed by the line C of FIG. 23 described later. The $-3\sigma$ level lifetime obtained from the line C corresponds to 1300 cycles (−55 to 150° C.), which shows that the insulated semiconductor device 900 of this embodiment has sufficient reliability as a mass product. Also, in the insulated semiconductor device 900 of this embodiment, an adjustment is made so that the thermal expansivity of the intermediate metal member 40 has a preferred value of 10.0 ppm/° C. This contributes to the purpose of preventing precursory rupturing of any one of the solder layers 113 and 124 to increase a lifetime as an entire semiconductor device.

Figure 22:
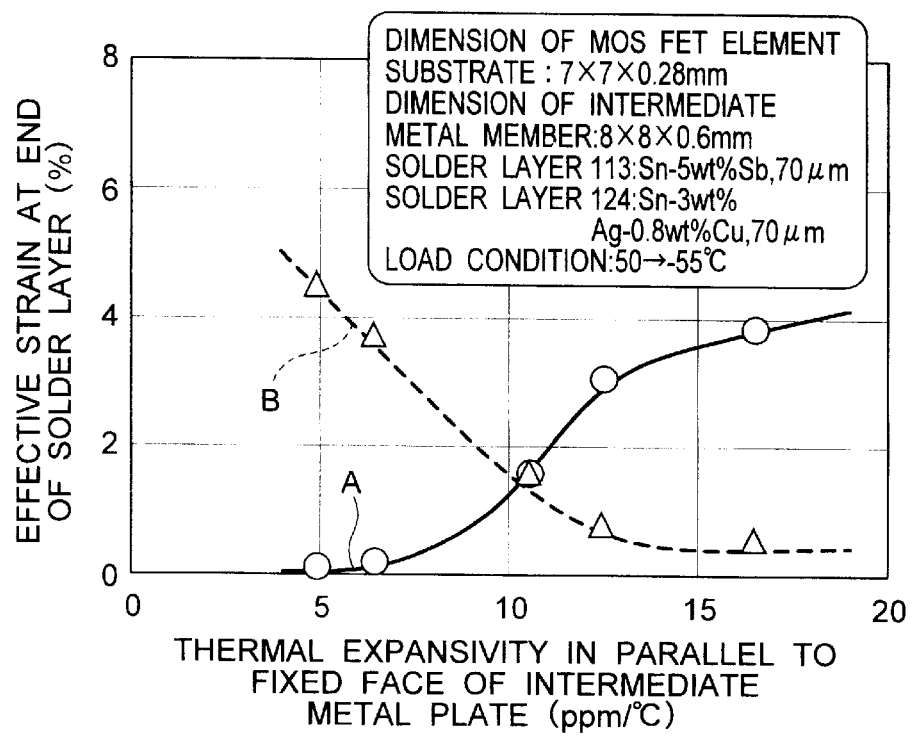
FIG. 22 is a graph showing heat strain in a solder layer with a MOS FET element substrate fixed thereto.

Here, the most important point in the insulated semiconductor device 900 of this embodiment is that the thermal expansivity of the intermediate metal member 40 placed and fixed between the MOS FET element substrate 101 and the circuit substrate 2 is adjusted to be 7 to 12.5 ppm/° C. FIG. 22 is a graph showing thermal strain in the solder layer with the MOS FET element substrate fixed thereto. The MOS FET element substrate 101 is fixed on the circuit substrate 2 through the intermediate metal member 40 by the solder layers 113 and 124. Here, the graph shows a result of simulation, in which assuming that the level of strain is 0% at 150° C., an effective strain occurring at the end of the solder layer when it is cooled to −55° C. from 150° C. In addition, the solder layer 113 is composed of a material with composition of Sn-5 wt % Sb (thickness: 70 μm), and the solder layer 124 is composed of a material with composition of Sn-3 wt % Ag-0.8 wt % Cu (thickness: 70 μm). The curves A and B in the drawing represent strains occurring at the ends of the solder layers 113 and 124, respectively. The strain at the A portion grows as the thermal expansivity of the intermediate metal member 40 increases. For reducing the strain at the (A) portion, smaller thermal expansivity of the intermediate metal member 40 is more advantageous. On the other hand, the strain at the (B) portion decreases as the thermal expansivity of the intermediate member 40 increases. For reducing this strain, larger thermal expansivity of the intermediate metal member 40 is more advantageous. In this way, there is a tradeoff relationship between the strains at the (A) and (B) portions, and the both strains are brought in equilibrium when the thermal expansivity is about 10 ppm/° C. At this time, as described later (FIGS. 23 and 24), the most excellent heat cycle lifetime can be obtained when the thermal expansivity of the intermediate metal member 40 is about 10 ppm/° C. The levels of strains at A and B portions in this case are both about 1.5%. In addition, as described later (FIG. 24), if the levels of strains at A and B portions are both equal to or smaller than 2.2%, the $-3\sigma$ level heat cycle lifetime corresponds to 1000 cycles or more. The levels at A and B portions are equal to or smaller than 2.2% when the thermal expansivity of the intermediate metal member 40 is in the range of from 7 to 12.5 ppm/° C. (FIG. 22). Thus, this range of thermal expansivity can be a preferred range.

Figure 23:
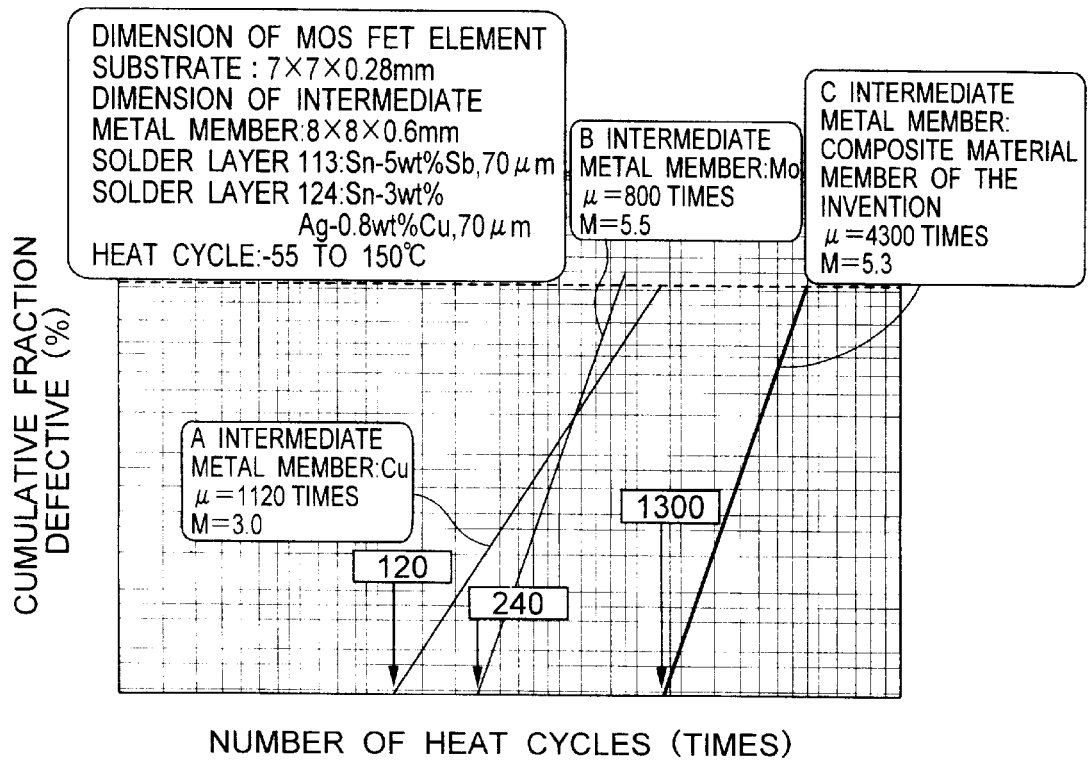
FIG. 23 is a graph showing Weibull distribution of a rupture life of the solder layer of the soldered portion of the MOS FET element substrate by the heat cycle test.

FIG. 23 is a graph showing a Weibull profile for the solder layer rupture lifetime of the soldered portion of the MOS FET element substrate by a heat cycle test. In the case where Cu with thermal expansivity of 16.7 ppm/° C. is used as an intermediate metal member, a lifetime profile of shape parameter m=3.0 and average lifetime μ=1120 cycles is shown. In this case, it is rupture of the solder layer 113 due to cracking that governs the lifetime. The $-3\sigma$ level lifetime (cumulative fraction defective=about 0.1%) with mass products into consideration corresponds to 120 cycles, which is a very low level. Also, in the case where Mo with thermal expansivity of 5.1 ppm/° C. is used as an intermediate metal member, a lifetime profile of shape parameter m=5.5 and average lifetime $\mu$=800 cycles is shown. In this case, it is cracking rupture of the solder layer 124 that governs the lifetime, and the $-3\sigma$ level lifetime corresponds to 240 cycles, which is an improved level as compared with the case of Cu. However, for both Cu and Mo, it cannot be said that sufficient reliability margins are provided. This tendency of strain is consistent with that of FIG. 22 in the sense that cracking of the solder layer 113 acceleratingly develops if the thermal expansivity is excessively small, and cracking of the solder layer 124 acceleratingly develops if the thermal expansivity is excessively large. This indicates that precursory rupture of one of solder layers 113 and 124 should be prevented from occurring in order to ensure along lifetime. On the other hand, for the insulated semiconductor device of the present invention using the intermediate metal member 40 comprising the composite material member of the present invention whose thermal expansivity is 10.0 ppm/° C., a remarkably improved lifetime profile of shape parameter m=5.3, average lifetime $\mu$=4300 cycles and $-3\sigma$ level lifetime=1300 cycles is shown.

Figure 24:
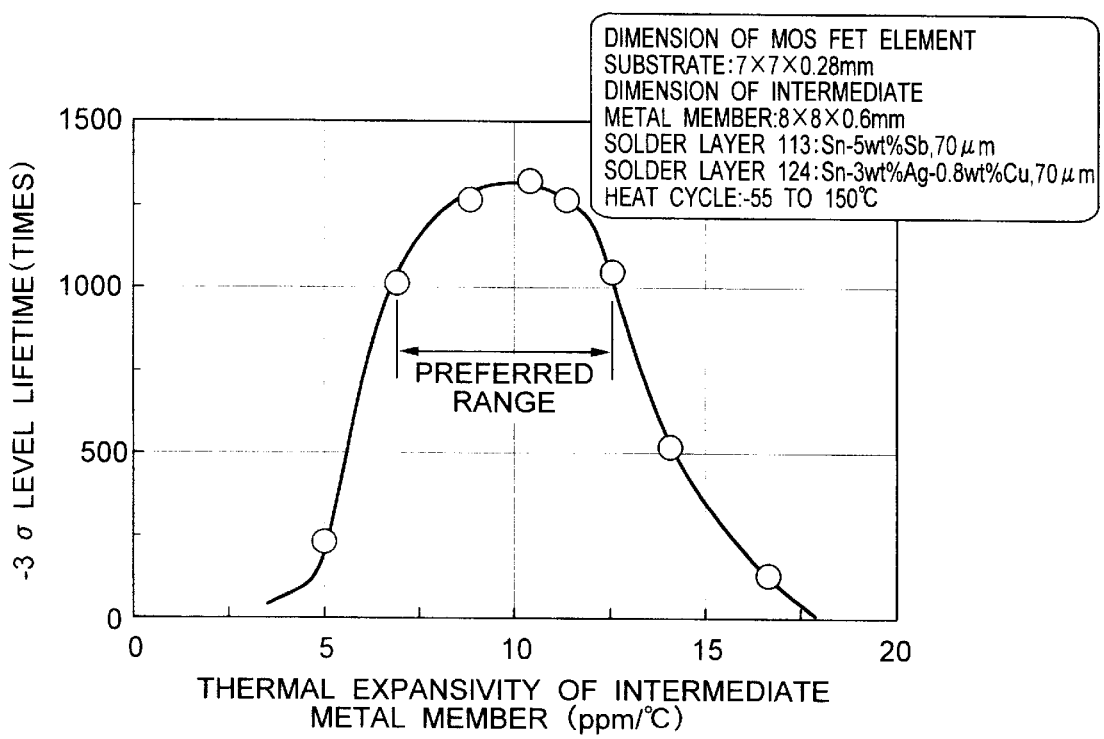
FIG. 24 is a graph showing the 3σ level life of the soldered portion of the MOS FET element substrate by the heat cycle test.

FIG. 24 is a graph showing the $-3\sigma$ level lifetime of the soldered portion of the MOS FET element substrate by a heat cycle test. In the area of small thermal expansivity, precursory rupture of the solder layer 124 due to cracking occurs, and therefore the lifetime as a semiconductor device is reduced. The lifetime increases as the thermal expansivity grows in the range of from about 5 to 10 ppm/° C., and the lifetime decreases as the thermal expansivity grows in the range of from about 10 to 16.7 ppm/° C. In particular, in the area of large thermal expansivity, precursory rupture of the solder layer 113 due to cracking occurs, and therefore the lifetime as a semiconductor is reduced. Under general operational conditions for the insulated semiconductor device 900 of this embodiment, it is desirable that the heat cycle lifetime corresponds to 1000 cycles or more (conditions: −55 to 150° C.). The thermal expansivity of the intermediate metal member 40 selected from this point of view is in the range of from 7 to 12.5 ppm/° C. Thermal expansivity in the range of from 7 to 12.5 ppm/° C. can be obtained when the content of $Cu_2O$ is 24 to 70 vol % (FIG. 2).

Figure 25:
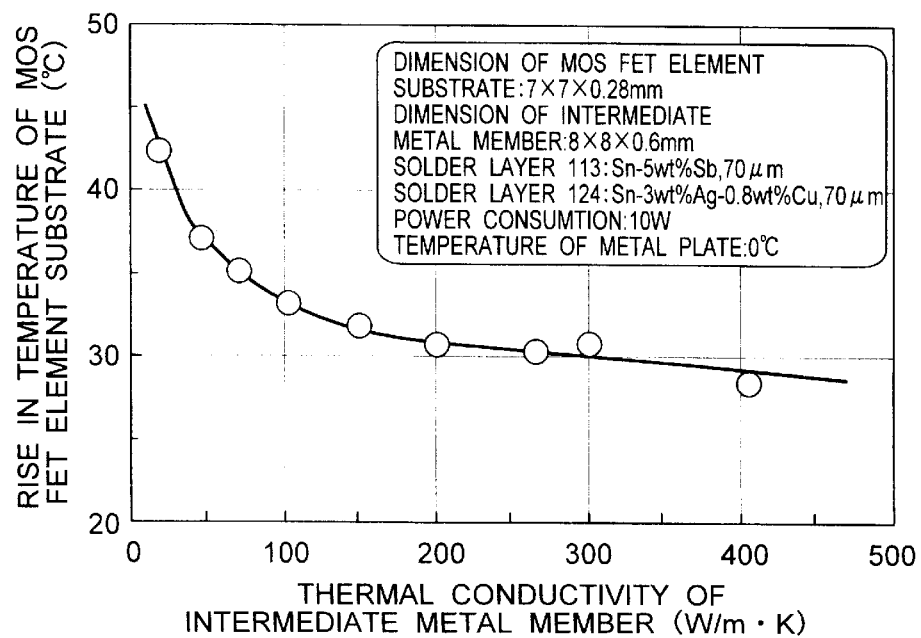
FIG. 25 is a graph showing a rise of temperature of the semiconductor element substrate when electric power is applied to the insulated semiconductor device.

In the present invention, the MOS FET element substrate 101 generating an extremely large amount of heat is mounted by soldering on the circuit substrate 2 with the wiring layer 203 made of Cu selectively formed on one of the main faces of the metal plate 201 such as Al through the insulating layer 202 composed of epoxy resin. In the heat dissipation pass extending from the MOS FET element substrate 101 to the metal plate 201, the epoxy insulating layer 202 hinders heat dissipation most significantly. In this case, quality of heat dissipation as a semiconductor device is dependent on how the heat flow is spread in the pass extending from the MOS FET element substrate 101 to the epoxy insulating layer 202. FIG. 25 is a graph showing a rise in temperature of the semiconductor element substrate when electric power is applied to the insulated semiconductor device. This graph shows a result of simulation, in which it is supposed that the level of power consumption by the MOS FET element substrate 101 is 10 W, the surface of the MOS FET element substrate 101 is in a diabetic state, and the surface of the Al plate 201 as a radiating surface is kept at 0° C. It is shown that the level of rise in temperature of the MOS FET element substrate 101 tends to decrease as the thermal conductivity of the intermediate metal member 40 increases. It can be considered that the temperature for maintaining stable operations of the MOS FET element substrate 101 is about 125° C. In addition, the semiconductor device can preferably maintain stable operations at a highest possible ambient temperature (temperature of the Al plate 201). Referring to the graph, in order that the device is operated stably at an ambient temperature of 90° C., an adjustment should be made so that the thermal conductivity of the intermediate metal member 40 is 70 W/m·K or higher. The thermal conductivity of the intermediate metal member 40 selected from this point of view is 70 W/m·K or higher. Thus, the content of $Cu_2O$ selected in terms of heat dissipation quality is equal to or smaller than 70 vol % (FIG. 3).

Furthermore, the circuit substrate 2 described above has the wiring layer 203 made of Cu selectively formed on one of the main faces of the metal plate 201 made of Al through the insulating layer 202 composed of epoxy resin. However, the circuit substrate 2 in the present invention should not be limited to a form with the wiring layer 203 provided on the Al plate 201 through the insulating layer 202. The first reason for this is that in the case where the semiconductor element substrate 1 is mounted by soldering directly on the Al plate 201 that does not have the insulating layer 202 and wiring layer 203, the situation is not different in the sense that a mounted component of small thermal expansivity is soldered to a circuit substrate of large thermal expansivity in a same way as the first and second prior arts, and therefore there are similar problems. The second reason is that even in the case where the MOS FET element substrate 101 is mounted by soldering on the Al plate 201 through the intermediate metal member 40, reliability can be improved as in the case of the circuit substrate 2 provided thereon with the insulating layer 202 and wiring layer 203. Thus, in the present invention, the base plate 2 with no circuit formed thereon such as Example 3 described later is also covered.

As described above, the important point in this embodiment is that an adjustment is made so that the thermal expansivity and the thermal conductivity of the intermediate metal member 40 fixed between the MOS FET element substrate 101 and the circuit substrate 2 are 7 to 12. 5 ppm/° C. and 70 W/m·K or higher, respectively. The content of $Cu_2O$ of the intermediate metal member 40 satisfying these conditions is 24 to 70 vol %.

The semiconductor device 900 according to this embodiment has the MOS FET element substrate 101 mounted through the intermediate metal member 40 on the circuit substrate 2 with the wiring layer 203 selectively formed on one of the main faces of the metal plate 201 through the insulating layer 202. At this time, the MOS FET element substrate 101 is soldered to the intermediate metal member 40 with the solder layer 113 (thickness: 70 $\mu$m) having composition of Sn-5 wt % Sb, and the intermediate metal member 40 is soldered to the Al insulating circuit substrate 2 with the solder layer 124 (thickness: 70 $\mu$m) having composition of Sn-3 wt % Ag-0.8 wt % Cu. Other solder composed of at least one material selected from the group consisting of Sn, Sb, Ag, Cu, Ni, P, Bi, Zn, Au and In, and Sn may be substituted for these solder layers 113 and 124. For specific solders 113 and 124, a single Sn metal, a Sn—Sb based metal represented by Sn-5 wt % Sb-0.6 wt % Ni-0.05 wt % P and Sn-5 wt % Sb, a Sn—Ag based metal represented by Sn-3.5 wt % Ag and Sn-3 wt % Ag-0.8 wt % Cu, a Sn—Bi based metal represented by Sn-58 wt % Bi, a Sn—Cu based metal represented by Sn-0.7 wt % Cu, a Sn—In based metal represented by Sn-52 wt % In, a Sn—Zn based metal represented by Sn-9 wt % Zn, an In—Ag based metal represented by In-10 wt % Ag and an Au—Sn based metal represented by Au-20 wt % Sn can be used.

The power semiconductor element substrate 1 may have different electric functions such as an IGBT, a transistor, a thyrister, a diode and a MOS FET transistor. Also, whether the semiconductor element substrate 1 is composed of Si (4.2 ppm/° C.) or of a material other than Si (Ge: 5.8 ppm/° C., GaAs: 6.5 ppm/° C., GaP: 5.3 ppm/° C., SiC: 3.5 ppm/° C., etc.), a similar effect can be obtained.

Figure 26:
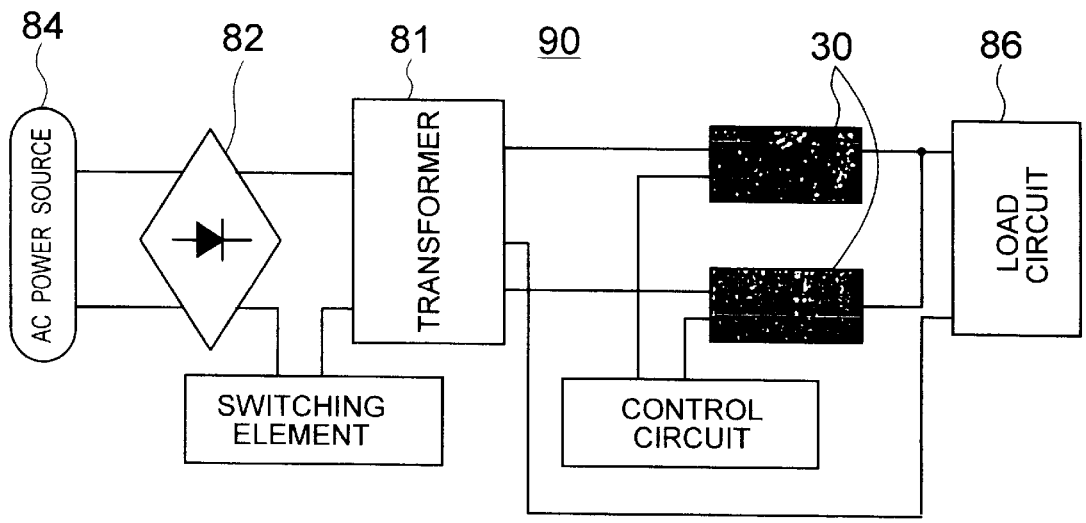
FIG. 26 is a block diagram illustrating an electric power apparatus in which the insulated semiconductor device is incorporated.

FIG. 26 is a block diagram illustrating a power circuit device with the insulated semiconductor device 900 of this embodiment incorporated therein. This power circuit device rectifies alternating current power to supply voltage-controlled power to a load circuit. Here, the load circuit in this embodiment is an arithmetic circuit of a computer.

[Embodiment 4]

In this embodiment, an insulated semiconductor device equipped with a power semiconductor element substrate and a controlling circuit for controlling electric operations of the power semiconductor element substrate, and an ignition device for car using this semiconductor device will be described.

Figure 27A:
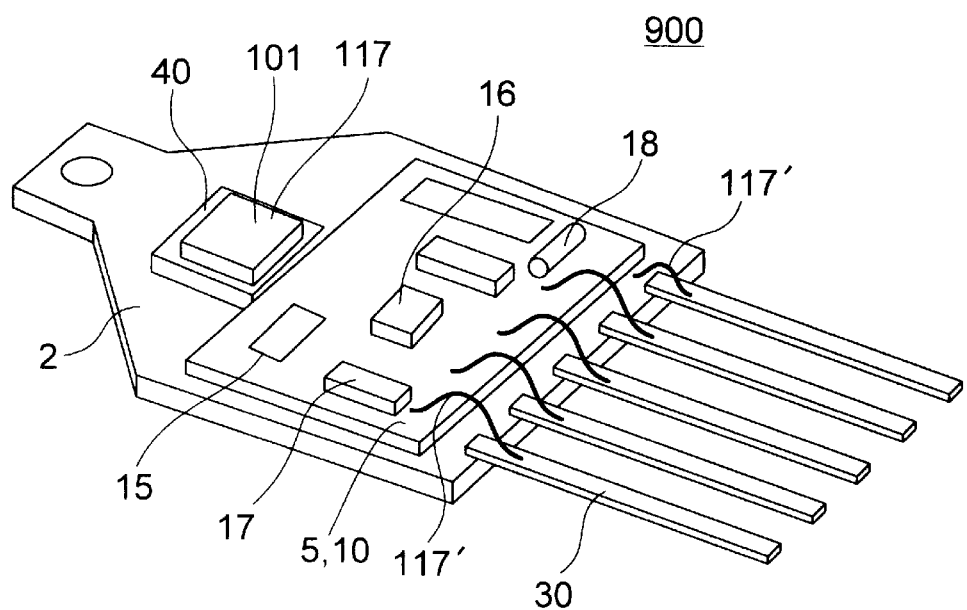
FIGS. 27A and 27B are aerial and sectional views illustrating the insulated semiconductor device of one embodiment.
Figure 27B:
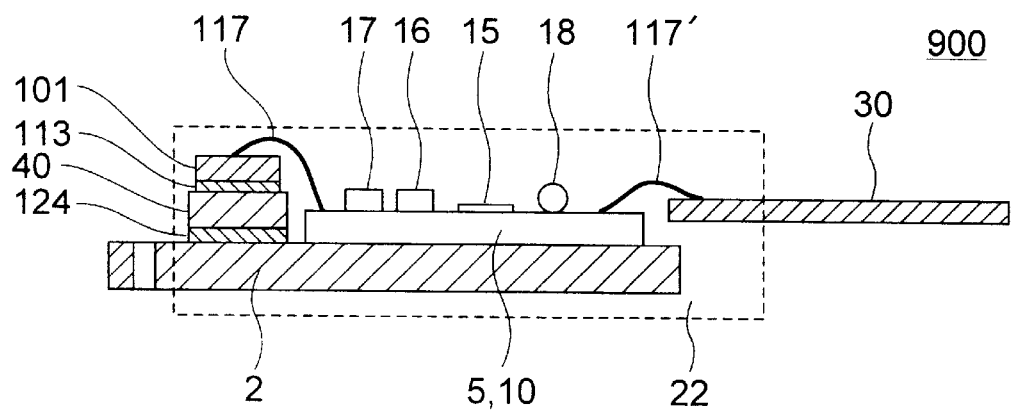

FIGS. 27A and 27B are aerial and sectional views illustrating the insulated semiconductor device of this embodiment. The insulated semiconductor device 900 has mounted on a supporting member 2 an IGBT element substrate 101 composed of Si as a power semiconductor element substrate and a controlling circuit 10 for controlling electric operations of the IGBT element substrate 101. The IGBT element substrate 101 (chip size: 5×5×0.25 mm) is fixed on the Al supporting member 2 having a thickness of 1 mm and an area of 25×20 mm through an intermediate metal member 40 (size: 6×6×0.6 mm) with a solder 113 having composition of Sn-5 wt % Sb-0.6 wt % Ni-0.05 wt % P (thickness: 200 μ, temperature: 270±10° C.) and a solder 124 having composition of Sn-3 wt % Ag-0.8 wt % Cu (thickness: 200 μm, temperature: 240±10° C.). The intermediate metal member 40 constitutes a composite material member with a metal layer 125C (Ni-plated layer: thickness: 10 μm) formed through the copper layer 125D (thickness: 50 μm) formed by the reduction reaction of Formula 2, on a base material 125' with the cuprous oxide particles 125B dispersed in the copper matrix 125A. It has properties of thermal expansivity of 7.5 ppm/° C. and thermal conductivity of 100 W/m·K. Also, the surface of the Al supporting member 2 is coated with Ni plating 43 (thickness: 3 to 7 μm). The concentration of the cuprous oxide particles 125B in the base material 125' is 60 vol %.

On the other hand, an alumina ceramic substrate 5 having a size of 19×10×0.8 mm, provided thereon with a thick-film Cu wiring 203 (not shown) with thickness of about 15 μm, a thick-film resistor 15 and an overcoat glass layer (not shown) was prepared. Then, a desired area of the alumina substrate 5 was coated with a paste containing a powdered solder turned ultimately into a solder 113', having composition of Sn-3 wt % Ag-0.8 wt % Cu, and chip components such as an IC chip substrate 16, condenser chips 17 and glass sleeve type Zener diode chips 18 were mounted on this coated portion, and were heated in an atmosphere at 250±10° C. Thereby, the chip components 16, 17 and 18 and the thick-film resistor 15 were electrically connected to the thick-film Cu wiring 203 with the solder 113', and a controlling circuit 10 for controlling operations of the IGBT element substrate 101 was formed on the alumina substrate 5. This alumina substrate 5 is fixedly mounted on the Al supporting member 2 with a silicon resin adhesive 9 (not shown). Emitter electrodes and gate electrodes of the IGBT element substrate 101 are electrically connected to the controlling circuit 10 through an Al small-gage wire 117 with a diameter of 300 μm. Collector electrodes of the IGBT element substrate 101 are electrically connected to a terminal 30 via the Al supporting member 2 and the Al small-gage wire 117. The controlling circuit 10 is also connected electrically to the terminal 30 through the Al small-gage wire 117'. The terminal 30 is composed of a material having same properties as those of the Al supporting member 2, and its surface is coated with Ni plating (not shown, thickness: 3 to 7 μm).

The assembly having the structure roughly described above has been subjected to transfer mold with epoxy resin 22, including part of the Al supporting member 2 and the terminal 30, such that the mounted portion of the IGBT element substrate 101, the mounted portion of alumina substrate 5 with chip components mounted thereon, and the Al small-gage wires 117 and 117' are perfectly sealed, as indicated by the dashed line in the sectional view shown in FIG. 27B. The epoxy resin 22 has properties of thermal expansivity: 16 ppm/° C., glass transition point: 155° C., volume resistivity: 9×10$^{15}$ Ω·m (RT) and bending elasticity: 15.7 GPa (1600 kgf/mm$^2$). The transfer mold was carried out at 180° C., and then thermal processing was performed at 150° C. for 2 hours to promote curing of resin.

Figure 28:
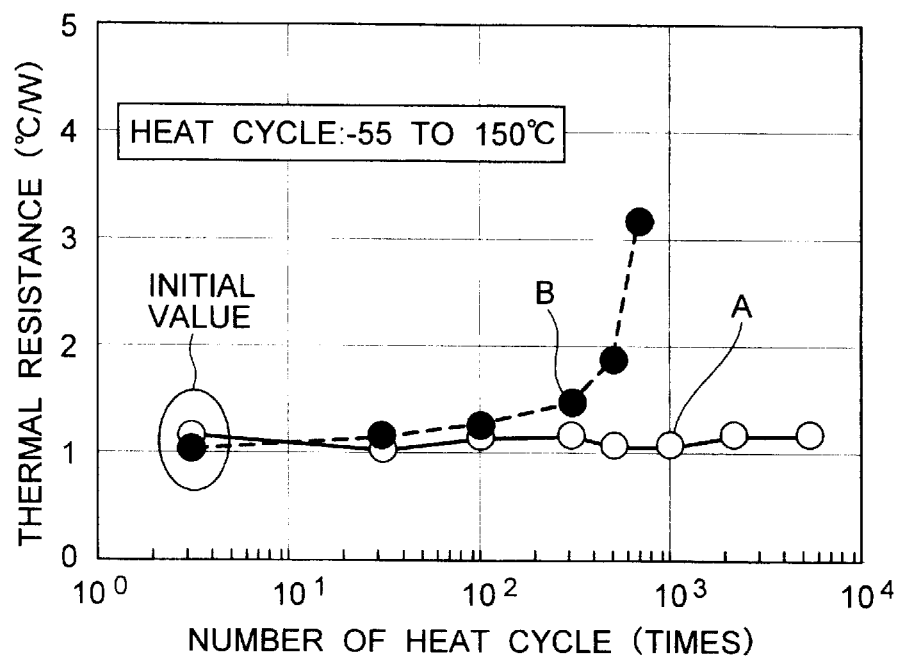
FIG. 28 is a graph showing transition of thermal resistance of the semiconductor device by the heat cycle test.

FIG. 28 shows transition thermal resistance of the semiconductor device by a heat cycle test. The curve A in the drawing is associated with the insulated semiconductor device 900 of this embodiment, and the curve B is associated with a semiconductor device for comparison (using an intermediate metal member composed of Mo). For the thermal resistance of the insulated semiconductor device 900, an initial value (about 1.1° C./W) is kept up to 5000 cycles as the heat cycle number. As described above, it is confirmed that the insulated semiconductor device 900 of this embodiment has excellent reliability. The soldered portion of the IGBT element substrate 101 was examined after 5000 cycles, and it was found that neither the solder layer 113 nor 124 was ruptured. This is based on the fact that because the thermal expansivity of the intermediate metal member 40 is adjusted to be 10.0 ppm/° C., which is in the preferred range of thermal expansivity (from 7 to 12.5 ppm/° C.), precursory rupture of any one of the solder layers 113 and 124 is prevented from occurring to serve the purpose of increasing the lifetime of the entire semiconductor device. On the other hand, in the case of the semiconductor device for comparison, the thermal resistance starts to grow after 100 heat cycles. This indicates that rupture hindering the thermal conductivity occurs in the soldered portion of the IGBT element substrate. As a result of decomposing the semiconductor device for comparison after the test to examine the soldered portion of the IGBT element substrate, it was found rupture occurring in a portion corresponding to the solder layer 124.

Furthermore, the initial value of thermal resistance for the insulated semiconductor device 900 of this embodiment is about 1.1° C./W. This value indicates that the substrate 101 can operate stably even if the IGBT element substrate 101 consumes electric power of 10 W at an ambient temperature of 114° C. In this way, excellent heat dissipation quality implies that stable performance can be maintained even if the semiconductor device 900 is implemented in an area with severe temperature conditions such as an engine room, which constitutes a particularly preferred feature as a semiconductor device for car. In the case of the insulated semiconductor device 900 of this embodiment, despite the fact that the intermediate metal member 40 comprises the base material 125' containing 60 vol % of cuprous oxide particles 125B and thus has low thermal conductivity of 100 W/m·K, its initial thermal resistance is equivalent to that of the semiconductor device for comparison using the Mo intermediate metal member with thermal conductivity of about 150 W/m·K. This is because the copper layer 125D produced by the reduction reaction of Formula 2 has large thickness of 50 µm, and this layer allows the heat flow to spread in the lateral direction effectively. This feature is an important advantage that is brought about by the semiconductor device using the composite material member of the present invention.

Figure 29:
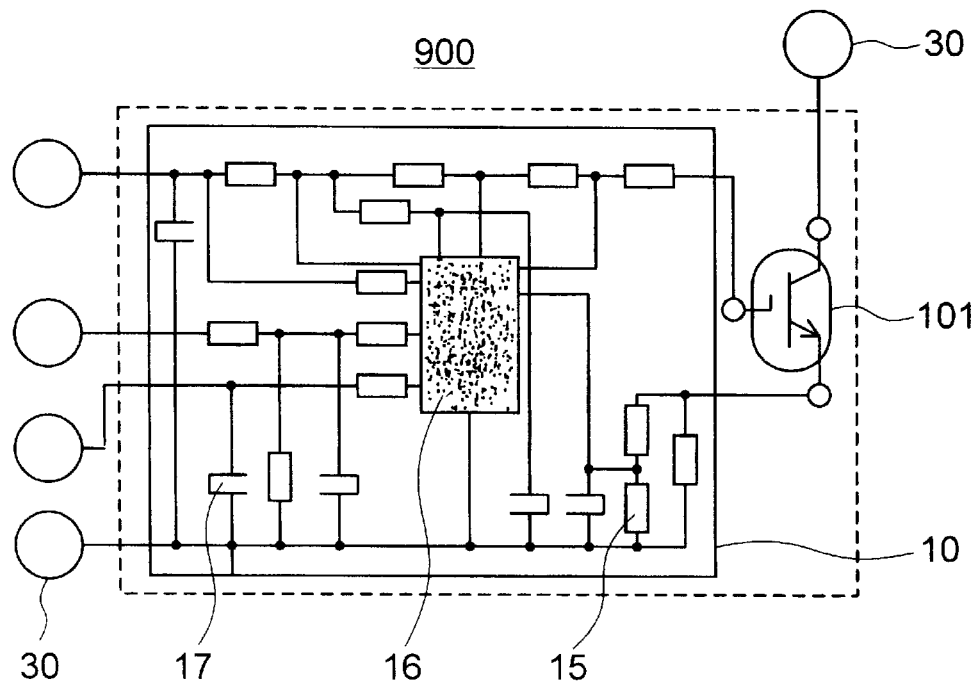
FIG. 29 illustrates a circuit device of the insulated semiconductor device.

FIG. 29 illustrates the circuit of the insulated semiconductor device 900 of this embodiment. The emitter and gate of the IGBT element substrate 101 are electrically connected to the controlling circuit 10, and operations of the element 101 are controlled by this circuit 10. The resistor 15, the IC chip substrate 16, the condenser chip 17 and the Zener diode chip 18 are mounted on the controlling circuit 10, and these elements are connected by the thick-film Cu wiring 203. The terminals 30 are pulled out from the IGBT element 101 and the controlling circuit 10, respectively. The insulated semiconductor device 900 comprises the IGBT element 101 and the circuit 10 for controlling the element 101, and is used for power supply to the coil of an engine ignition device for car. The insulated semiconductor device 900 comprising these circuits was used for ignition of an engine for car in a maximum ambient temperature of 110° C. It has been confirmed that the insulated semiconductor device 900 of this embodiment maintains its circuit function even under operational conditions corresponding to 1000 hundreds kilometers of distance traveled by an automobile.

[Embodiment 5]

In this embodiment, an insulated semiconductor device equipped with a power semiconductor element substrate and a controlling circuit for controlling electric operations of the power semiconductor element substrate, and an ignition device for car using this semiconductor device will be described.

Figure 30:
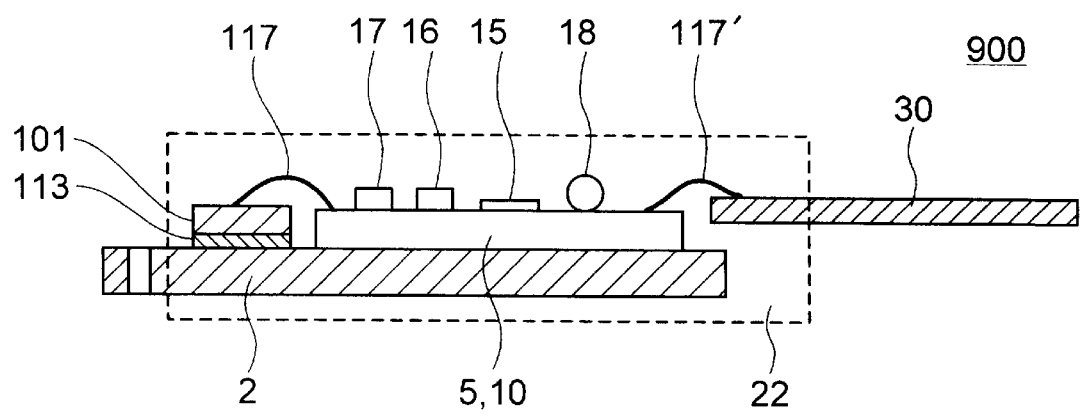
FIG. 30 is a schematic sectional view illustrating the insulated semiconductor device.

FIG. 30 is a schematic sectional view illustrating the insulated semiconductor device of this embodiment. Since the insulated semiconductor device 900 has a structure essentially similar to that of the insulated semiconductor device described in the aforesaid Embodiment 4, description of duplicated matters will be avoided, and only the gist of changed matters will be given below.

The first point distinguishing this embodiment from the aforesaid Embodiment 4 is that the intermediate metal member is eliminated. The second distinguishing point is that the composite material member of the present invention is used as a supporting member 2. This composite material member has a metal layer 125C (Ni-plated layer: thickness: 10 µm) formed through the copper layer 125D (thickness: 150 µm) formed by the reduction reaction of Formula 2, on a base material 125' with the cuprous oxide particles 125B dispersed in the copper matrix 125A, and has properties of thermal expansivity: 12 ppm/° C. and thermal conductivity: 220 W/m·K. In addition, the surface of the supporting member 2 is coated with Ni-plating 43 (thickness: 3 to 7 µm). The concentration of cuprous oxide particles 125B in the base material 125' is 60 vol %. The third distinguishing point is that the IGBT element substrate 101 (chip size: 5×5×0.25 mm) is fixed by a solder layer 113 (thickness: 200 µm, temperature: 240±10° C.) having composition of Sn-3 wt % Ag-0.8 wt % Cu. Thus, the solder layer 124 is eliminated.

Figure 31:
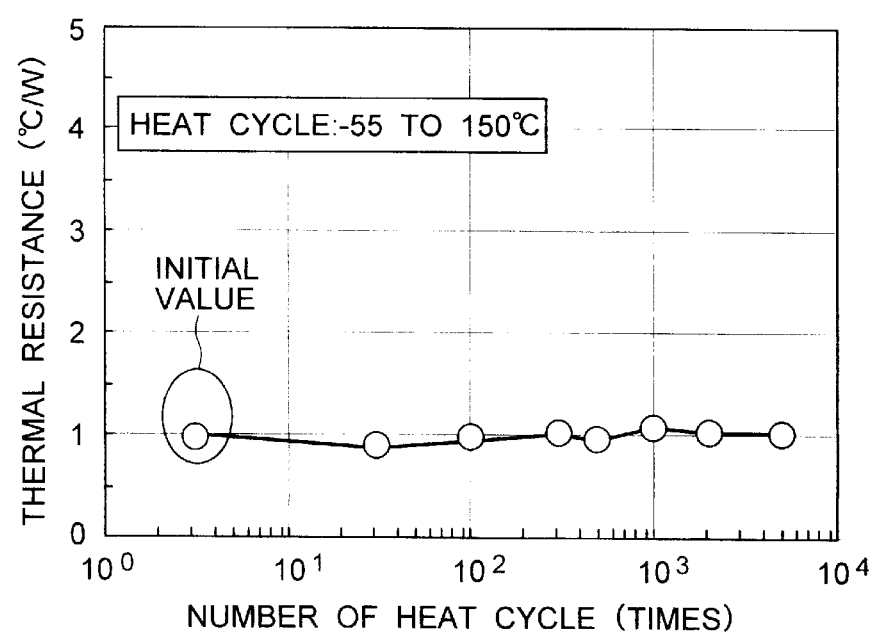
FIG. 31 is a graph showing transition of thermal resistance of the insulated semiconductor device by the heat cycle test.

FIG. 31 is a graph showing transition of thermal resistance of the insulated semiconductor device of this embodiment by a heat cycle test. First, it is noted that the initial value of thermal resistance equals 0.95° C./W. Comparing the insulated semiconductor device 900 with the insulated semiconductor device of the aforesaid embodiment (the intermediate metal member 40 existing between the supporting member 2 and the IGBT element substrate 101, about 1.1° C./W), the heat dissipation quality of the insulated semiconductor device 900 of this embodiment is higher by 15%. The reason why excellent heat dissipation quality could be obtained is that (1) the copper layer 125D based on the reduction reaction of Formula 2 of the supporting member 2 has large thickness of 150 µm, and the heat flow is significantly widened by this layer, (2) the base material 125' has high thermal conductivity of 220 W/m·K, and (3) the intermediate metal member 40 and the solder layer 124 are eliminated from the heat dissipation pass. In addition, (4) the fact that the copper layer 125D and the metal layer (Ni-plated layer) 125C are tightly bonded together, and thus heat transfer at the interface therebetween is not hindered also contributes to provision of good heat dissipation quality.

Now, paying attention to transition of thermal resistance, it is appreciated that the insulated semiconductor device 900 of this embodiment is highly reliable. The soldered portion of the IGBT element substrate 101 was examined after 5000 cycles. Slight cracking was observed in the fringe of the solder layer 113. However, this cracking does not grow so significantly that it affects a change (increase) in thermal resistance. This is based on the fact that rupture of the solder layer 113 is prevented because the thermal expansivity of the supporting member 2 is adjusted to be 12 ppm/° C., which is within the preferred range of thermal expansivity (from 7 to 12.5 ppm/° C.). In addition, this is also based on the fact that the copper layer 125D is tightly bonded to the metal layer 125C (Ni-plated layer) by diffusion bonding, leading to prevention of stripping rupture at the interface therebetween.

The insulated semiconductor device 900 of this embodiment comprises the IGBT element 1 and the circuit 10 for controlling the IGBT element 1, with the circuit shown in FIG. 29, and is used for power supply to the coil of an engine ignition device for car. This semiconductor device 900 was used for ignition of an engine for car in a maximum ambient temperature of 110° C. It has been confirmed that the insulated semiconductor device 900 of this embodiment maintains its circuit function even after operations corresponding to 1000 hundreds kilometers of automobile travel distance.

[Embodiment 6]

In this embodiment, an insulated semiconductor device for DC/DC converter with a MOS FET power semiconductor element substrate incorporated therein, and a DC/DC converter device using this semiconductor device will be described.

Since the insulated semiconductor device 900 of this embodiment has a structure essentially similar to that of the insulated semiconductor device described in the aforesaid Embodiment 3, description of duplicated matters will be avoided, and only the gist of changed matters will be given below.

The first point distinguishing this embodiment from the aforesaid Embodiment 3 is that the composite material member of this embodiment is used as a metal plate 201 (size: 68×46×1.5 mm) of the insulating circuit substrate 2 serving also as a supporting member. This composite material member has a metal layer 125C (Ni-plated layer: thickness: 10 µm) formed through the copper layer 125D (thickness: 50 µm) formed by the reduction reaction of Formula 2, on a base material 125' with the cuprous oxide particles 125B dispersed in the copper matrix 125A, and has properties of thermal expansivity: 10 ppm/° C. and thermal conductivity: 140 W/m·K. The concentration of cuprous oxide particles 125B in the base material 125' is 50 vol %. In addition, the insulating circuit substrate 2 has a Cu wiring layer 203 (thickness: 70 μm) is selectively formed on one of the main faces of the composite material member 201 as a metal plate through an epoxy resin insulating layer 202 (thickness: 150 μm). The second point distinguishing this embodiment from the aforesaid embodiment 3 is that the MOS FET element substrates 101 (eight substrates, chip size: 9×9×0.28 mm) composed of Si as a power semiconductor element substrate are directly mounted by soldering on the Cu wiring layer 203 of the Al insulating circuit substrate 2 using a solder layer 113 (composition: Sn-3 wt % Ag-0.8 wt % Cu). That is, the intermediate metal member 40 and the solder layer 124 are eliminated.

Figure 32:
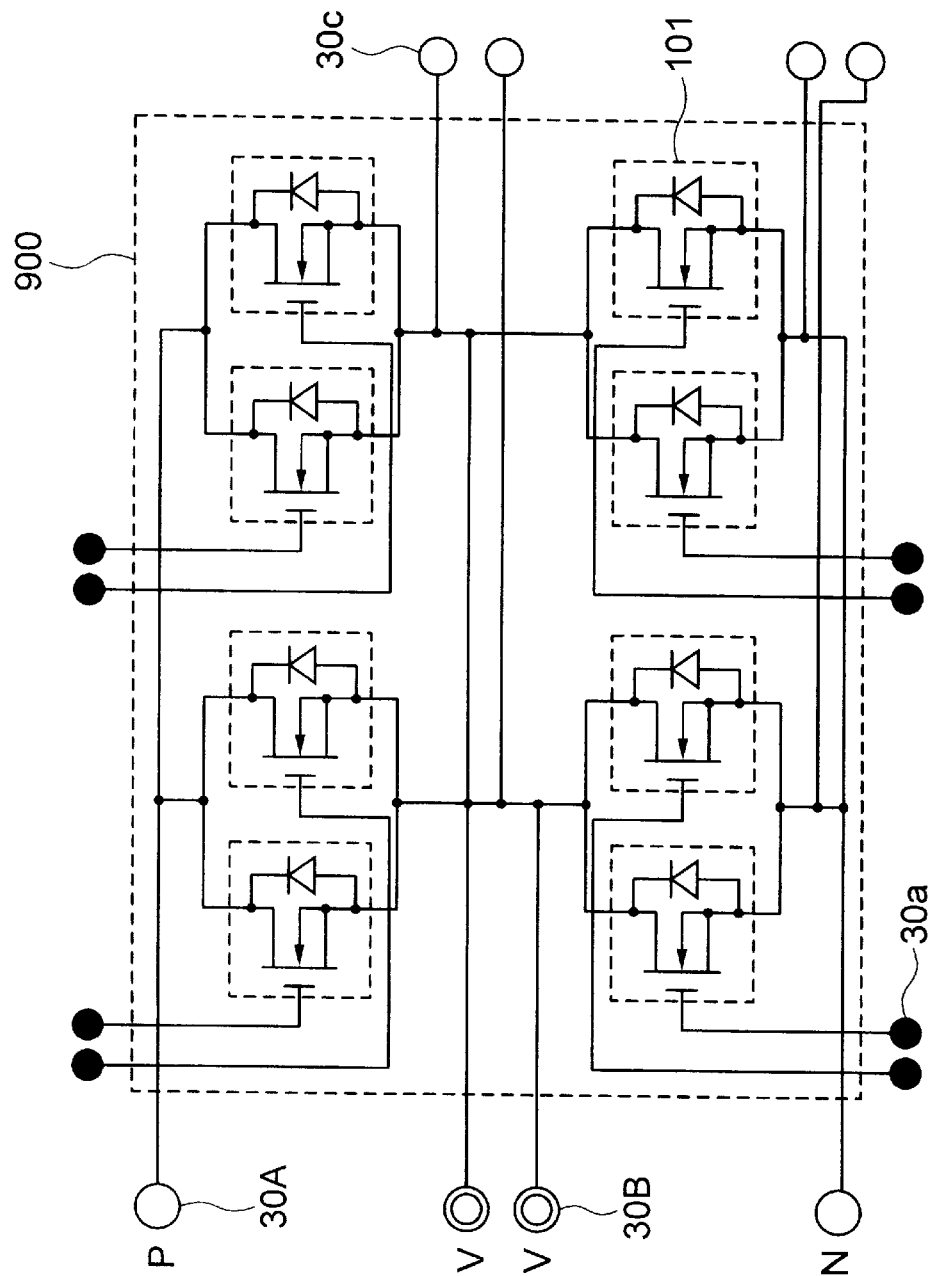
FIG. 32 illustrates the circuit of the insulated semiconductor device.

The insulated semiconductor device 900 of this embodiment prepared as described above constitutes a circuit shown in FIG. 32. For the gate terminal 30a, a dedicated terminal is placed for each pair of MOS FET elements 101 wired in parallel, and the source terminal 30c, input terminal 30A and output terminal 30B are wired so that they are shared among the MOS FET elements 101.

Steady thermal resistance for one MOS FET element 101 of the insulated semiconductor device 900 of this embodiment was about 1.5° C./W. This value indicates that even if the MOS FET element 101 consumes electric power of 10 W at an ambient temperature of 110° C., the element 101 can stably operate (A temperature of the element 101 does not exceed 125° C.). The reason why such excellent heat dissipation quality was obtained is that the composite material member of the present invention having high thermal conductivity of 140 W/m·K was used in the metal plate 201 of the insulated circuit substrate 2. Also, the copper layer 125D with its thickness adjusted to be 50 μm contributes to improvement of thermal conductivity of the composite material member.

Transition of thermal resistance of the insulated semiconductor device 900 of this embodiment by heat cycle test (−55 to 150° C.) was examined. Thermal resistance almost equivalent to an initial value (about 1.5° C./W) was maintained up to 5000 heat cycles. In this embodiment, since the composite material member of the present invention is used for the metal plate 201 of the insulated circuit substrate 2, and the thermal expansivity of the metal plate 210 is adjusted to be 10 ppm/° C., which is within the preferred range (from 7 to 12.5 ppm/° C.), cracking rupture of the solder layer 113 is curbed, and thus the lifetime as an entire semiconductor device is increased. Also, the fact that the copper layer 125D is strongly bonded to the metal layer 125C (Ni-plated layer) by interdiffusion contributes to excellent heat dissipation quality obtained with stability.

Figure 33:
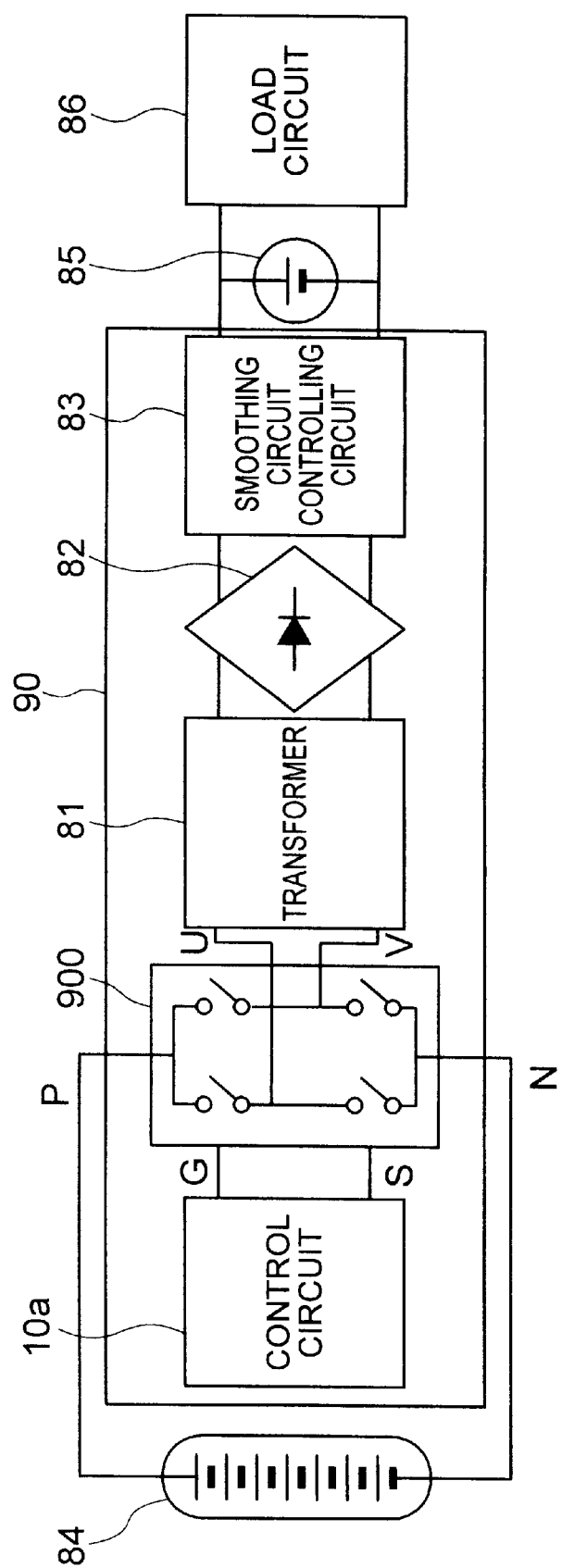
FIG. 33 is a block diagram illustrating an electronic device as a DC/DC converter in which the insulated semiconductor device is incorporated.

FIG. 33 is a block diagram illustrating an electronic device as a DC/DC converter with the insulated semiconductor device of this embodiment incorporated therein. The DC/DC converter 90 is provided therein with the insulated semiconductor device 900, a controlling circuit 10A for driving the insulated semiconductor device 900, a transformer 81, rectifying circuit 82 and a smoothing and controlling circuit 83, and supplies electric power with voltage of the input power source 84 rising and descending to a battery 85, this electric power is ultimately transferred to a load circuit 86. Here, the load circuit refers to motors as a power source of an illuminator, wiper, window, air conditioner and so on, an ignition device for engine, sensors or the like. The above DC/DC converter device 90 is attached to a car, and its performance has been validated under operational conditions corresponding to 1000 hundreds kilometers of distance traveled by an automobile. As a result, it has been confirmed that the semiconductor device 30 and the converter device 90 of this embodiment maintains an initial circuit function even after traveling over 1000 hundreds kilometers.

[Embodiment 7]

In this embodiment, a non-insulated semiconductor device with a semiconductor element substrate mounted directly on a composite supporting member with no insulating member existing therebetween will be described.

Figure 34A:
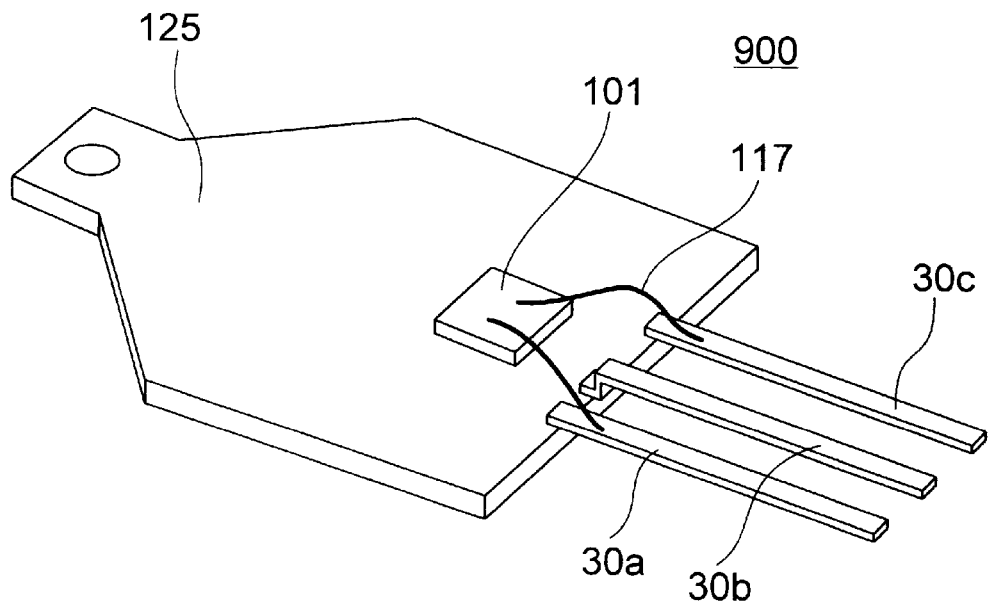
FIGS. 34A and 34B are schematic aerial and schematic sectional views of a non-insulated semiconductor device with the semiconductor element substrate mounted directly on the supporting member.
Figure 34B:
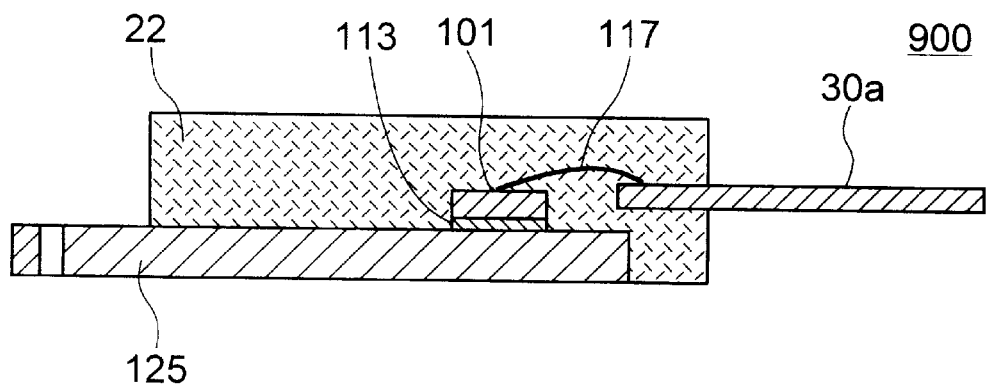

FIGS. 34A and 34B are schematic aerial and sectional views of a non-insulated semiconductor device with a semiconductor element substrate mounted directly on a supporting member. The supporting member 125 on which the semiconductor element substrate is to be mounted has been processed as a lead frame, and uses the composite material member of the present invention. This composite material member has a metal layer 125C (Ni-plated layer: thickness: 10 μm) formed through the copper layer 125D (thickness: 50 μm) formed by the reduction reaction of Formula 2, on a base material 125' with the cuprous oxide particles 125B dispersed in the copper matrix 125A, and has properties of thermal expansivity: 10 ppm/° C. and thermal conductivity: 140 W/m·K. The concentration of cuprous oxide particles 125B in the base material 125' is 50 vol %. Also, the terminal 30 is lead frame-processed with a same material along with the supporting member 125, has a metal layer 125C (Ni-plated layer: thickness: 10 μm) formed through the copper layer 125D (thickness: 50 μm) formed by the reduction reaction of Formula 2, on a base material 125' with the cuprous oxide particles 125B dispersed in the copper matrix 125A, and has properties of thermal expansivity: 10 ppm/° C. and thermal conductivity: 140 W/m·K. A transistor element substrate 101 (size: 6×6×0.3 mm) is directly mounted by soldering on the supporting member 125 with a solder layer 113 (composition: Sn-5 wt % Sb-0.6 wt % Ni-0.05 wt % P, thickness: 70 μm). The emitter electrode and base electrode of the transistor element substrate 101 are connected to the emitter terminal 30c and the base terminal 30a, respectively through Al small-gage wires 117 (diameter: 300 μm). In addition, the collector electrode of the transistor element substrate 101 is connected to the collector terminal 30b via the solder layer 113 and the supporting member 125. Ultimately, the transistor element substrate 101, the supporting member 125, the terminals 30a, 30b and 30c, and the Al small-gage wire 117 are tightly sealed by transfer mold with epoxy resin 22 (not shown in the aerial view). Here, the supporting member 125 is not fully covered with the epoxy resin 22. The non-insulated semiconductor device 900 of this embodiment has the above described structure in general.

The heat resistance of the above described non-insulated semiconductor device 900 is 0.14° C./W, and is slightly inferior to that of a non-insulated semiconductor device for comparison with its supporting member composed of Cu material (0.11° C./W), in terms of heat dissipation quality. However, even if the transistor element substrate 101 has consumed 100 W of electric power, the temperature of the transistor element substrate 101 increases only by 3° C., compared to the case of the non-insulated semiconductor device for comparison. The reason why such excellent heat dissipation quality was exhibited by the non-insulated semiconductor device 900 of this embodiment is that the composite material member of the present invention having high thermal conductivity of 140 W/m·K was used for the supporting member 125. Also, the copper layer 125D with its thickness adjusted to be 50 μm contributes to improvement of thermal conductivity of the composite material member.

Transition of thermal resistance of the non-insulated semiconductor device 900 of this embodiment by heat cycle test (−55 to 150° C.) was examined. Thermal resistance almost equivalent to an initial value (about 0.14° C./W) was maintained up to 5000 heat cycles. On the other hand, for the non-insulated semiconductor device for comparison, increase in thermal resistance was observed after 1000 cycles. Cracking in the solder layer is responsible for the increase in thermal resistance of the non-insulated semiconductor device for comparison. In contrast to this, for the non-insulated semiconductor device 900 of this embodiment, since the composite material member of the present invention is used for the supporting member 125, and its thermal expansivity is adjusted to be 10 ppm/° C., which is within the preferred range (from 7 to 12.5 ppm/° C.), cracking rupture of the solder layer 113 is curbed, and thus the lifetime as an entire semiconductor device is increased. Also, the fact that the copper layer 125D is strongly bonded to the metal layer 125C (Ni-plated layer) by interdiffusion contributes to excellent heat dissipation quality obtained with stability.

[Embodiment 8]

In this embodiment, a glass sleeve sealed/non-insulated semiconductor device with a semiconductor element substrate pressure-welded by composite material member electrodes will be described.

Figure 35:
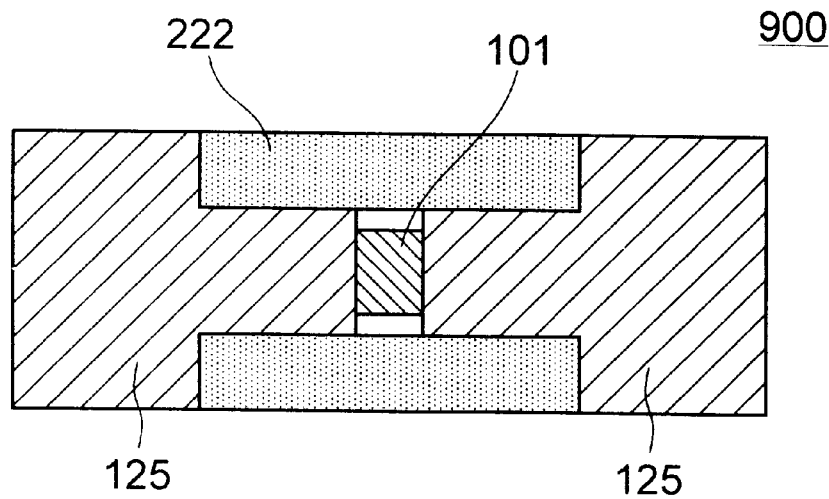
FIG. 35 is a schematic sectional view of the non-insulated semiconductor device with the semiconductor element substrate welded by pressure by a composite material electrode.

FIG. 35 is a schematic sectional view of a non-insulated semiconductor device with a semiconductor element substrate pressure-welded by composite material member electrodes. A Zener diode substrate made of Si as the semiconductor element substrate 101 (size: 0.8×0.8×0.28 mm) is pressure-welded by electrodes 125 composed of the composite material member of the present invention. This composite material member has a metal layer 125C (Ni-plated layer: thickness: 7 $\mu$m) formed through the copper layer 125D (thickness: 10 $\mu$m) formed by the reduction reaction of Formula 2, on a base material 125' with the cuprous oxide particles 125B dispersed in the copper matrix 125A, and has properties of thermal expansivity: 7.5 ppm/° C. and thermal conductivity: 100 W/m·K. The concentration of cuprous oxide particles 125B in the base material 125' is 60 vol %. Ni layers are formed on the surfaces of the Zener diode substrates 101 contacting the electrodes 125. These members 101 and 125 are set in a glass sleeve 222 having an inert diameter of 1.2 mm and an outer diameter of 1.5 mm, and is sealed and united by being heated in the presence of nitrogen (540° C.). Here, the glass sleeve 222 is a lead silicate glass having thermal expansivity of 8.3 ppm/° C. and density of 3.06 g/cm³. The glass sleeve 222 is melted and bonded to the electrode 125 through the above described heating, and is contracted in a subsequent cooling process. The zener diode substrate 101 is pressure-welded to the electrode 125 by force of this contraction. The non-insulated semiconductor device 900 obtained in this way has a cylindrical shape with a length of 3.5 mm and an outer diameter of 1.5 mm, and is used for other form of semiconductor device, for example, as a glass sleeve type Zener diode chip component 18 in FIG. 27.

The non-insulated semiconductor device 900 of this embodiment was subjected to a heat cycle test (−55 to 150° C., 2000 cycles), and showed a Zener voltage value of 7.1 V (at 10 mA), which was same as the initial value, after the test. Also, so far as this test concerned, cracking rupture of the glass sleeve 222 and stripping of the Zener diode substrate 101 from the electrode 125 were not observed. This is due to the fact that the composite material member of the present invention is used for the electrode 125, and its thermal expansivity is adjusted to be 8.3 ppm/° C., within the preferred range of thermal expansivity (7 to 12.5 ppm/° C.), which is well matched with those of the Zener diode substrate 101 and the glass sleeve 222.

The sample subjected to the above described heat cycle test was subsequently subjected to a high temperature/humidity test (1000 h) under conditions of 85° C. and 85% RH. The level of inverse current leakage was measure after the test, and a value of 0.1 $\mu$A (at 6.5 V), almost same as the initial value, was obtained. This indicates that the sealing between glass sleeve 222 and the electrode 125 was kept at a preferred level in the heat cycle test performed prior to the high temperature/humidity test. The reason why this high level of sealing was kept is that the copper 125D and the metal layer (Ni-plated layer) 125C in the electrode 125 are strongly bonded together by interdiffusion to prevent stripping from occurring at the interface therebetween.

[Embodiment 9]

In this embodiment, an insulated semiconductor device as a radiofrequency power amplification device for use in the send unit of a cellular phone or the like will be described.

Figure 36:
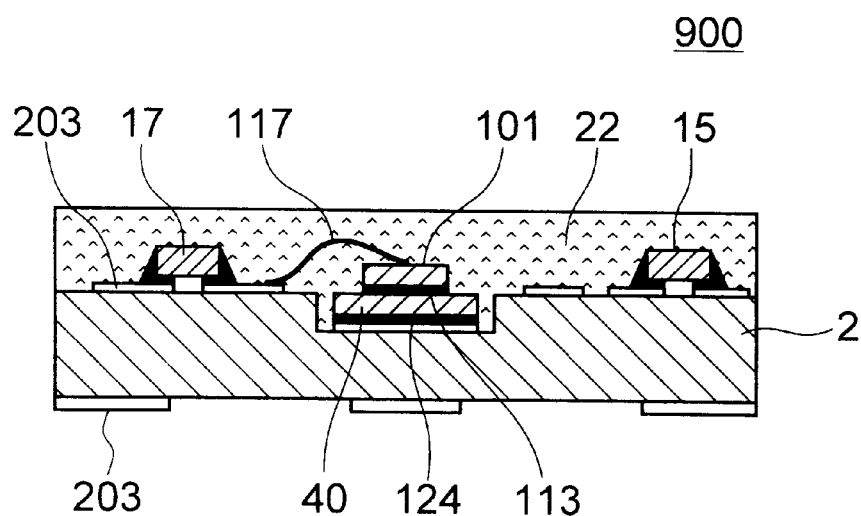
FIG. 36 is a schematic sectional view of the insulated semiconductor device.

The insulated semiconductor device 900 of this embodiment (size: 10.5×4×1.3 mm) has the following configuration. FIG. 36 is a schematic sectional view of the insulated semiconductor device of this embodiment. Here, chip components including a MOS FET element substrate 101 (size: 2.4×1.8×0.24 mm), a chip resistor 15 (about 7 ppm/° C.) and a chip condenser 17 (about 11.5 ppm/° C.) are mounted on a composite glass ceramic substrate as the supporting member 2 [size: 10.5×4×0.5 mm, three-layer wiring, thermal expansivity: 6.2 ppm/° C., thermal conductivity: 2.5 W/m·K, flexural strength: 0.25 GPa, Young's modulus: 110 GPa, dielectric constant: 5.6 (1 MHz)]. An intermediate metal member 40 consisting of the composite material member of the present invention exists between the MOS FET element substrate 101 and the composite glass ceramic substrate 2. This intermediate metal member 40 has a metal layer 125C (Ni-plated layer: thickness: 5 $\mu$m) formed through the copper layer 125D (thickness: 10 $\mu$m) formed by the reduction reaction of Formula 2, on a base material 125' with the cuprous oxide particles 125B dispersed in the copper matrix 125A, and has properties of thermal expansivity: 10 ppm/° C. and thermal conductivity: 140 W/m·K. The concentration of cuprous oxide particles 125B in the base material 125' is 50 vol %. Although not shown in the drawing, a thick film internal wiring layer (Ag-1 wt % Pt, thickness: 15 $\mu$m), a thick-film through-hole conductor for electric connection between composite wires (Ag-1 wt % Pt, diameter: 140 $\mu$m), and a thick film thermal veer for heat dissipation pass (Ag-1 wt % Pt, diameter: 140 $\mu$m) are provided in the composite glass ceramic substrate 2. In addition, a thick film wiring pattern 203 (Ag-1 wt % Pt, thickness: 15 $\mu$m) is provided on one main face of the composite glass ceramic substrate 2, and chip components including the chip resistor 15 and the chip condenser 17 are conductively fixed on this thick film wiring pattern 203 by a solder layer 113 having composition of Sn-5 wt % Ag-0.8 wt % Cu. The MOS FET element substrate 101 (Si, 3.5 ppm/° C.) is mounted on a pit portion provided on one main face of the composite glass ceramic substrate 2 via the intermediate metal member 40. The size of the intermediate metal member 40 is 2.8×2.2×0.2 mm. Here, both the solder 113 establishing connection between the MOS FET element substrate 101 and the intermediate metal member 40, and the solder 124 establishing connection between the intermediate metal member 40 and the composite glass ceramic substrate 2 are solders having composition of Sn-5 wt % Ag-0.8 wt % Cu. Between predetermined sections of the MOS FET element substrates 101 and the thick film wiring pattern 203 is provided bonding of small-gage wires 117 made of Au (diameter: 50 μ). A thick film external electrode layer 203' (Ag-1 wt % Pt, thickness: 15) is provided on the other main face of the composite glass ceramic substrate 2. The thick film external electrode layer 203' is electrically connected to the thick film wiring pattern 203 via the internal wiring layer and through-hole wiring provided in the composite glass ceramic substrate 2. An epoxy resin layer 22 is provided on one main face of the composite ceramic substrate 2, whereby mounted chip components or the like are sealed.

Figure 37:
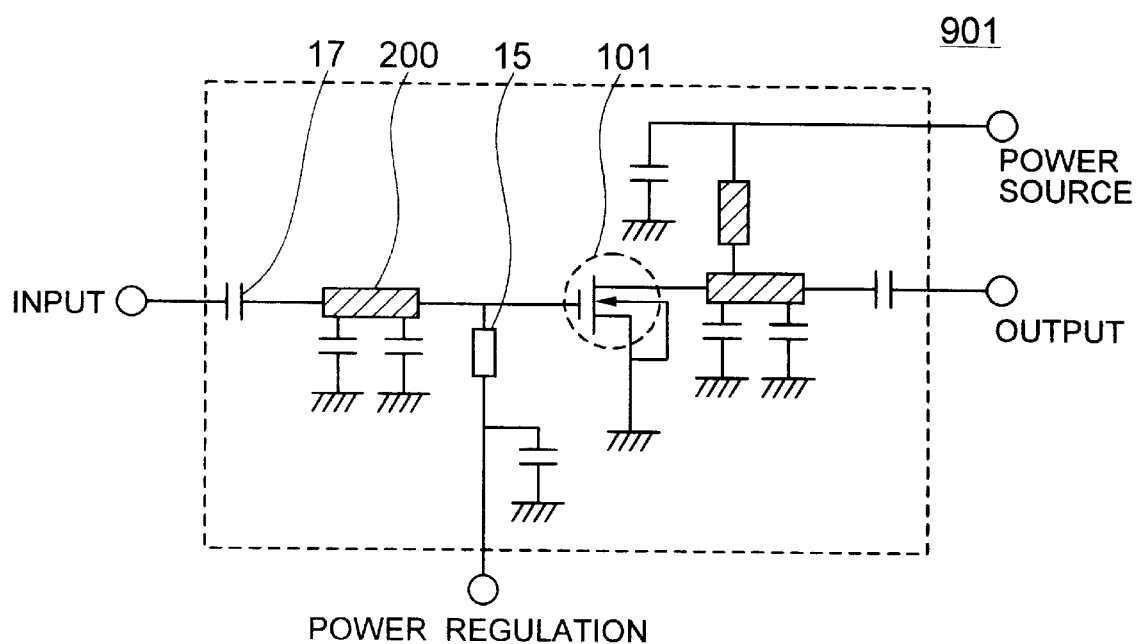
FIG. 37 shows a configuration of a basic amplification circuit block of the insulated semiconductor device.

FIG. 37 shows the configuration of a basic amplifying circuit block of the insulated semiconductor device of this embodiment. In a radio frequency zone, a distributed constant circuit by a transmission line 203 (thick film wiring pattern on composite glass ceramic substrate 2) is generally used in addition to the resistor 15 and capacitance (condenser 17). For input matching for amplifiers and load matching for output circuits, a π type circuit composed of the transmission line 203 and two capacitances (condensers 17) is used. Input impedance matching is carried out using the value of parallel capacitance and its connection position. The basic amplifying circuit block 901 has the above configuration.

Figure 38:
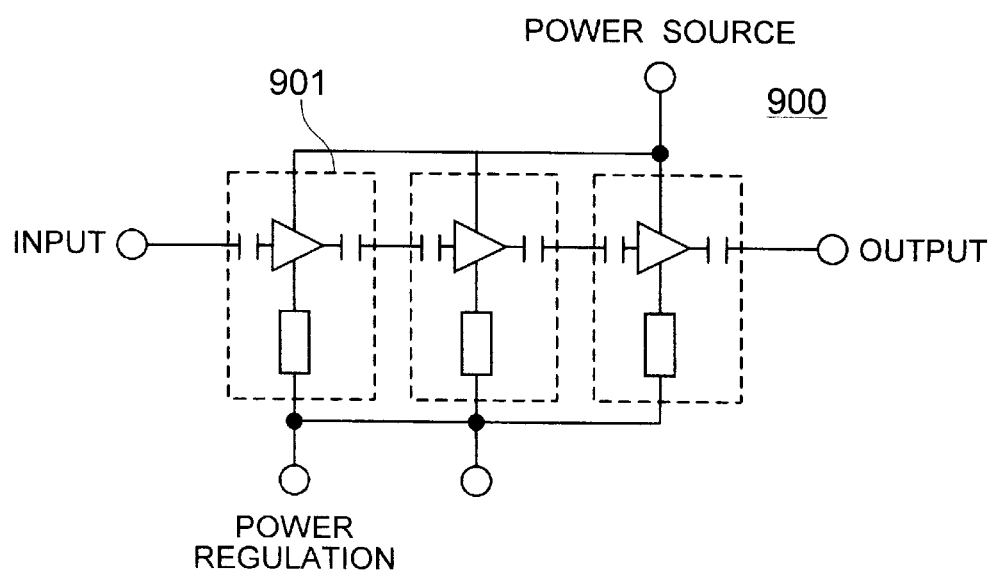
FIG. 38 shows a circuit block of the insulated semiconductor device.

FIG. 38 is a circuit block diagram of the insulated semiconductor device of this embodiment. The insulated semiconductor device 900 is modularized such that basic amplifying circuit blocks 901 are triple-connected. Here, because the power terminal is shared by all three stages in basic amplifying circuit blocks 901, the configuration of the circuit is simplified. The above insulated semiconductor device 900 directly reflects the feature of the MOS FET element 101, and has advantages that (1) the gain is so large that it operates with 1 to 4 mW of input power, (2) the structure of power amplification including surrounding circuits is simplified because gain control can be performed with a voltage of several volts, application of negative voltage required in the GaAs FET element is unnecessary, main currents are cut off with control voltage of 0.5 V or smaller, and terminals for power and control are shared by circuits in all stages, (3) rupture capacity is large, and (4) thermal stability is high. In particular, the above described advantages (3) and (4) are attributable to application of the intermediate metal member 40 composed of the composite material member of the present invention, which has high heat dissipation quality.

Figure 39:
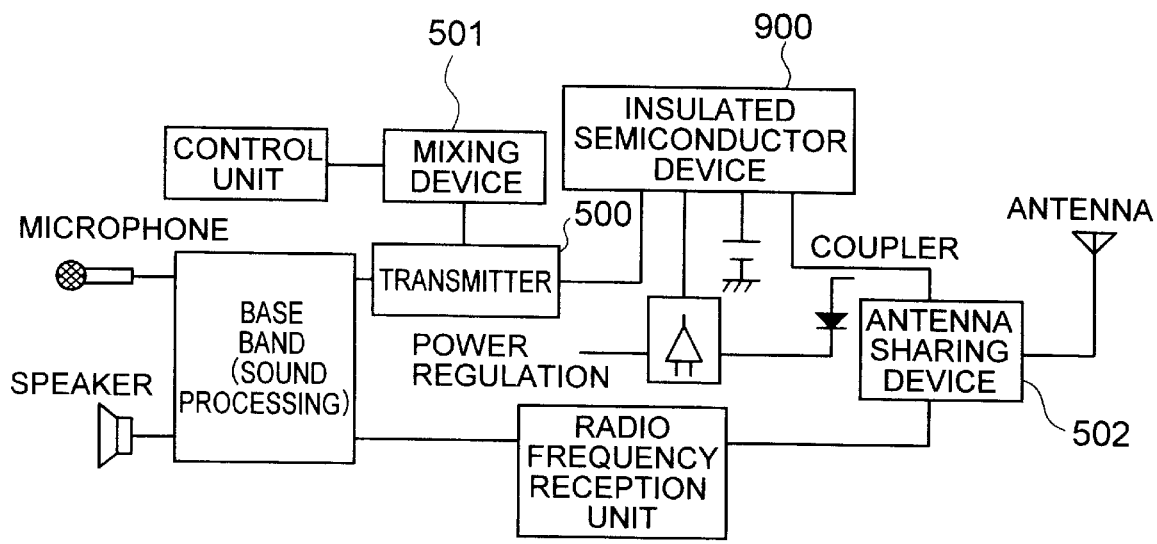
FIG. 39 is a circuit block diagram of a cellular phone using the insulated semiconductor device.

FIG. 39 is a circuit block diagram of a cellular phone using the insulated semiconductor device of this embodiment. An input sound signal is converted into a radio frequency signal from a transmitter 501 in a mixer 500, and is emitted from an antenna as an electric wave through the insulated semiconductor device 900 being a power amplifier and an antenna sharing device 502. Transmission power is monitored by a coupler, and is kept constant by a control signal to the insulated semiconductor device 900 being a power amplifier. Here, the antenna sharing device 502 and the antenna are what are called loads in the present invention. For this cellular phone, electric waves in a 800 to 1000 MHz zone are used.

[Embodiment 10]

In this embodiment, a non-insulated semiconductor device using a composite material member as a thermal buffer plate for electrodes of a large diameter thyristor element substrate for electric power will be described.

Figure 40:
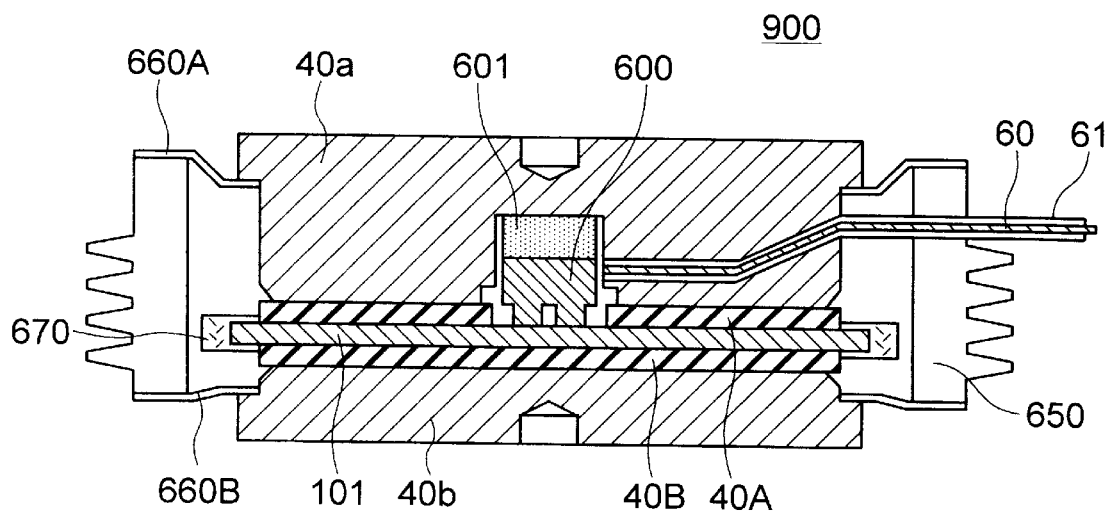
FIG. 40 is a schematic sectional view of the non-insulated semiconductor device for electric power.

FIG. 40 is a schematic sectional view of the non-insulated semiconductor device for electric power of this embodiment. The non-insulated semiconductor device 900 has the following configuration. Reference numeral 101 denotes a gate turn off (GTO) thyristor element substrate (Si, diameter: 100 mm), reference numeral 40A denotes a ring thermal buffer plate for anode electrodes, a reference numeral 40B denotes a thermal buffer plate for cathode electrodes, reference numeral 40a denotes a post electrode for anode made of Cu, reference numeral 40b denotes a post electrode for cathode made of Cu, reference numeral 60 denotes a gate lead, reference numeral 61 denotes a cylindrical insulator for a gate lead, reference numeral 600 denotes a gate electrode, reference numeral 601 denotes a pressing mechanism for gate electrodes, reference numeral 650 denotes a cylindrical insulator made of alumina ceramic, reference numeral 660A denotes an anode side flange, and reference numeral 660B denotes a cathode side flange. Although not shown in the drawing, a pn bonding portion is provided in the thyristor element substrate 101, and metal layers of Al shaped into predetermined patterns are formed in the anode area, cathode area and gate area of the thyristor element substrate 101. The marginal area of the thyristor element substrate 101 is coated with passivation member composed of silicon resin. Here, the thermal buffer plate for anode electrodes 40A and the thermal buffer plate for cathode electrodes 40B and the gate electrode 600 are all composed of the composite material member of the present invention, have a metal layer 125C (Ni-plated layer: thickness: 5 μm) formed through the copper layer 125D (thickness: 10 μm) formed by the reduction reaction of Formula 2, on a base material 125' with the cuprous oxide particles 125B dispersed in the copper matrix 125A, and have properties of thermal expansivity: 10 ppm/°C. and thermal conductivity: 140 W/m·K. The concentration of cuprous oxide particles 125B in the base material 125' is 50 vol %. In addition, the thermal buffer plate for anode electrodes 40A exists between the Al metal layer formed in the anode area and the post electrode for anode 40a, and the thermal buffer plate for cathode electrodes 40B exists between the Al metal layer formed in the cathode area and the post electrode for cathode 40b. The gate electrode 600 contacts the Al metal layer formed in the gate area, and is electrically connected to the gate lead 60 surrounded by the cylindrical insulator 61 for a gate lead, and is thus given force for pressure welding to the Al metal layer by the gate electrode pressing mechanism 601. Main members such as the above thyristor element substrate 101, thermal buffer plate for anode electrodes 40A, post electrode for anode 40a, thermal buffer plate for cathode electrodes 40B, post electrode for cathode 40b and gate electrode 600 are inserted in the cylindrical insulator 650. The anode side flange 660A is bonded to the post electrode for anode 40a and the cylindrical insulator 650, and the cathode side flange 660B is bonded to the post electrode for cathode 40b and the cylindrical insulator 650, in which these flanges 660A and 660B play a role to shield against the external air the main members 101, 40A, 40a, 40B, 40b, 600 or the like inserted in the cylindrical insulator 650. Since the thyristor element substrate 101 of the non-insulated semiconductor device 900 of this embodiment is electrically connected to the post electrode for anode 40a and the post electrode 40b for cathode by pressure-welding, welding pressure of 3000 kg is applied between the post electrode for anode 40a and the post electrode for cathode 40b.

The non-insulated semiconductor device 900 of this embodiment having the above structure showed a low level of thermal resistance, 0.006° C./W. This is attributable to the fact that the thermal buffer plate for anode electrodes 40A and the thermal buffer plate for cathode electrodes 40B are composed of the composite material member of high dissipation quality of the present invention. In addition, for the non-insulated semiconductor device 900 the heat cycle test (−55 to 150° C.) was performed 3000 times, and a test of applying intermittently an electric current to the thyrister element substrate 101 to change the temperature of the thermal buffer plate for cathode electrodes 40B from 30° C. to 100° C. was performed 90000 times, but neither growth of thermal resistance nor degradation of electric functions was observed. This is due to the fact that the thermal buffer plate for anode electrodes 40A and the thermal buffer plate for cathode electrodes 40B have an effect of reducing a difference in thermal expansivity between the thyrister element substrate 101 and the post electrode for anode 40a, and between the thyrister element substrate 101 and the post electrode for cathode 40b. In addition, it is also due to the fact that since the copper layer 125D having high thermal conductivity is formed by the reduction reaction of Formula 2 on the thermal buffer plate for anode electrodes 40A and the thermal buffer plate for cathode electrodes 40B, and bonding between the copper layer 125D and the metal layer (Ni-plated layer) 125C is strengthened by interdiffusion, a heat dissipation pass is secured.

In this embodiment, the case has been described where the composite material member of the present invention is used for the thermal buffer plate for anode electrodes 40A and the thermal buffer plate for cathode electrodes 40B, but a structure in which the composite material member of the present invention is used for the post electrode for anode 40a and the post electrode for cathode 40b, a structure in which the thermal buffer plate for anode electrodes 40A and the post electrode for anode 40a are combined together in one united body, and a structure in which the thermal buffer plate for cathode electrodes 40B and the post electrode for cathode 40b are combined together in one united body may also be adopted as required.

[Embodiment 11]

In this embodiment, a non-insulated semiconductor device using a composite material member as a lead frame for mini mold type transistor will be described.

Figure 41:
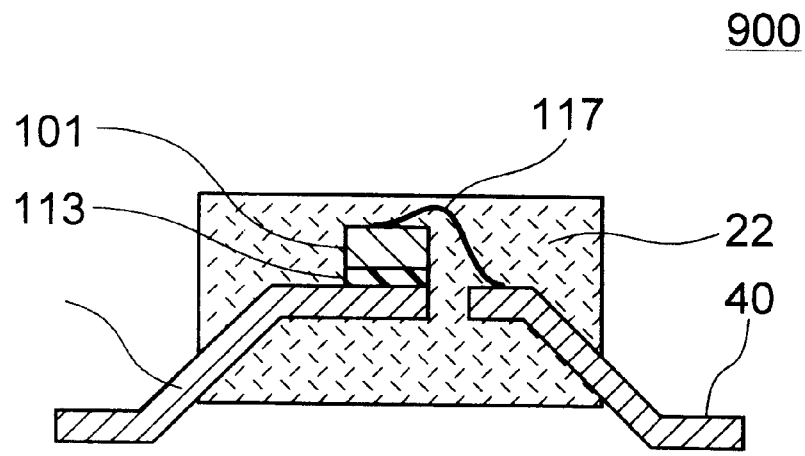
FIG. 41 is a schematic sectional view of a mini mold type non-insulated semiconductor device.

FIG. 41 is a schematic sectional diagram of the mini mold type non-insulated semiconductor device. A transistor substrate made of Si (size: 1×1×0.3 mm) as a semiconductor element substrate 101 is mounted on a lead frame 40 (thickness: 0.3 mm) made of the composite material member of the present invention with a solder 113 composed of a Sn-7 wt % Sb alloy. This composite material member has a metal layer 125C (Ni-plated layer: thickness: 7 $\mu$m) formed through the copper layer 125D (thickness: 10 $\mu$m) formed by the reduction reaction of Formula 2, on a base material 125' with the cuprous oxide particles 125B dispersed in the copper matrix 125A, and has properties of thermal expansivity: 7.5 ppm/° C. and thermal conductivity: 100 W/m·K. The concentration of cuprous oxide particles 125B in the base material 125' is 60 vol %. The lead frames 40 and 40' serve as both electrodes and terminals, and are formed in one united body in the initial stage before each electrode and terminal executes its independent function. The collector of the transistor substrate 101 is placed at a location where the substrate is mounted by the solder 113. The emitter and base are provided at locations opposite to the location where the substrate is soldered, and are connected to the lead frame 40' by Al small-gage wires 117 pulled out from the transistor substrate 101. In addition, the main portion on which the transistor substrate 101 is mounted and which is provided with wiring of Al small-gage wires 117 is covered with epoxy resin 22 by transfer mold. When mold with epoxy resin 22 is completed, the lead frames 40 and 40' are separated from each other, and are each given a function as an independent terminal. The non-insulated semiconductor device 900 of this embodiment having the above configuration has a size of 3×4×3 mm, and is used for other form of semiconductor device as a chip component to be mounted on, for example, the alumina substrate 5 in FIG. 27 and the glass ceramic substrate 2 in FIG. 36.

The current amplification factor of non-insulated semiconductor device 900 of this embodiment after a heat cycle test (−55 to 150° C., 2000 cycles) was 30. This value is almost same as that the initial current amplification factor before the test. In addition, so far as this test is concerned, neither stripping between the transistor substrate 101 and the lead frame 40 nor cracking in the solder layer 113 was observed. This is attributable to the fact that the composite material member of the present invention is used for the lead frame 40, and its thermal expansivity is adjusted to be 8.3 ppm/° C., within the preferred range of thermal expansivity, which is matched with the thermal expansivity of the transistor substrate 101.

The sample subjected to the above described heat cycle test was subsequently subjected to a high temperature/humidity test (1000 h) under conditions of 85° C. and 85% RH. The level of current leakage between the emitter and the collector was measured after the test, and a value of 0.1 $\mu$A (at 30 V), almost same as the initial value, was obtained. This indicates that the sealing between the epoxy resin 22 and the lead frames 40 and 40' was kept at a preferred level in the heat cycle test performed prior to the high temperature/humidity test. The reason why this high level of sealing was kept is that the copper layer 125D and the metal layer (Ni-plated layer) 125C in the lead frames 40 and 40' are strongly bonded together by interdiffusion to prevent stripping from occurring at the interface therebetween.

[Embodiment 12]

A non-insulated semiconductor device using a composite material member as a laser diode mounting thermal expansion mitigation material will be described.

Figure 42:
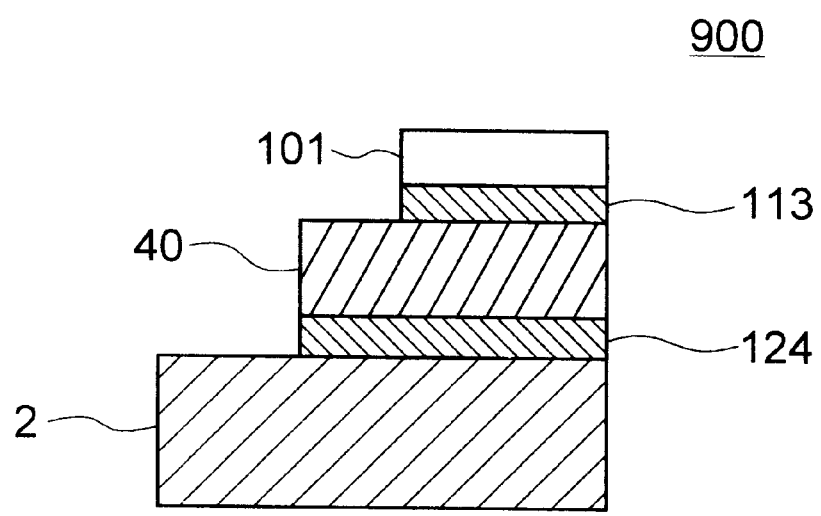
FIG. 42 is a schematic sectional view of the non-insulated semiconductor device with a laser diode mounted thereon.

FIG. 42 is a schematic sectional view of a non-insulated semiconductor device with a laser diode mounted thereon according to this embodiment. A laser diode substrate (size: 0.8×0.5×0.2 mm) as a semiconductor element substrate 101 is bonded to an intermediate metal member 40 (thickness: 0.3 mm) made of the composite material member of the present invention with a solder 113 composed of an Au-20 wt % Sn alloy. The laser diode substrate 101 includes a GaAlAs area epitaxially grown on a GaAs substrate, and is given wettability for the solder 113 by a laminated metal layer composed of Ti (thickness: 0.1 $\mu$m)-Pt (0.3 $\mu$m)-Au (0.1 $\mu$m) formed on the bonded surface of the laser diode substrate 101. This composite material member has a metal layer 125C (laminated metal layer with an Au-plated layer with thickness of 1 $\mu$m formed on a Ni-plated layer with thickness of 7 $\mu$m one after another) formed through the copper layer 25D (thickness: 10 $\mu$m) formed by the reduction reaction of Formula 2, on a base material 125' with the cuprous oxide particles 125B dispersed in the copper matrix 125A, and has properties of thermal expansivity: 7.5 ppm/° C. and thermal conductivity: 100 W/m·K. The concentration of cuprous oxide particles 125B in the base material 125' is 60 vol %. The intermediate metal member 40 is mounted by soldering on the supporting member 2 made of Cu with a solder 124 composed of a Sn-3 wt % Ag-0.7 wt % Cu alloy. Although not shown in the drawing, a laminated metal layer composed of Ti (thickness: 0.1 $\mu$m)-Pt (0.3 $\mu$m)-Au (0.1 $\mu$m) as described above is provided on the upper surface of non-bonded side of the laser diode substrate 101, and Au wires are bonded on this laminated metal layer. The non-insulated semiconductor device 900 of this embodiment having the above structure is practically used in combination with a photoreceptor element.

For the non-insulated semiconductor device 900 of this embodiment, the initial value of thermal resistance was 0.31° C./W while the value of thermal resistance after application of a heat cycle test of −55 to 150° C. (2000 cycles) was 0.32° C., almost equivalent to the initial value. This is attributable to the fact that the composite material member of the present invention is used for the intermediate metal member 40, its thermal expansivity is adjusted to be 8.3 ppm/° C., within the preferred range of thermal expansivity (7~12.5 ppm/° C., which is matched with the thermal expansivity of the transistor substrate 101.

[Embodiment 13]

In this embodiment, a non-insulated semiconductor device using a composite material member as a rectification diode mounting thermal expansion mitigation material will be described.

Figure 43A:
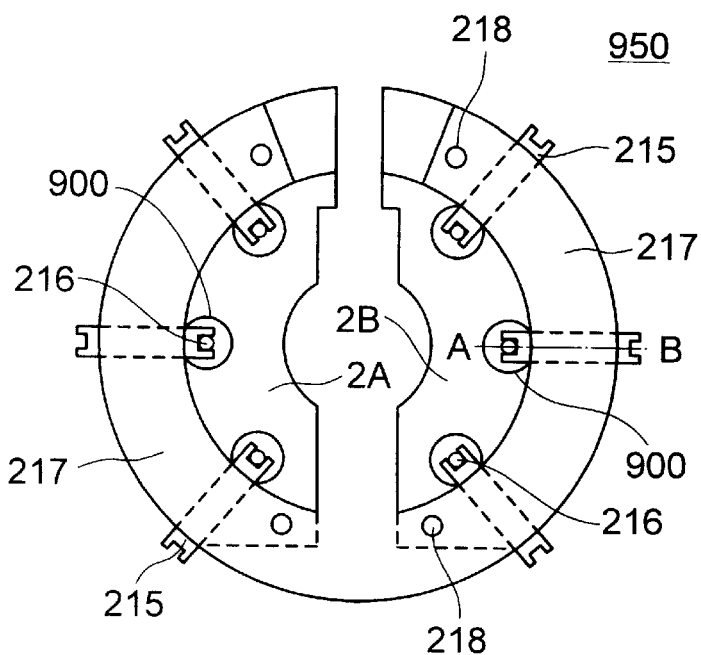
FIGS. 43A to 43C illustrate a full wave rectifier with the non-insulated semiconductor device mounted thereon.
Figure 43B:
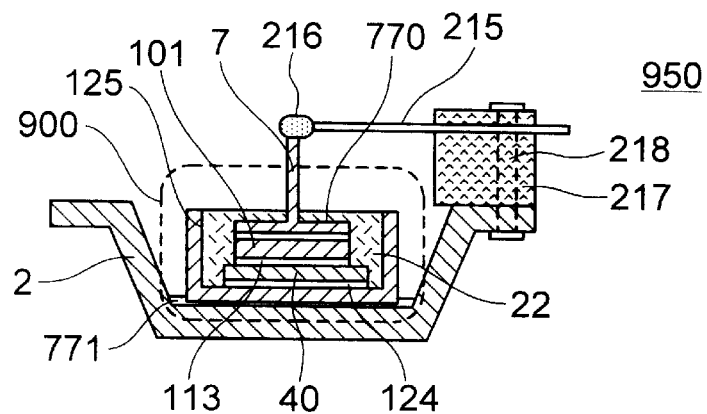
Figure 43C:
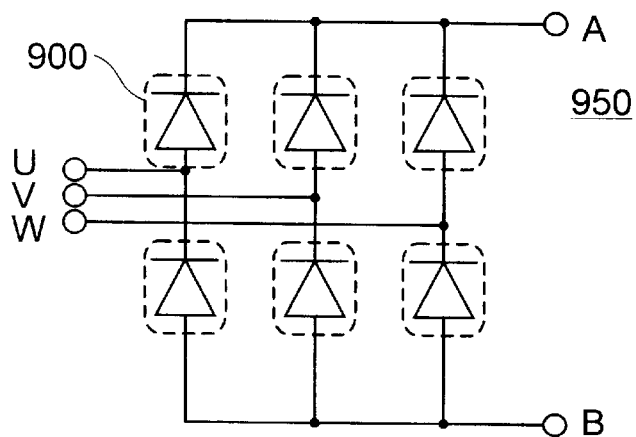

FIG. 43 illustrates a full wave rectifier with a non-insulated semiconductor device mounted thereon. FIG. 43A is a plan view of the full wave rectifier, FIG. 43B is a view of the A–B section, and FIG. 43C a circuit diagram of the full wave rectifier. First, attention is given to FIG. 43B. The non-insulated semiconductor device 900 shown herein is for an automobile alternator. Reference numeral 125 denotes a container (thickness: 0.8 mm) composed of Cu coated with Ni plating, an intermediate metal member 40 (diameter: 5 mm, thickness: 0.6 mm) composed of the composite material member of the present invention is attached to the bottom of the container 125 with a solder 124 (thickness: 100 μm) composed of a Sn-3 wt % Ag-0.7 wt % Cu alloy. A diode element substrate 101 (diameter: 4 mm, thickness: 0.3 mm) is mounted by soldering on the intermediate metal member 40 with a solder 113 (thickness: 100 μm) composed of a Sn-5 wt % Sb alloy, and a lead 7 composed of Cu coated with Ni plating is fixed on the diode element substrate 101 with a solder 770 composed of a Sn-3 wt % Ag-0.7 wt % Cu alloy. The intermediate metal member 40, the lead 7 and the diode element substrate 101 are coated with silicon resin 22. The composite material member as the intermediate metal member 40 (of which detailed view is not shown) has a metal layer 125C (Ni-plated layer with thickness of 7 μm) formed through the copper layer 125D (thickness: 10 μm) formed by the reduction reaction of Formula 2, on a base material 125' with the cuprous oxide particles 125B dispersed in the copper matrix 125A, and has properties of thermal expansivity: 7.5 ppm/° C. and thermal conductivity: 100 W/m·K. The concentration of cuprous oxide particles 125B in the base material 125' is 60 vol %. The role of the intermediate material member 40 in this embodiment is to reduce a difference in thermal expansivity between the container 125 and the diode element substrate 101 to provide the solder 124 with excellent resistance to thermal fatigue, and to efficiently transfer heat generated by the diode element substrate 101 to a heat dissipation plate 2 described later, thereby maintaining the electric function of the semiconductor device 900 or the full wave rectification device 950 for a long time period. The above described non-insulated semiconductor device 900 is fixed by a solder 771 composed of a Sn-3 wt % Ag-4.5 wt % Bi alloy on the heat dissipation plate 2 made of Cu and serving also as a supporting member. A terminal pad 217 composed of epoxy resin or the like is fixed to the heat dissipation plate 2 by a fitting member 218, and the lead 7 is bonded to a metal terminal 215 of Cu attached in advance to the terminal pad 217 through a solder 216.

The full wave rectifier 950 will now be described by using FIG. 43A. Three non-insulated semiconductor devices 900 are bonded to a first heat dissipation plate 2A through a bonding layer 771. In a similar way, three non-insulated semiconductor devices 900 are attached to a second heat dissipation plate 2B. Specifically, a plurality of non-insulated semiconductor devices 900 are mounted on the first and second heat dissipation plates 2A and 2B pairing up with each other so that the rectification direction is uniformalized in each heat dissipation plate and the rectification direction is differentiated for each heat dissipation plate. Here, the role of the first and second heat dissipation plates 2A and 2B is to efficiently transfer heat emitted by the non-insulated semiconductor device 900 to the outside and an electric power. From this point of view, an Al material can be used for the first and second heat dissipation plates 2A and 2B. The full wave rectifier 950 obtained in this way has a circuit as shown in FIG. 43C.

The value of thermal resistance of the non-insulated semiconductor device 900 of this embodiment is 0.7° C./W. Placement of the intermediate metal member 40 of high thermal conductivity in the main heat dissipation pass contributes to provision of such excellent heat dissipation quality. Another reason why excellent heat dissipation quality was provided is that the soldered surface of the intermediate metal member 40 was cleaned by thermal processing performed in advance to perform soldering involving a reduced number of voids. Also, in a power cycle test of applying intermittently an electric current to the non-insulated semiconductor device 900 to cause the temperature of the container 125 to change from 30 to 125° C., a value of thermal resistance was almost equivalent to the initial value up to 50000 cycles. This is due to the fact that the intermediate metal member 40 having middle thermal expansivity is placed between the container 125 and the diode element substrate 101. However, in addition thereto, this is also attributable to the fact that the base material 125' with the cuprous oxide particles 125B dispersed in the copper matrix 125A is strongly bonded to the copper layer 125D formed by the reduction reaction of Formula 2, and that the copper layer 125D and the metal layer 125C are strongly bonded together by interdiffusion.

The above described full wave rectifier 950 was attached to a three-phase motor for vehicles. Turning power by a vehicle engine is transferred to a rotor, a rotor coil attached to this rotor is interlinked with a field generated by an excitation winding wire, whereby an alternating current is generated in the rotor coil. U, V and W terminals of the full wave rectifier 950 are connected to the above described rotor coil. Thus, the alternating current passing through the U, V and W terminals is converted into a direct current by each semiconductor device 900, and is supplied to a load as a direct current through the terminals A and B.

The full wave rectifier 950 was placed in an engine room of a car along with the three-phase motor with the full wave rectifier 950 attached thereto. This car was subjected to a driving test over 320000 km of distance. The three-phase motor and the full wave rectifier 950 were always in operational conditions during this driving test, but the electric function was kept at a level almost equivalent to the initial level. The reason why such excellent durability was obtained is that excellent heat dissipation quality and connectivity reliability were provided as described above.

The embodiments of the present invention have been described above. The semiconductor device 900 in the present invention should not be limited to the scope of the described embodiments.

Figure 44:
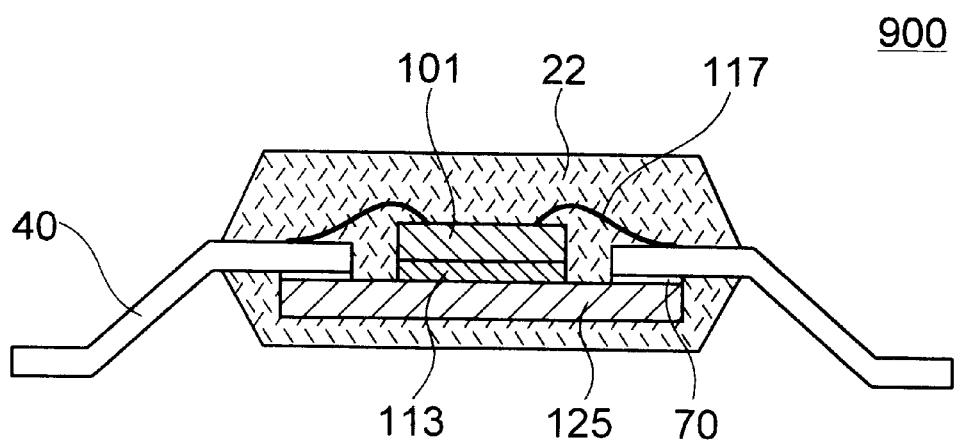
FIG. 44 is a schematic sectional view of the insulated semiconductor device with a resin mold applied thereto.
Figure 45:
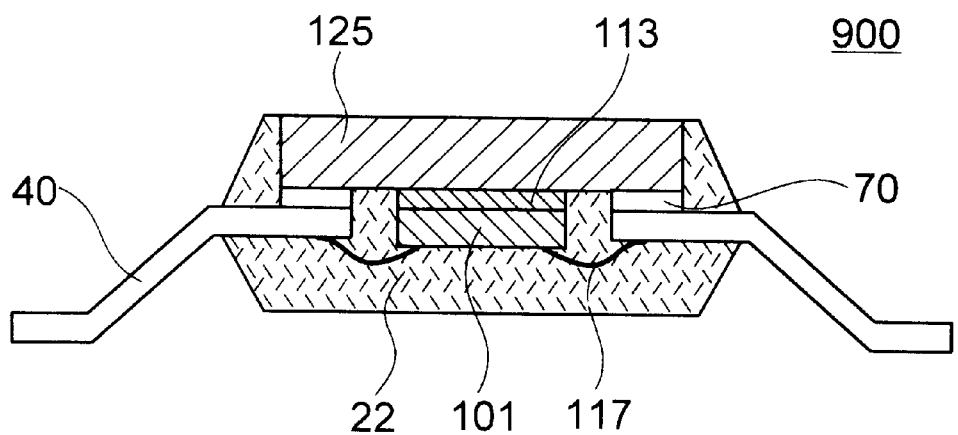
FIG. 45 is a schematic sectional view of the non-insulated semiconductor device with a resin mold applied thereto.
Figure 46:
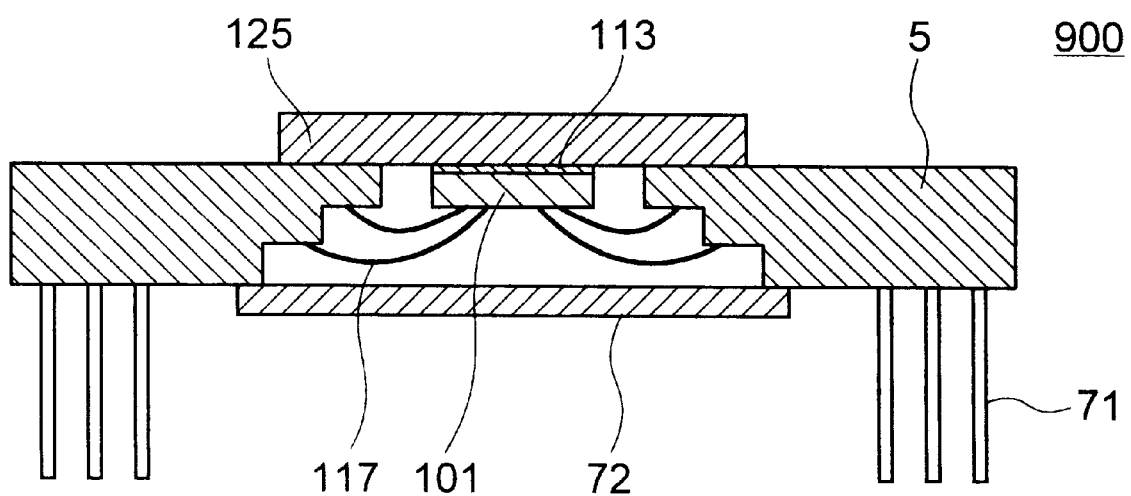
FIG. 46 is a schematic sectional view of the non-insulated semiconductor device with an IC chip substrate contained in a pin grid array package.

FIGS. 44 to 46 are schematic sectional views illustrating variations of the semiconductor device of the present invention. All of the insulated and non-insulated semiconductor devices based on these forms are effective for providing a semiconductor device that alleviates thermal stress or thermal strain occurring during production or operation, has no possibilities of deformation, degeneration and rupture of each member, and is highly reliable and inexpensive.

FIG. 44 is a schematic sectional view of an insulated semiconductor device with resin mold applied thereto. In this insulated semiconductor device 900, an IC chip substrate 101 is mounted by soldering with a solder 113 on a supporting member 125 composed of the composite material member of the present invention with a lead frame 40 bonded thereto through an insulating polyimide tape 70. The IC chip substrate 101 is connected to the lead frame 40 by a metal small-gage wire 117. The united body of these components is entirely covered with epoxy resin 22 except for part of the lead frame 40 that is ultimately turned into a terminal.

FIG. 45 is a schematic sectional view of a non-insulated semiconductor device with resin mold applied thereto. In this non-insulated semiconductor device 900, an IC chip substrate 101 is mounted by soldering with a solder 113 on a supporting member 125 composed of the composite material member of the present invention with a lead frame 40 bonded thereto through an insulating polyimide tape 70. The IC chip substrate 101 is connected to the lead frame 40 by a metal small-gage wire 117. The united body of these components is entirely covered with epoxy resin 22 except for part of the supporting member 125 and part of the lead frame 40 that is ultimately turned into a terminal. Although not shown in the drawing, a mechanism for cooling such as an Al fin can be attached to the supporting member 125 to further enhance the heat dissipation effect.

FIG. 46 is a schematic sectional view of a non-insulated semiconductor device with an IC chip substrate contained in a pin grid array package. A package 5 is a multi layer wiring alumina substrate provided with an Ag—Pt thick film conductor layer, with the supporting member 125 composed of composite material member of the present invention and a metal pin 71 attached thereto in advance with a silver solder. The IC chip substrate 101 is mounted on the supporting member 125 with a solder 113, and is connected to the wiring of the package 5 by the wire bonding of Au wires. Also, the space in which the IC chip substrate 101 is contained is sealed by bonding the package 5 to a Kovar plate 72 with a Au—Sn based solder.

Furthermore, for example, the inverter device with the semiconductor device 900 of the present invention incorporated therein (see FIG. 12) may be incorporated in an air conditioner (power consumption during cooling: 5 kW, power consumption during warming: 3 kW, power supply voltage: 200V) along with a brushless direct current motor. In this case, high energy efficiency can be obtained, which is helpful for reducing power consumption during usage of the air conditioner. The time between the point of starting an operation and the point of reaching a set room temperature may be reduced to about a half compared to the case where the conventional alternating current motor is used.

Similar effects can also be given when the semiconductor device 900 is incorporated in other apparatus for stirring or flowing other fluids, for example a washer and a fluid circulating apparatus.

In the present invention, the semiconductor is incorporated into an electric circuit for supplying power to load before being used. At this time, effects similar to those of the above described embodiments can also be given in the case where (1) the semiconductor device is incorporated in the electric circuit for supplying power to a turning gear to control the revolting speed of the above described turning gear, or the semiconductor device is incorporated in a system moving in itself (e.g. train, elevator, escalator, belt conveyor) together with the turning gear to control the moving speed of the above described moving system, (2) the electric circuit for supplying power to the above described turning gear is an inverter circuit, (3) the semiconductor device is incorporated in an apparatus for stirring or flowing a fluid to control the moving speed of the stirred or flowed material, (4) the semiconductor device is incorporated in an apparatus processing materials to control the grounding speed of the processed material, (5) the semiconductor device is incorporated in an emitter to control the amount of emitted light from the above described emitter, and (6) the semiconductor device operates at output frequencies of 50 Hz to 30 kHz.

In the present invention, the plated layer 125A provided on the composite material member 125 should not be limited to Ni. In order to improve wettability for solder and brazing materials, the surface is preferably coated with Cu, Ni, Ag, Au, Pt, Pd, Sn, Sb, Al, Zn or an alloy thereof. At this time, not only plating but also vapor deposition or sputtering may be used.

In the present invention, solders 113 and 124 are not limited to the materials disclosed in the embodiments. Materials with various components/compositions may be selected depending on processes through which the semiconductor device is prepared, and properties required for the semiconductor device, particularly reliability of resistance to thermal fatigue. For example, a solder of Pb-5 wt % Sb, Pb-52 wt % Sn-8 wt % Bi, Au-12 wt % Ge, Au-6 wt % Si, Au-20 wt % Si, Al-11.7 wt % Si, Ag-4.5 Si, Au-85 wt % Pb, Au-26 wt % Sb, Cu-69.3 wt % Mg, Cu-35 wt % Mn, Cu-36 wt % Pb, Cu-76.5 wt % Sb, Cu-16.5 wt % Si, Cu-28 wt % Ti, Cu-10 wt % Zr, or any combination thereof may be applied.

In the present invention, materials that may constitute the semiconductor substrate 101 include Si: 4.2 ppm/° C., Ge: 5.8 ppm/° C., GaAs: 6.5 ppm/° C., GaP: 5.3 ppm/° C., SiC: 3.5 ppm/° C. or the like. There is no limitation on mounting of a semiconductor element comprising any of these materials. At this time, the semiconductor substrate may have electrical functions such as a thyrister and transistor, which have not described in the embodiments. Also, the element to be mounted on the metal bonding circuit substrate 122 is not limited to a semiconductor substrate, but may be, for example, a passive element such as a condenser, resistor and coil.

The following are disclosed in the specification.

(1) A composite material member for semiconductor device, with said composite material member being a composite metal plate with particles composed of cuprous oxide dispersed in a copper matrix, wherein the surface of the composite metal plate is covered with a metal layer, and a copper layer with thickness of 0.5 μm or larger exists in the interface formed by the composite metal plate and the metal layer.

(2) The composite material member according to the item (1), wherein the thermal expansivity of the composite metal plate is 7 to 12.5 ppm/° C.

(3) The composite material member according to the item (1), wherein the thermal conductivity of the composite metal plate is 70 W/m·K or larger.

(4) The composite material member according to the item (1), wherein the concentration of the particles composed of cuprous oxide dispersed in the copper matrix is 24 to 70 vol %.

(5) The composite material member according to the item (1), wherein the metal layer comprises at least one type of metal selected from the group consisting of Ni, Sn, Ag, Au, Pt, Pd and Zn, and a thickness of the metal layer is 0.4 to 100 μm.

(6) The composite material member according to the item (1), wherein the metal layer and the copper layer form a bonding interface by diffusion.

(7) An insulated semiconductor device being a semiconductor device with a semiconductor substrate mounted on a supporting member through an insulating member, or a semiconductor device with a semiconductor substrate mounted on a supporting member through an insulating member and an intermediate metal member in succession, wherein the semiconductor device comprises a composite material member in which at least one of the supporting member and the intermediate metal member is a composite metal plate with particles composed of cuprous oxide dispersed in a copper matrix, the surface of the composite metal plate is covered with a metal layer, and a copper layer with thickness of 0.5 μm or larger exists in the interface formed by the composite metal plate and the metal layer.

(8) The insulated semiconductor device according to the item (7), wherein the supporting member is composed of ceramic, and the semiconductor element substrate is mounted on the ceramic through an intermediate metal member.

(9) A non-insulated semiconductor device being a semiconductor device with a semiconductor substrate mounted on a supporting member, or a semiconductor device with a semiconductor substrate mounted on a supporting member through an intermediate metal member, wherein the semiconductor device comprises a composite material member in which at least one of the supporting member and the intermediate metal member is a composite metal plate with particles composed of cuprous oxide dispersed in a copper matrix, the surface of the composite metal plate is covered with a metal layer, and a copper layer with thickness of 0.5 μm or larger exists in the interface formed by the composite metal plate and the metal layer.

(10) The non-insulated semiconductor device according to the item (9), wherein the supporting member serves as both a member to mount the semiconductor element substrate and a terminal.

(11) A non-insulated semiconductor device being a semiconductor device with a semiconductor substrate placed between a pair of electrode members located opposite to each other, or a semiconductor device with the semiconductor substrate contacting an intermediate metal member at one main face thereof and placed between the pair of electrode members, wherein at least one of the electrode member and the intermediate metal member is a composite metal with particles composed of cuprous oxide dispersed in a copper matrix, the surface of the composite metal is covered with a metal layer, and a copper layer with thickness of 0.5 μm or larger exists in the interface formed by the composite metal and the metal layer.

(12) The insulated or non-insulated semiconductor device according to any of the items (7) to (11), wherein the thermal expansivity of at least either the supporting member or the intermediate metal member is 7 to 12.5 ppm/° C.

(13) The insulated or non-insulated semiconductor device according to any of the items (7) to (11), wherein the thermal conductivity of at least either the supporting member or the intermediate metal member is 70 W/m·K or more.

(14) The insulated or non-insulated semiconductor device according to any of the items (7) to (11), wherein the concentration of the particles composed of cuprous oxide dispersed in the copper matrix is 24 to 70 vol %.

(15) The insulated or non-insulated semiconductor device according to any of the items (7) to (11), wherein the metal layer comprises at least one type of metal selected from the group consisting of Ni, Sn, Ag, Au, Pt, Pd and Zn and a thickness of the metal layer is 0.4 to 100 μm.

(16) The insulated or non-insulated semiconductor device according to any of the items (7) to (11), wherein the metal layer and the copper layer form a bonding interface by diffusion.

It should be further understood by those skilled in the art that the foregoing description has been made on embodiments of the invention and that various changes and modifications may be made in the invention without departing from the spirit of the invention and the scope of the appended claims.

What is claimed is:

1. A composite material member for semiconductor device, in which said composite material member is a composite metal plate with particles composed of cuprous oxide dispersed in a copper matrix, wherein a surface of the composite metal plate is covered with a metal layer, and a copper layer with thickness of 0.5 μm or larger exists in an interface formed by the composite metal plate and the metal layer.

2. The composite material member according to claim 1, wherein a thermal expansivity of the composite metal plate is 7 to 12.5 ppm/° C.

3. The composite material member according to claim 1, wherein a thermal conductivity of the composite metal plate is 70 W/m·K or larger.

4. The composite material member according to claim 1, wherein a concentration of the particles composed of cuprous oxide dispersed in the copper matrix is 24 to 70 vol %.

5. The composite material member according to claim 1, wherein the metal layer comprises at least one type of metal selected from a group consisting of Ni, Sn, Ag, Au, Pt, Pd and Zn, and a thickness of the metal layer is 0.4 to 100 μm.

6. The composite material member according to claim 1, wherein the metal layer and the copper layer form a bonding interface by diffusion.

7. An insulated semiconductor device being a semiconductor device with a semiconductor substrate mounted on a supporting member through an insulating member, or a semiconductor device with a semiconductor substrate mounted on a supporting member through an insulating member and an intermediate metal member in succession, wherein the semiconductor device comprises a composite material member in which at least one of the supporting member and the intermediate metal member is a composite metal plate with particles composed of cuprous oxide dispersed in a copper matrix, a surface of the composite metal plate is covered with a metal layer, and a copper layer with thickness of 0.5 μm or larger exists in an interface formed by the composite metal plate and the metal layer.

8. The insulated semiconductor device according to the claim 7, wherein the supporting member is composed of ceramic, and the semiconductor element substrate is mounted on the ceramic through an intermediate metal member.

9. A non-insulated semiconductor device being a semiconductor device with a semiconductor substrate mounted on a supporting member, or a semiconductor device with a semiconductor substrate mounted on a supporting member through an intermediate metal member, wherein the semiconductor device comprises a composite material member in which at least one of the supporting member and the intermediate metal member is a composite metal plate with particles composed of cuprous oxide dispersed in a copper matrix, a surface of the composite metal plate is covered with a metal layer, and a copper layer with thickness of 0.5 μm or larger exists in an interface formed by the composite metal plate and the metal layer.

10. The non-insulated semiconductor device according to the claim 9, wherein the supporting member serves as both a member to mount the semiconductor element substrate and a terminal.

11. A non-insulated semiconductor device being a semiconductor device with a semiconductor substrate placed between a pair of electrode members located opposite to each other, or a semiconductor device with the semiconductor substrate contacting an intermediate metal member at one main face thereof and placed between the pair of electrode members, wherein at least one of the electrode member and the intermediate metal member is a composite metal with particles composed of cuprous oxide dispersed in a copper matrix, a surface of the composite metal is covered with a metal layer, and a copper layer with thickness of 0.5 μm or larger exists in an interface formed by the composite metal and the metal layer.

12. The insulated or non-insulated semiconductor device according to claim 7, wherein a thermal expansivity of at least either the supporting member or the intermediate metal member is 7 to 12.5 ppm/° C.

13. The insulated or non-insulated semiconductor device according to claim 7, wherein the thermal conductivity of at least either the supporting member or the intermediate metal member is 70 W/m·K or more.

14. The insulated or non-insulated semiconductor device according to claim 7, wherein a concentration of the particles composed of cuprous oxide dispersed in the copper matrix is 24 to 70 vol %.

15. The insulated or non-insulated semiconductor device according to claim 7, wherein the metal layer comprises at least one type of metal selected from a group consisting of Ni, Sn, Ag, Au, Pt, Pd and Zn and a thickness of the metal layer is 0.4 to 100 μm.

16. The insulated or non-insulated semiconductor device according to claim 7, wherein the metal layer and the copper layer form a bonding interface by diffusion.

* * * * *